United States Patent
Kao et al.

(10) Patent No.: US 12,288,812 B2
(45) Date of Patent: Apr. 29, 2025

(54) SEMICONDUCTOR DEVICES AND METHODS OF FABRICATION THEREOF

(71) Applicant: TAIWAN SEMICONDUCTOR MANUFACTURING COMPANY, LTD., Hsinchu (TW)

(72) Inventors: Kuei-Yu Kao, Hsinchu (TW); Shih-Yao Lin, New Taipei (TW); Chen-Ping Chen, Yilan (TW); Chih-Chung Chiu, Hsinchu (TW); Ke-Chia Tseng, Hsinchu (TW); Chih-Han Lin, Hsinchu (TW); Ming-Ching Chang, Hsinchu (TW); Chao-Cheng Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 400 days.

(21) Appl. No.: 17/831,054

(22) Filed: Jun. 2, 2022

(65) Prior Publication Data
US 2023/0395677 A1   Dec. 7, 2023

(51) Int. Cl.
| | |
|---|---|
| *H01L 29/423* | (2006.01) |
| *H01L 21/3065* | (2006.01) |
| *H01L 21/8234* | (2006.01) |
| *H01L 27/088* | (2006.01) |
| *H01L 29/06* | (2006.01) |
| *H01L 29/66* | (2006.01) |

(52) U.S. Cl.
CPC .... *H01L 29/42392* (2013.01); *H01L 21/3065* (2013.01); *H01L 21/82345* (2013.01); *H01L 27/088* (2013.01); *H01L 29/0673* (2013.01); *H01L 29/66545* (2013.01)

(58) Field of Classification Search
None
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2023/0317462 A1* | 10/2023 | Han | H01L 21/32137 438/689 |

* cited by examiner

*Primary Examiner* — John A Bodnar
(74) *Attorney, Agent, or Firm* — NZ Carr Law Office

(57) ABSTRACT

A cyclic process including an etching process, a passivation process, and a pumping out process is provided to prevent over etching of the sacrificial gate electrode, particularly when near a high-k dielectric feature. The cyclic process solves the problems of failed gate electrode layer at an end of channel region and enlarges filling windows for replacement gate structures, thus improving channel control. Compared to state-of-art solutions, embodiments of the present disclosure also enlarge volume of source/drain regions, thus improving device performance.

20 Claims, 43 Drawing Sheets

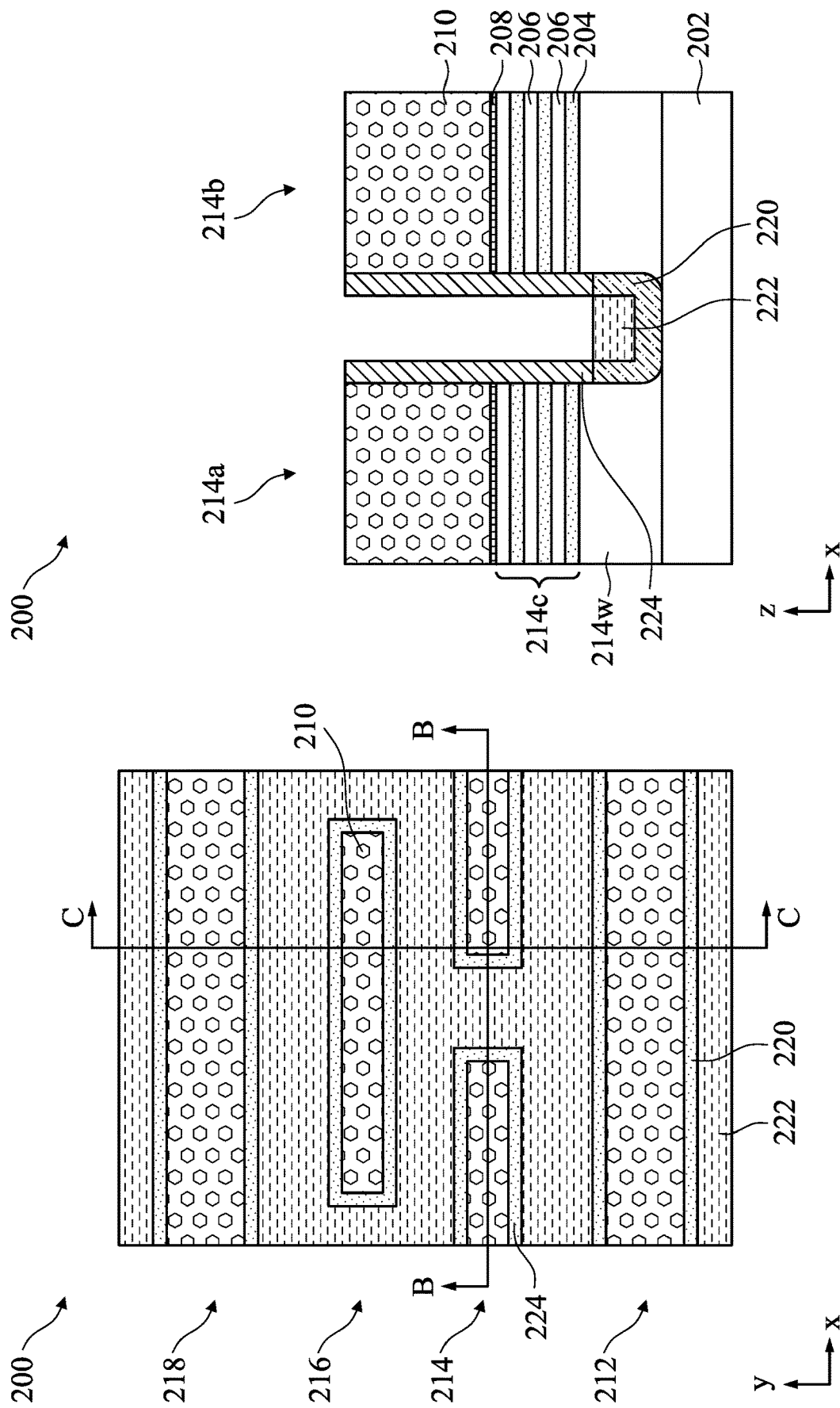

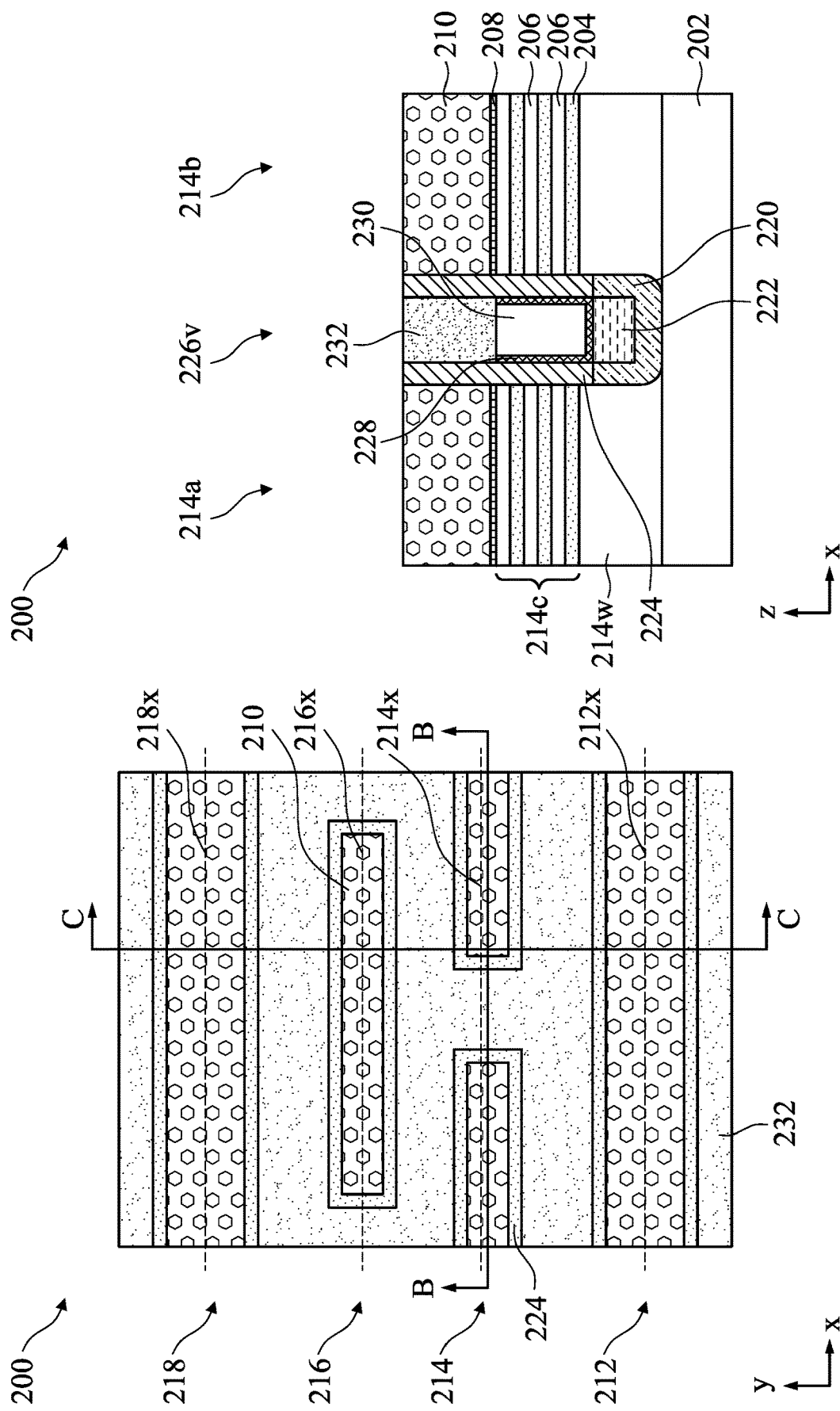

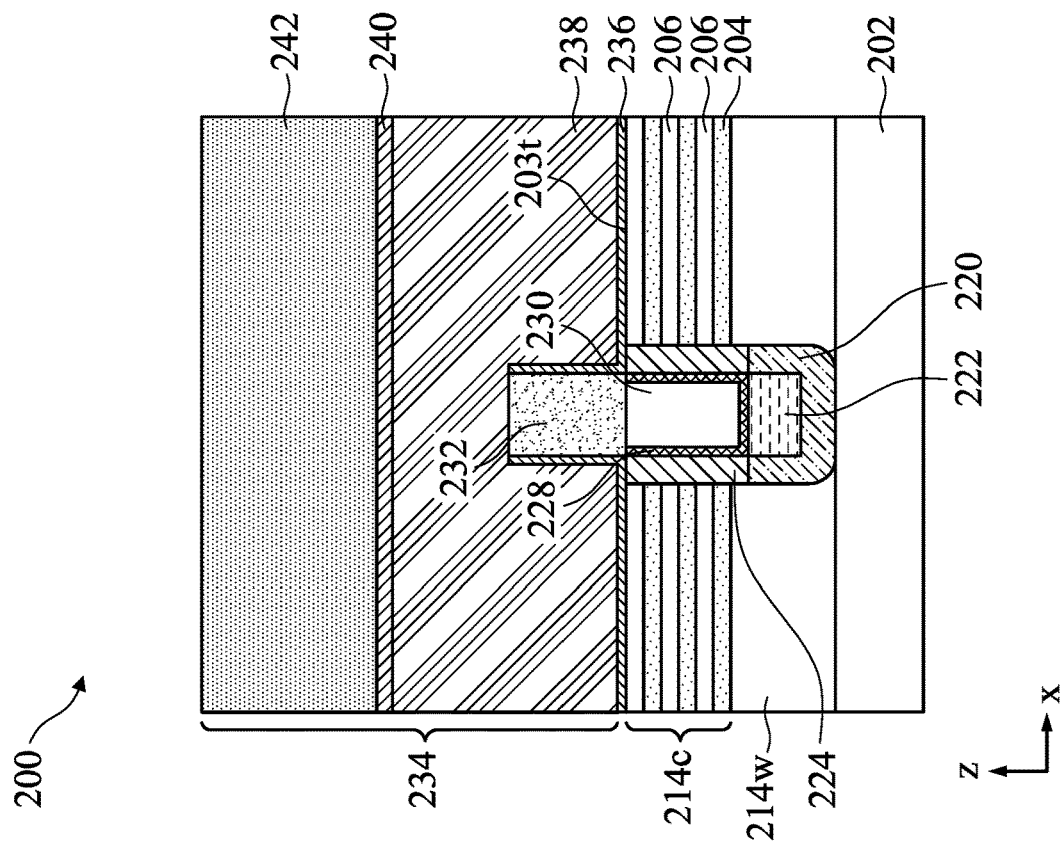
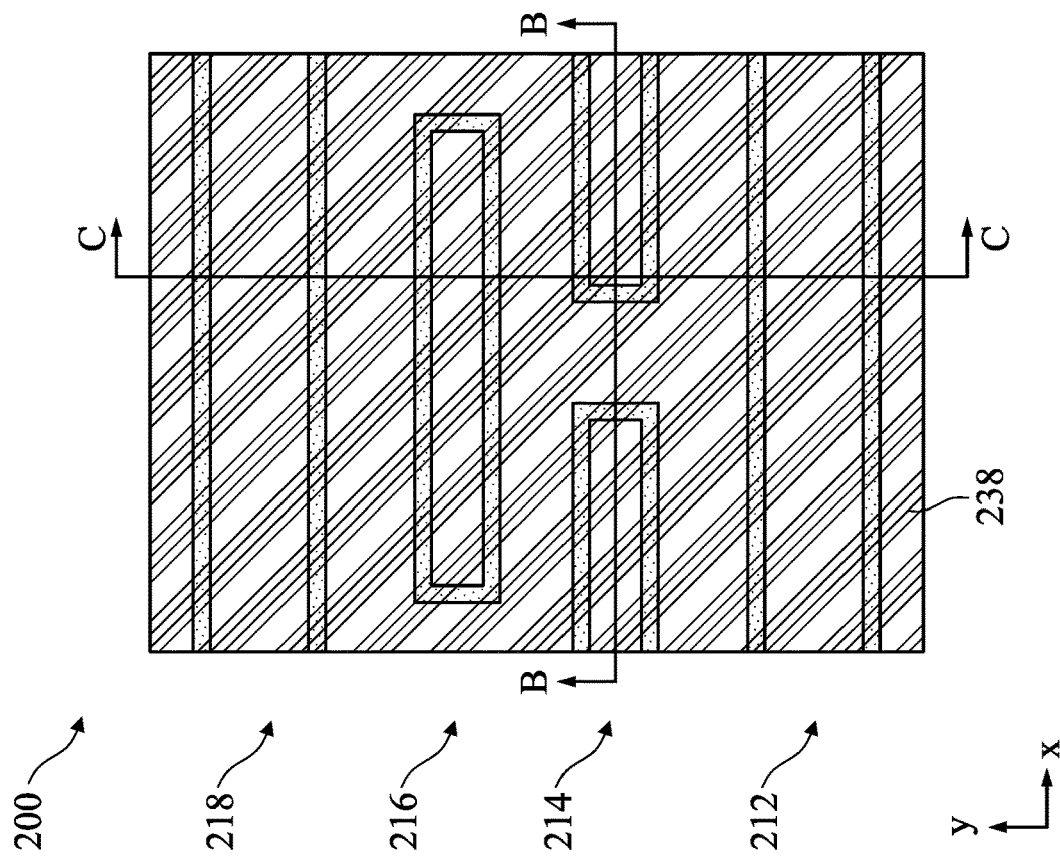
FIG. 7B
FIG. 7A

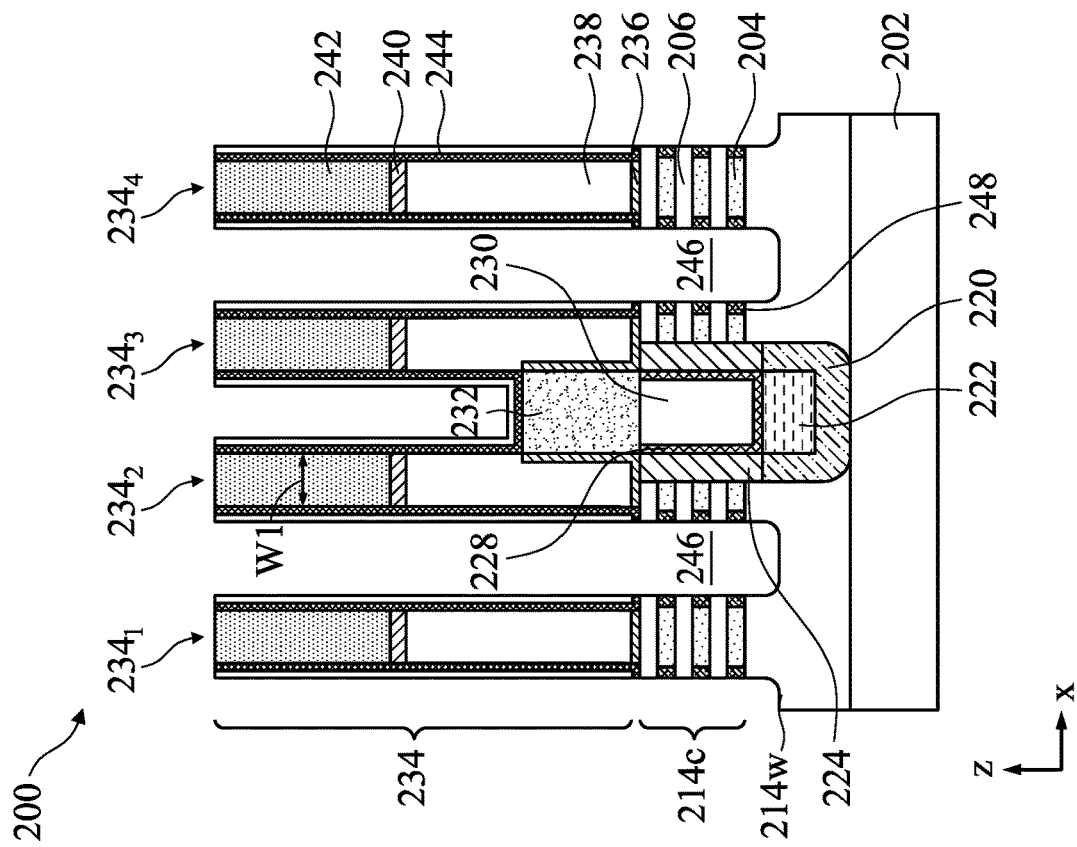
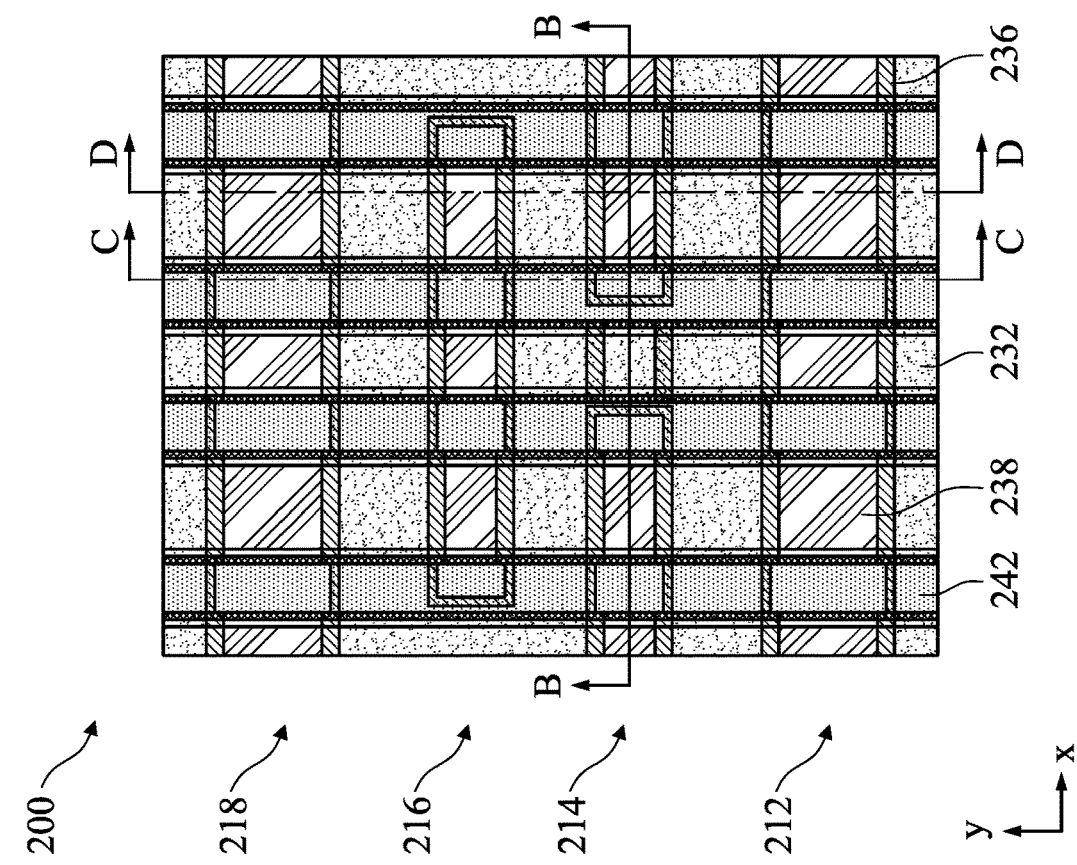
FIG. 13B
FIG. 13A

SEMICONDUCTOR DEVICES AND METHODS OF FABRICATION THEREOF

BACKGROUND

The semiconductor industry has experienced continuous rapid growth due to constant improvements in the integration density of various electronic components. For the most part, this improvement in integration density has come from repeated reductions in minimum feature size, allowing more components to be integrated into a given chip area.

As minimum feature size reduces, the aspect ratio of sacrificial gate structures increases. The increased aspect ratio causes difficulties to fill gate electrode layer in the high aspect ratio space during replacement gate process, particularly for gate structures near dielectric fins. Therefore, there is a need to solve the above problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2C, 3A-3C, 4A-4C, 5A-5C, 6A-6C, 7A-7C, 8A-8E, 9A-9D, 10A-10F, 11A-11E, 12A-12D, 13A-13B, 14A-14D, and 15A-15H schematically illustrate various stages of manufacturing a semiconductor device according to embodiments of the present disclosure.

DETAILED DESCRIPTION

Figure 1:
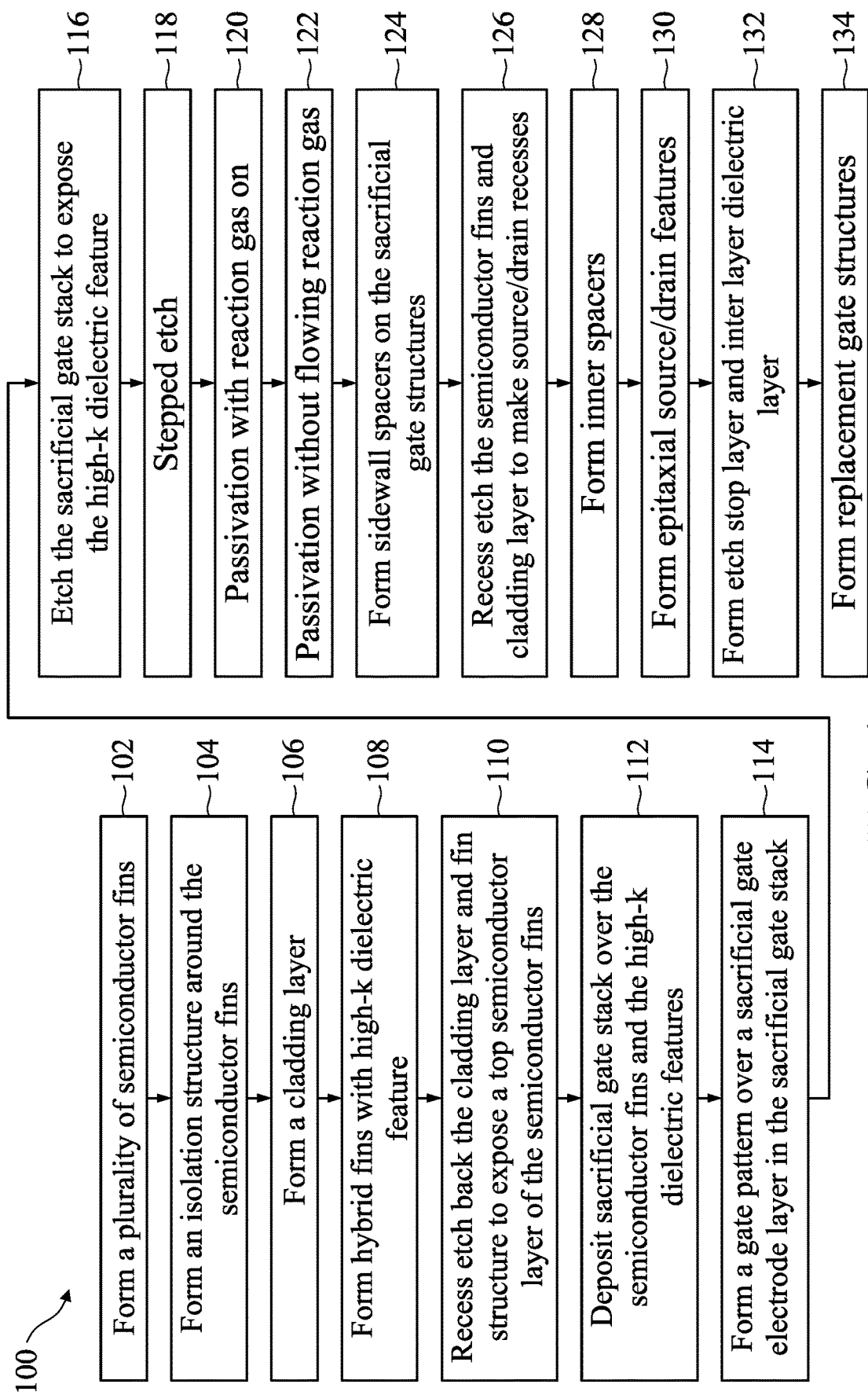
FIG. 1 is a flow chart of a method for manufacturing of a semiconductor device according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 64 degrees or at other orientations) and the spatially relative descriptors used herein may likewise be interpreted accordingly.

The foregoing broadly outlines some aspects of embodiments described in this disclosure. While some embodiments described herein are described in the context of nanosheet channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In addition, although method embodiments may be described in a particular order, various other method embodiments may be performed in any logical order and may include fewer or more steps than what is described herein. In the present disclosure, a source/drain region(s) may refer to a source or a drain, individually or collectively dependent upon the context.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of the present disclosure provide a method for forming sacrificial gate structure over dielectric fins, such as dielectric fins with high-k dielectric tops. Embodiments of the present disclosure may be used to improve quality of contact features to gate electrodes and source/drain regions in various transistors, such as nanosheet Gate-all-around FET(GAAFET/NSFET), Fork-sheet FET, CFET, NS SBI. In some embodiments, a cyclic operation is used to etch sacrificial gate stacks and form sacrificial gate structures. The cyclic operation includes two or more cycles of etching and passivation. In some embodiments, the passivation process is performed with pulsing power supply.

FIG. 1 is a flow chart of a method 100 for manufacturing of a semiconductor device 200 according to embodiments of the present disclosure. FIGS. 2A-2C, 3A-3C, 4A-4C, 5A-5C, 6A-6C, 7A-7C, 8A-8E, 9A-9D, 10A-10F, 11A-11E, 12A-12D, 13A-13B, 14A-14D, and 15A-15H schematically illustrate various stages of manufacturing a semiconductor device according to embodiments of the present disclosure. Additional operations can be provided before, during, and after operations/processes in the method 100, and some of the operations described below can be replaced or eliminated, for additional embodiments of the method. The order of the operations/processes may be interchangeable.

Figures 2A, 2B:
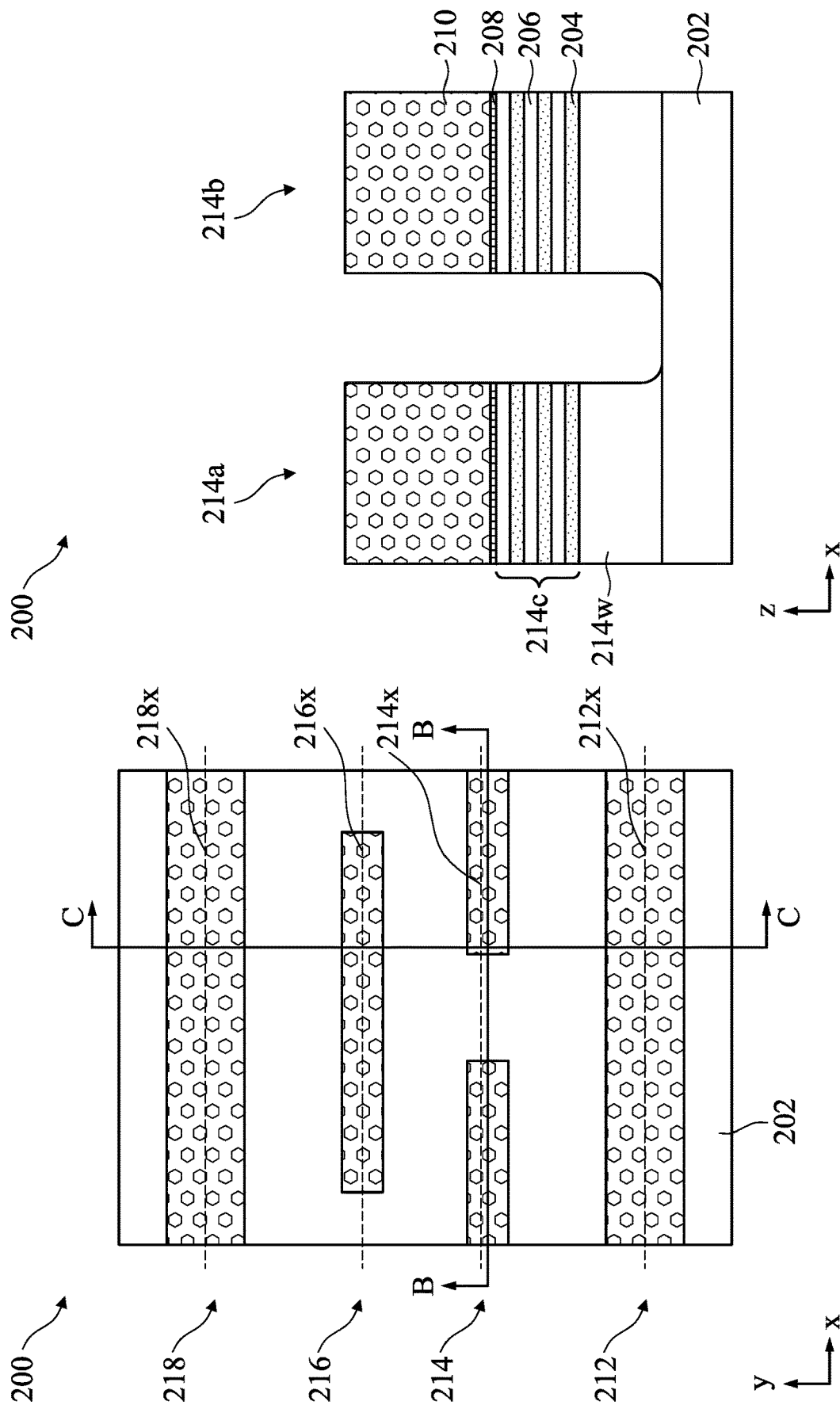
Figure 2C:
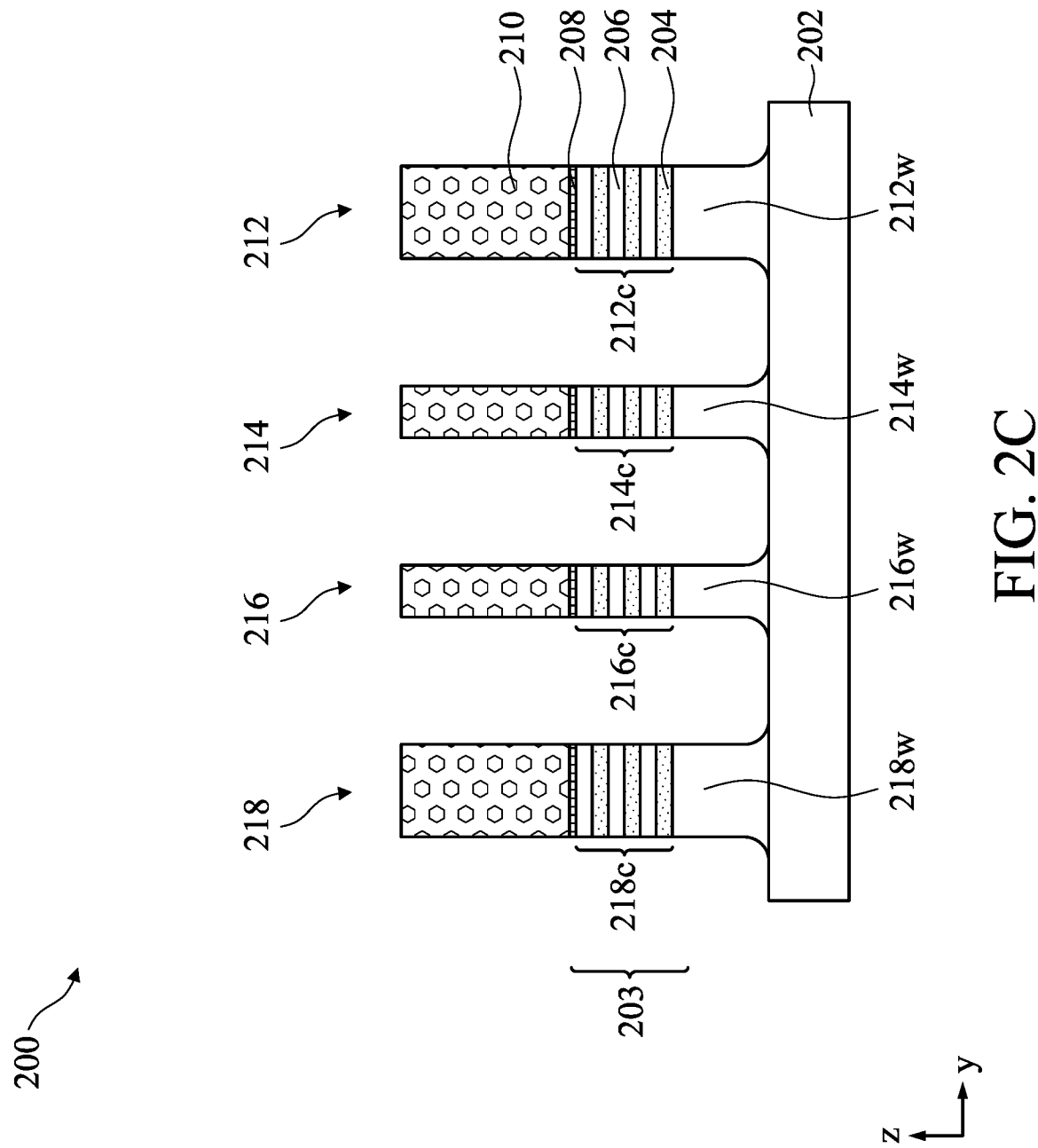

The method 100 begins at operation 102 where a plurality of semiconductor fins 212, 214, 216, 218 are formed over a substrate 202, as shown in FIGS. 2A-2C. FIG. 2A is a schematic top view of the semiconductor device 200. FIG. 2B is a schematic sectional view of the semiconductor device 200 along the line B-B on FIG. 2A. FIG. 2C is a schematic sectional view of the semiconductor device 200 along the line C-C on FIG. 2A.

The semiconductor device 200 is built in and on the substrate 202 is provided to form a semiconductor device thereon. The substrate 202 may include a single crystalline semiconductor material such as, but not limited to Si, Ge, SiGe, GaAs, InSb, GaP, GaSb, InAlAs, InGaAs, GaSbP, GaAsSb, and InP. The substrate 202 may include various doping configurations depending on circuit design. For example, different doping profiles, e.g., n-wells, p-wells, may be formed in the substrate 202 in regions designed for different device types, such as n-type field effect transistors (nFET), and p-type field effect transistors (pFET). In some embodiments, the substrate 202 may be a silicon-on-insulator (SOI) substrate including an insulator structure (not shown) for enhancement.

A semiconductor stack 203 is formed over the substrate 202. The semiconductor stack 203 includes alternating semiconductor layers made of different materials to facilitate formation of nanosheet channels in a multi-gate device, such as nanosheet channel FETs. In some embodiments, the semiconductor stack 203 includes first semiconductor layers 204 interposed by second semiconductor layers 206. The first semiconductor layers 204 and second semiconductor layers 206 have different compositions. In some embodiments, the two semiconductor layers 204 and 206 provide for different oxidation rates and/or different etch selectivity. In later fabrication stages, portions of the second semiconductor layers 206 form nanosheet channels in a multi-gate device. Three first semiconductor layers 204 and three second semiconductor layers 206 are alternately arranged as illustrated in FIGS. 2A-2C as an example. More or less semiconductor layers 204 and 206 may be included in the semiconductor stack 203 depending on the desired number of channels in the semiconductor device to be formed. In some embodiments, the number of semiconductor layers 204 and 206 is between 1 and 10.

In some embodiments, the first semiconductor layer 204 may include silicon germanium (SiGe). The first semiconductor layer 204 may be a SiGe layer including more than 25% Ge in molar ratio. For example, the first semiconductor layer 204 may be a SiGe layer including Ge in a molar ration in a range between 25% and 50%.

The second semiconductor layer 206 may include different materials for different types for devices. For n-type devices, the second semiconductor layer 206 may include silicon (Si). In some embodiments, the second semiconductor layer 206 may include n-type dopants, such as phosphorus (P), arsenic (As), etc. The second semiconductor layer 206 may include silicon, Ge, a compound semiconductor such as SiC, GeAs, GaP, InP, InAs, and/or InSb, an alloy semiconductor such as SiGe, GaAsP, AlInAs, AlGaAs, InGaAs, GaInP, and/or GaInAsP, or combinations thereof.

The semiconductor layers 204, 206 may be formed by a molecular beam epitaxy (MBE) process, a metalorganic chemical vapor deposition (MOCVD) process, and/or other suitable epitaxial growth processes. Semiconductor layers 204, 206 for n-type and p-type devices may be formed by different processes at different areas.

In some embodiments, each semiconductor layer 206 has a thickness in a range between about 5 nm and about 30 nm. The semiconductor layers 204 may eventually be removed and serve to define a vertical distance between adjacent channel regions for a subsequently formed multi-gate device. In some embodiments, the thickness of the semiconductor layer 204 is equal to or greater than the thickness of the semiconductor layer 206. In some embodiments, each semiconductor layer 204 has a thickness in a range between about 5 nm and about 50 nm.

The semiconductor fins 212, 214, 216, 218 are formed from the semiconductor stack 203, and a portion of the substrate 202 underneath. The semiconductor fins 212, 214, 216, 218 may be formed by patterning a pad layer 208 and a hard mask 210 formed on the semiconductor stack 203 and one or more etching processes. Each semiconductor fin 212, 214, 216, 218 has a channel portion 212c, 214c, 216c, 218c formed from the semiconductor stack 203, and a well portion 212w, 214w, 216w, 218w formed from the substrate 202. In FIGS. 2A-2C, the semiconductor fins 212, 214, 216, 218 are formed along longitudinal axis 212x, 214x, 216x, 218x along the x-direction and substantially parallel to each other. Widths of the semiconductor fins 212, 214, 216, 218 along the Y direction may be in a range between about 3 nm and about 44 nm. In some embodiments, widths of the semiconductor fins 212, 214, 216, 218 may be different according to circuit design.

In some embodiments, the semiconductor device 200 may be an array of memory cells, such as a static random-access memory ("SRAM") array. The semiconductor fins 212, 218 may be intended to be channels for n-type devices, such as pull-down transistors and pass transistors. The semiconductor fins 214, 216 may be intended to be channels for p-type devices, such as pull-up transistors. In some embodiments, the semiconductor fins 212, 218 may have width greater than the width of the semiconductor fins 214, 216. The semiconductor fins 212, 218 may extend continuously along the x-direction for the array of memory cells. The semiconductor fins 214, 216 may be cut into sections for each memory cell. In some embodiments, the semiconductor fins 214, 216 may be first formed as a continuous fin. A subsequent cutting process may be performed to cut the semiconductor fins 214, 216 into sections. As shown in FIGS. 2A, 2B, the semiconductor fin 214 may be cut into two sections 214a, 214b.

Figures 3A, 3B:
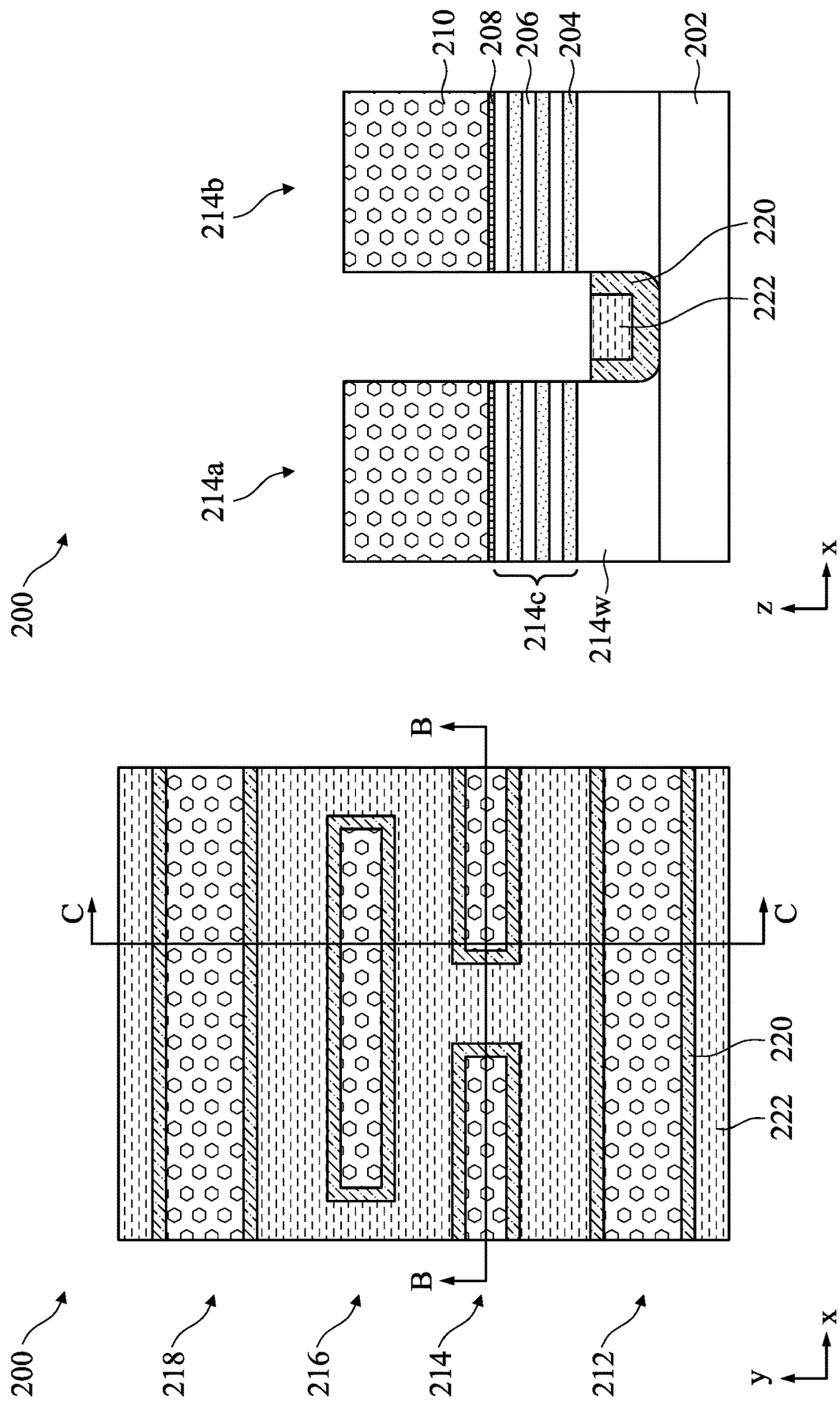
Figure 3C:
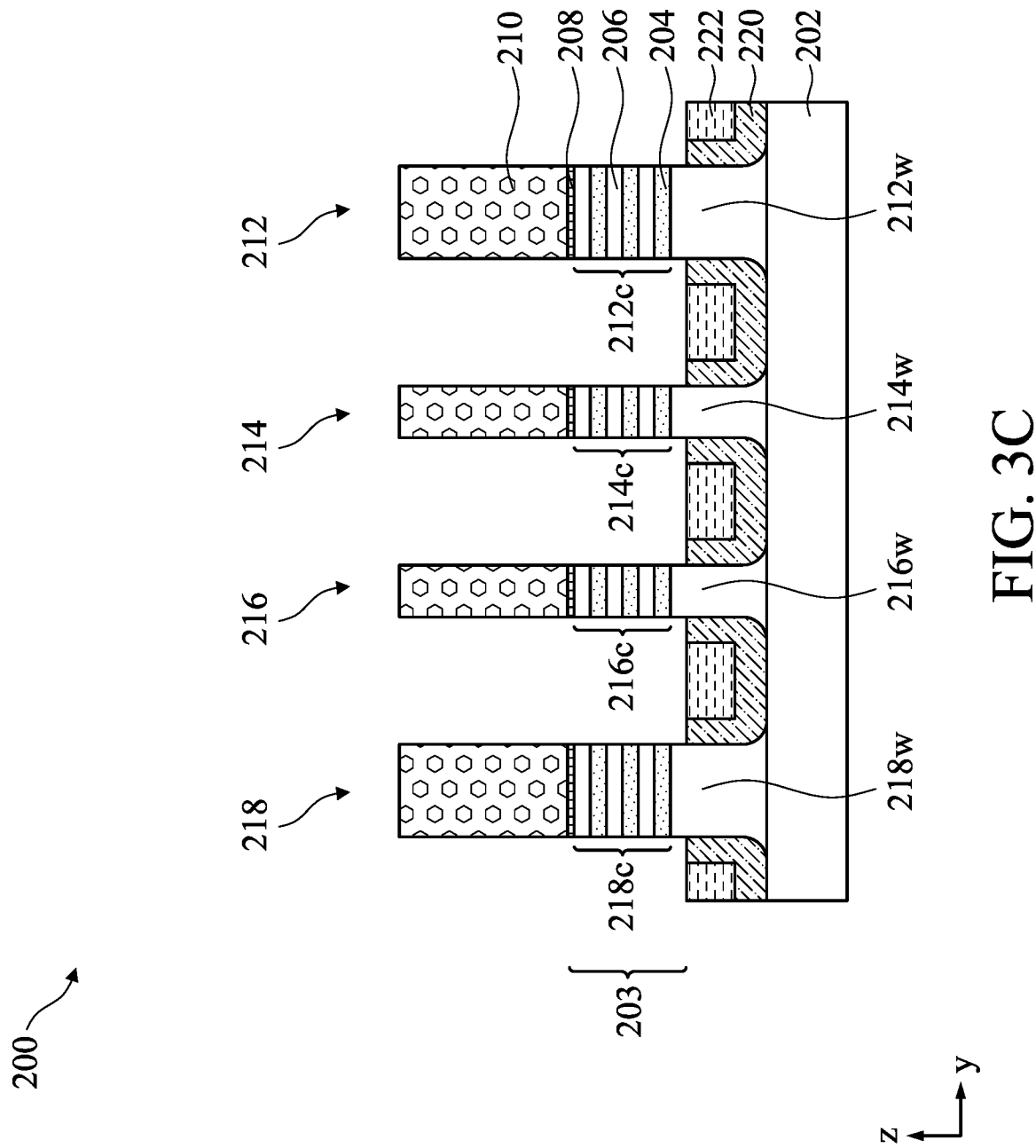

In operation 104, an isolation layer 22 is formed over the substrate 202 and around the semiconductor fins 212, 214, 216, 218 as shown in FIGS. 3A-3C. FIG. 3A is a schematic top view of the semiconductor device 200. FIG. 3B is a schematic sectional view of the semiconductor device 200 along the line B-B on FIG. 3A. FIG. 3C is a schematic sectional view of the semiconductor device 200 along the line C-C on FIG. 3A.

The isolation layer 222 is formed over the substrate 202 to cover at least a part of around the well portions 212w, 214w, 216w, 218w of the semiconductor fins 212, 214, 216, 218. The isolation layer 222 may be formed by a high-density plasma chemical vapor deposition (HDP-CVD), a flowable CVD (FCVD), or other suitable deposition process. In some embodiments, a liner layer 220 may be deposited prior to deposition of the isolation layer 222. In some embodiments, the isolation layer 222 may include silicon oxide, silicon nitride, silicon oxynitride, fluorine-doped silicate glass (FSG), a low-k dielectric, combinations thereof. The liner layer 220 may include silicon nitride, silicon oxynitride, or the like. In some embodiments, the isolation layer 222 is formed to cover the semiconductor fins 212, 214, 216, 218 by a suitable deposition process to fill the trenches between the semiconductor fins 212, 214, 216, 218. The isolation layer 222 and the liner layer 220 are then recess etched using a suitable anisotropic etching process to expose the channel portions 212c, 214c, 216c, 218c of the semiconductor fins 212, 214, 216, 218. In some embodiments, the isolation layer 222 is etched to expose a portion of the well portions 212w, 214w, 216w, 218w of the semiconductor fins 212, 214, 216, 218.

Figure 4C:
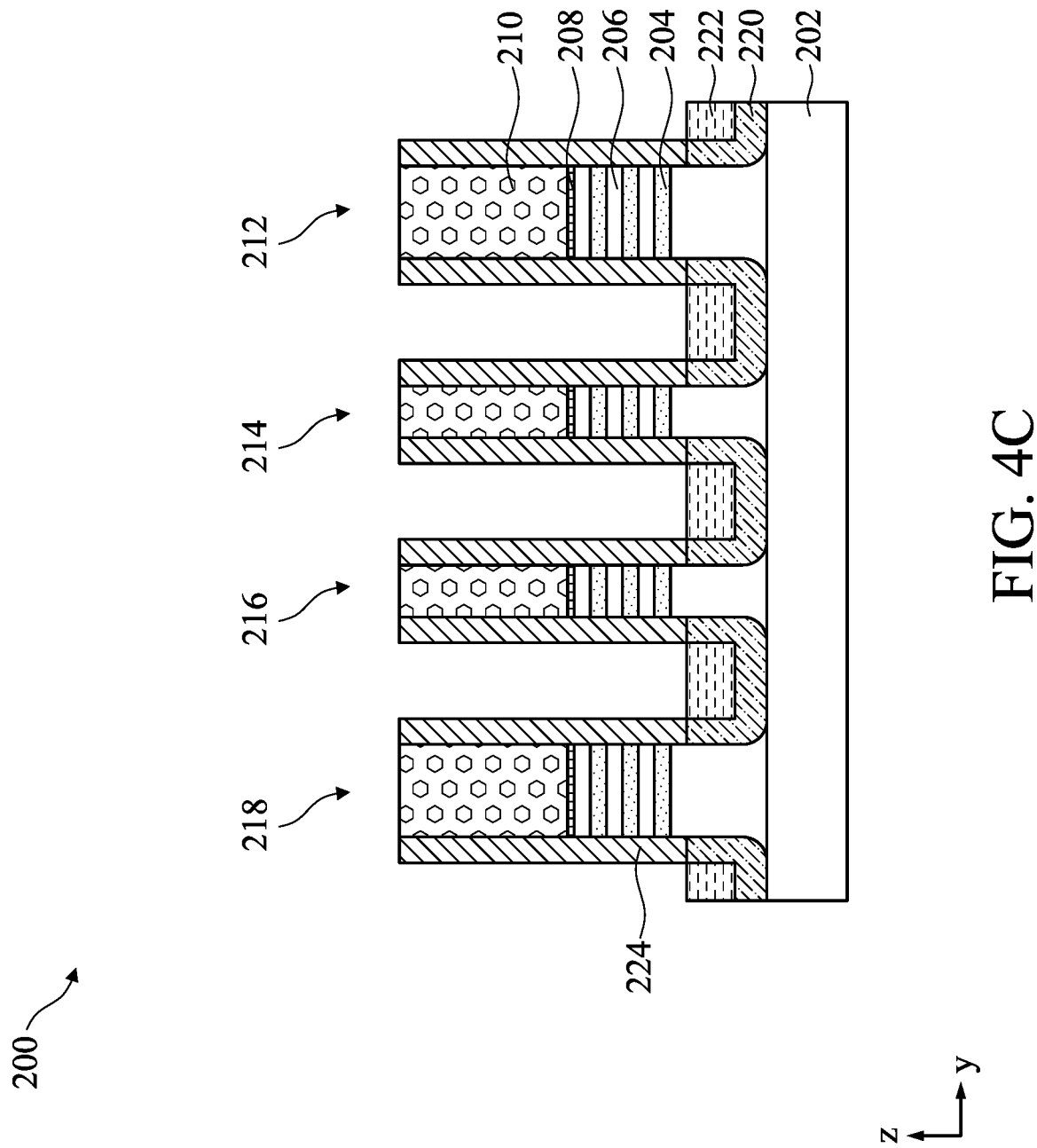

In operation 106, a cladding layer 224 is formed by an epitaxial process over exposed portion of the semiconductor fins 212, 214, 216, 218 as shown in FIGS. 4A-4C. FIG. 4A is a schematic top view of the semiconductor device 200.

FIG. 4B is a schematic sectional view of the semiconductor device 200 along the line B-B on FIG. 4A. FIG. 4C is a schematic sectional view of the semiconductor device 200 along the line C-C on FIG. 4A.

In some embodiments, a semiconductor liner (not shown) may be first formed over the semiconductor fins 212, 214, 216, 218 including the pad layer 208 and the hard hard mask 210, and the cladding layer 224 is then formed over the semiconductor liner by an epitaxial process. In some embodiments, the cladding layer 224 includes a semiconductor material, for example SiGe. In some embodiments, the cladding layer 224 may have a composition similar to the composition of the first semiconductor layer 204, thus may be selectively removed from the second semiconductor layer 206 and the fourth semiconductor layer 15.

Figure 5C:
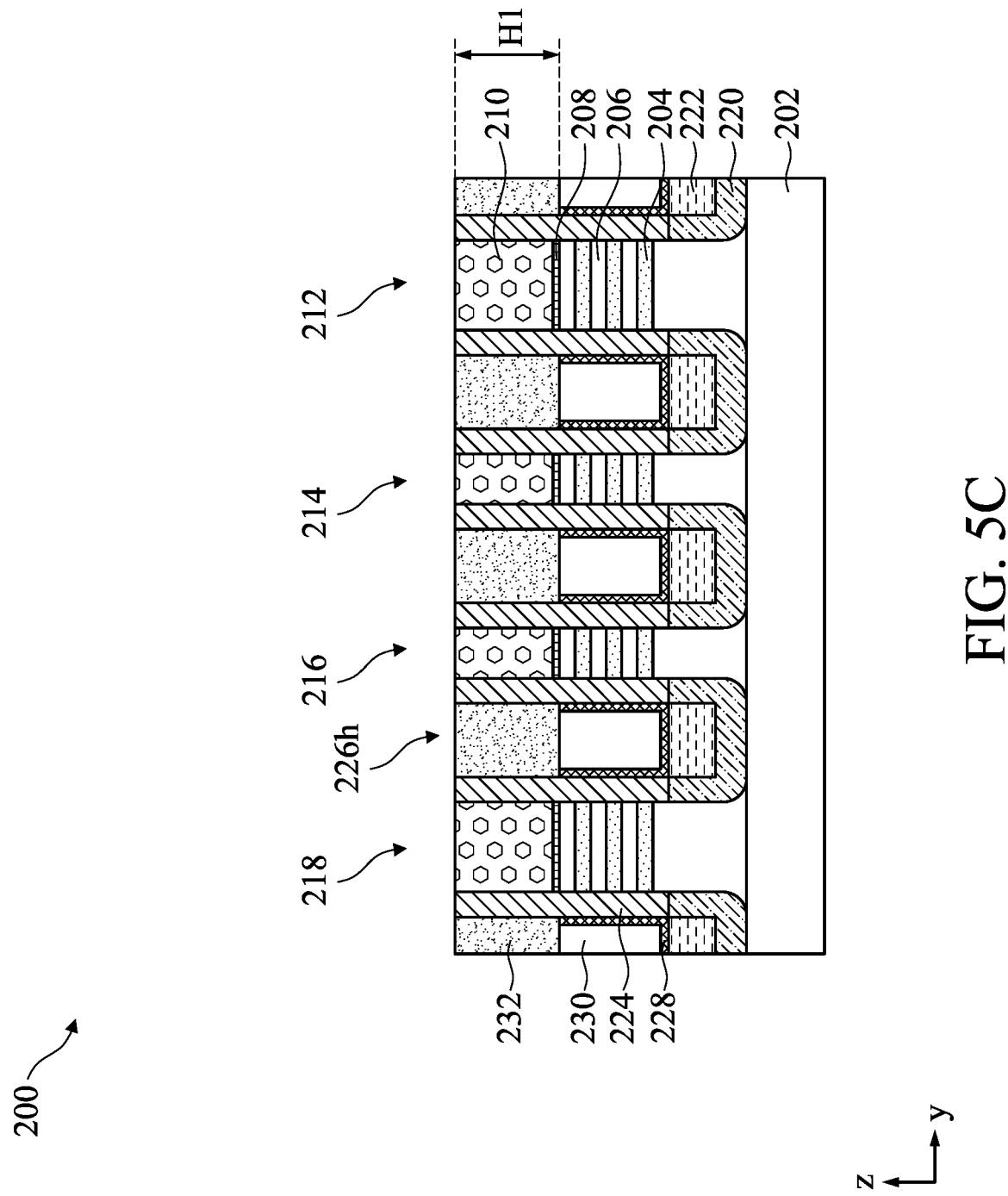

In operation 108, dielectric fins 226 are formed in the trenches between the neighboring semiconductor fins 212, 214, 216, 218 after formation of the cladding layer 224 as shown in FIGS. 5A-5C. FIG. 5A is a schematic top view of the semiconductor device 200. FIG. 5B is a schematic sectional view of the semiconductor device 200 along the line B-B on FIG. 5A. FIG. 5C is a schematic sectional view of the semiconductor device 200 along the line C-C on FIG. 5A.

The dielectric fins 226, also referred to as dummy fins or hybrid fins, are dielectric materials filled the recessed spaces above the isolation layer 222 and between the semiconductor fins 212, 214, 216, 218. The dielectric fins 226 are fin like structures. Depending on circuit design, some dielectric fins 226 are parallel dielectric fins 226p that extend along the x-direction, parallel to the semiconductor fins 212, 214, 216, 218. These parallel dielectric fins 226p may function to divide gate electrodes into electrically isolated sections. Some dielectric fins 226 are perpendicular dielectric fins 226v that extend along the y-direction, perpendicular to the semiconductor fins 212, 214, 216, 218. These perpendicular dielectric fins 226v function to cut channels in the same semiconductor fin into electrically isolated sections.

The dielectric fins 226 may include one or more layers of conductive materials, such as a high-k dielectric material layer, a low-k dielectric material layer, or a bi-layer dielectric material including high-k upper part and a low-k lower part. In some embodiments, the dielectric fins 226 include a high-k metal oxide, such as $HfO_2$, $ZrO_2$, HfAlOx, HfSiOx, $Al_2O_3$, and the like, a low-k material such as SiONC, SiCN, SiOC, or other dielectric material. In the example of FIGS. 5A-5C, the dielectric fin 226 may include a bi-layer lower portion and a high-k upper portion. The bi-layer lower portion includes a dielectric liner layer 228 and a dielectric filling layer 230. In some embodiments, the dielectric liner layer 228 may include a low-k material, such as SiONC, SiCN, SiOC, or other dielectric material, that provide etch resistance during replacement gate processes. The dielectric filling layer 230 may be a low-k dielectric material, such as silicon oxide.

The dielectric liner layer 228 may be conformally deposited over exposed surfaces, such as the isolation layer 222 and the cladding layer 224. The dielectric filling layer 230 is then deposited over the dielectric liner layer 228 to fill the trenches. The dielectric liner layer 228 and the dielectric filling layer 230 are then recess etched. The recess may be performed by any suitable process, such as dry etch, wet etch, or a combination thereof. The etch process may be a selective etch process that does not remove the semiconductor material of the cladding layer 224. The recess process may be controlled so that the dielectric liner layer 228 and the dielectric filling layer 230 are substantially at the same level as a top surface of the topmost second semiconductor layer 206. As a result of the recess etch, recesses are formed between the semiconductor fins 212, 214, 216, 218.

A high-k dielectric materials is then deposited to fill the recesses. In some embodiments, the high-k dielectric features 232 are formed by a blanket deposition followed by a planarization process. The high-k dielectric features 232 may include a material having a k value greater than 7, such as HfO, TaN, $Al_2O_3$, SiO, SiN, SiCN, SiOCN, $HfO_2$, $ZrO_2$, HfAlOx, HfSiOx, or the similar. Any suitable deposition process, such as a CVD, PECVD, FCVD, or ALD process, may be used to deposit the high-k dielectric material. The planarization process is the performed. After the planarization, the high-k dielectric feature 232 may have a height H1 along the z-direction. In some embodiments, the height H1 is in a range between about 10 nm and about 30 nm.

Figure 6B:
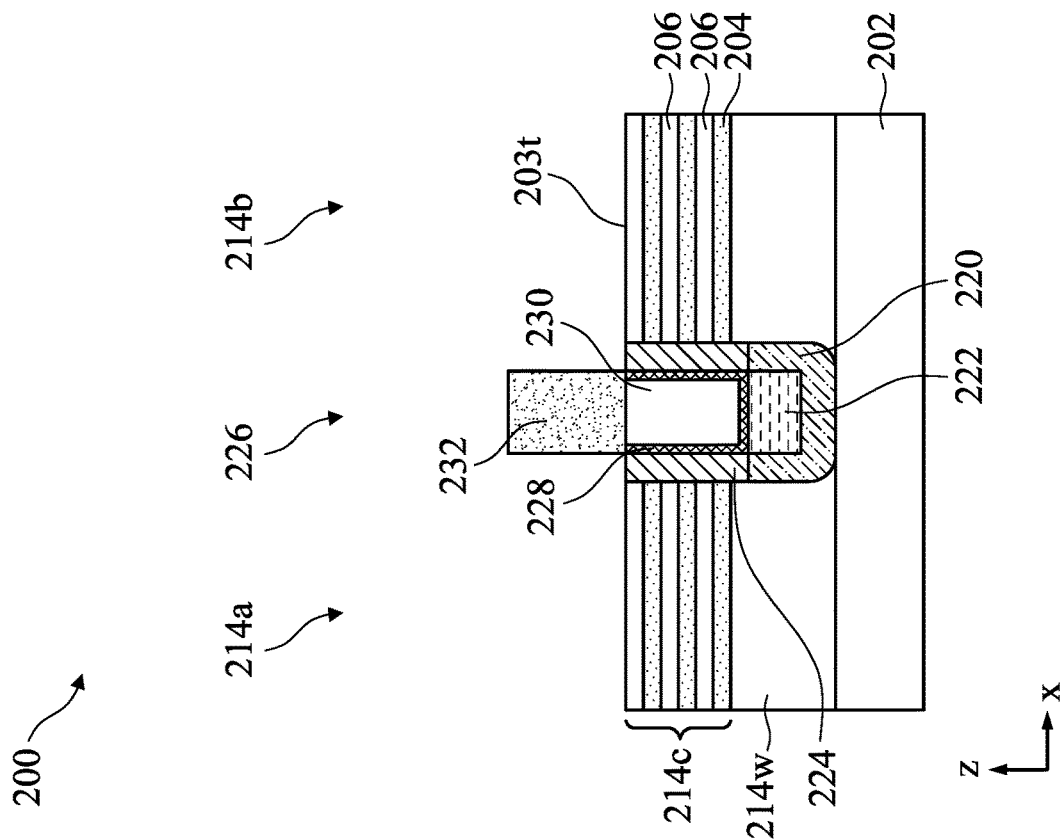
Figure 6A:
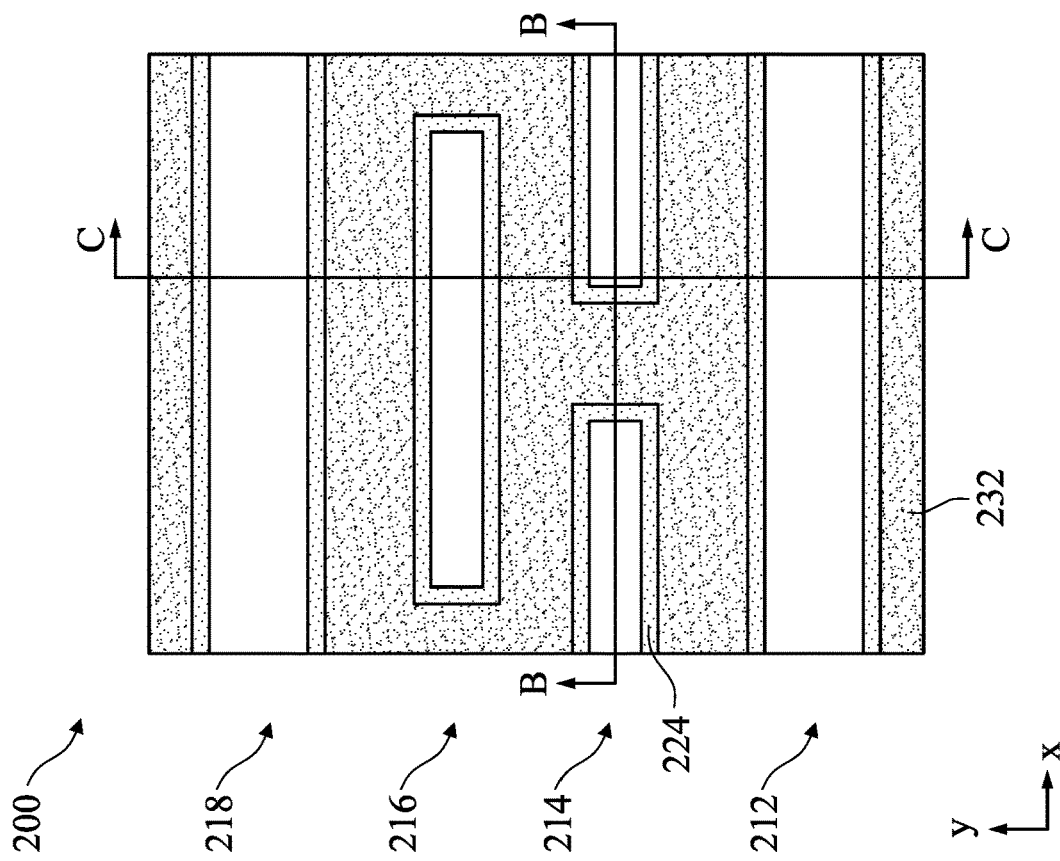
Figure 6C:
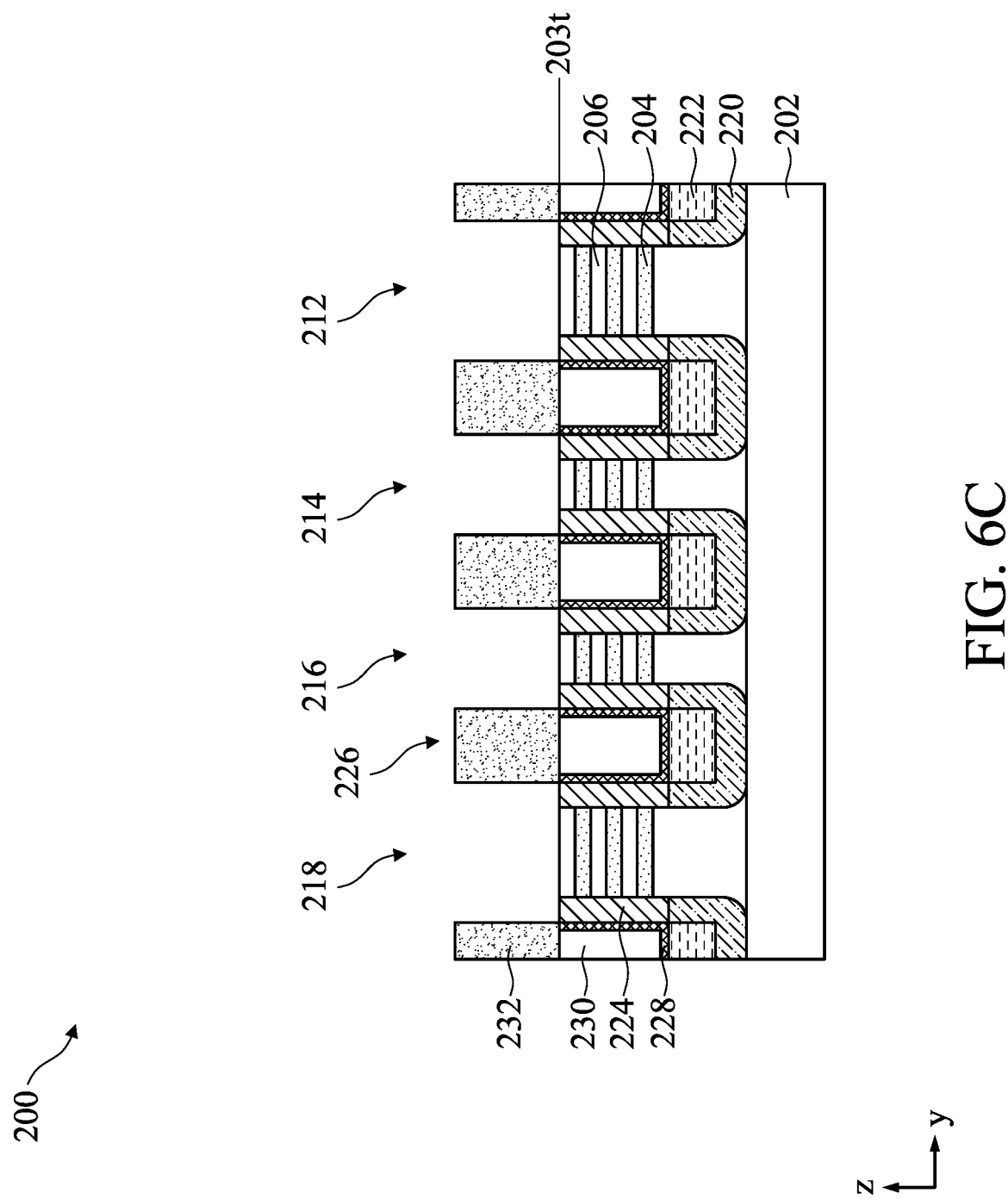

In operation 110, the pad layer 208 and the hard mask 210 are removed exposing the topmost semiconductor layer 206, and the cladding layer 224 is recessed to level with a top surface 203t of the semiconductor stack 203, as shown in FIGS. 6A-6C. FIG. 6A is a schematic top view of the semiconductor device 200. FIG. 6B is a schematic sectional view of the semiconductor device 200 along the line B-B on FIG. 6A. FIG. 6C is a schematic sectional view of the semiconductor device 200 along the line C-C on FIG. 6A. The high-k dielectric features 232 protrude over the semiconductor fins 212, 214, 216, 218 and the lower portion of the dielectric fins 226. The high-k dielectric features 232 may function to separate gate structures formed over the semiconductor fins 212, 214, 216, 218.

Figure 7C:
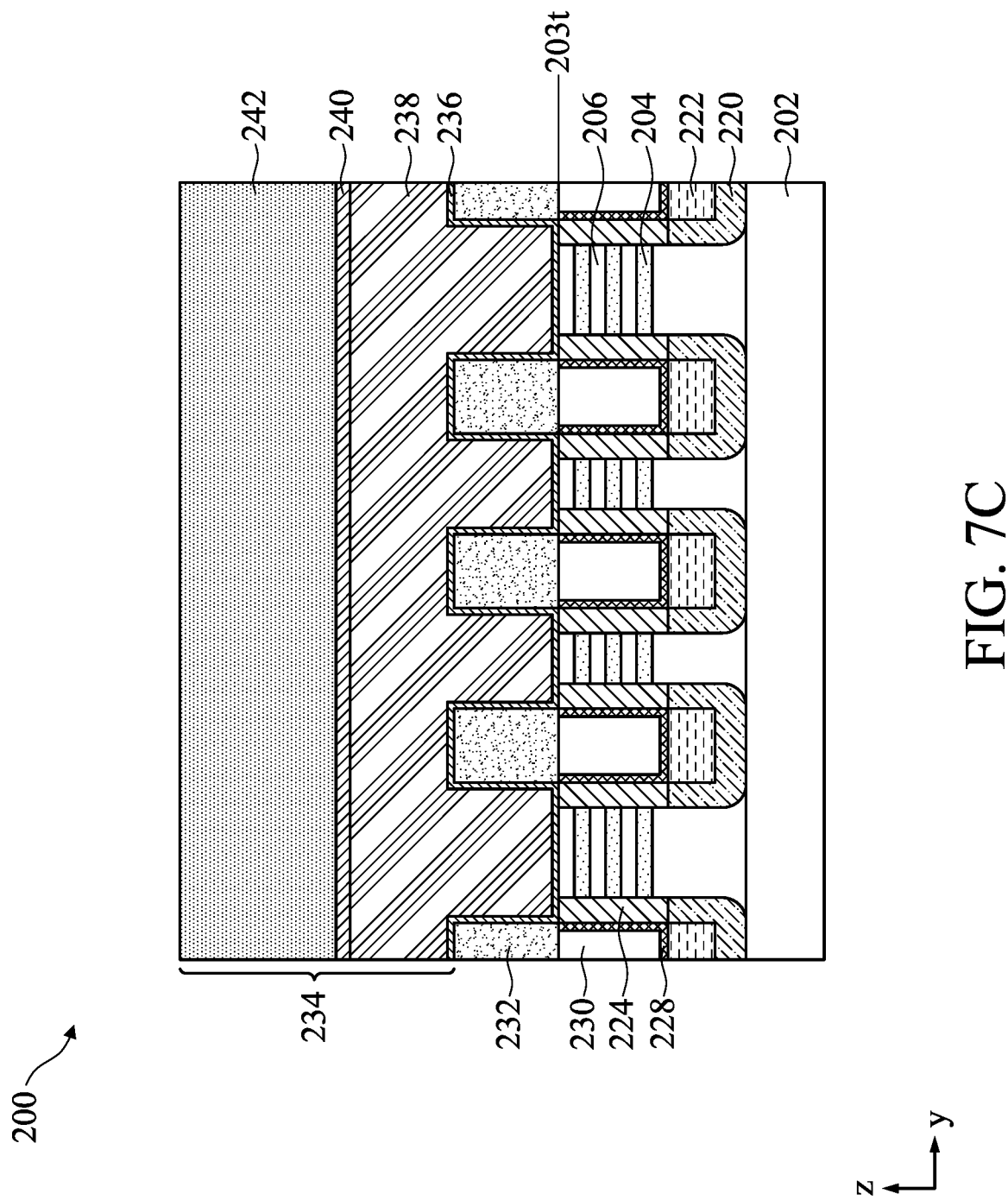

In operation 112, a sacrificial gate stack 234 are formed as shown in FIGS. 7A-7C. FIG. 7A is a schematic top view of the semiconductor device 200. FIG. 7B is a schematic sectional view of the semiconductor device 200 along the line B-B on FIG. 7A. FIG. 7C is a schematic sectional view of the semiconductor device 200 along the line C-C on FIG. 7A. The sacrificial gate stack 234 is deposited over the semiconductor fins 212, 214, 216, 218 and the dielectric fins 226. The sacrificial gate stack 234 may include a sacrificial gate dielectric layer 236, a sacrificial gate electrode layer 238, a pad layer 240, and a mask layer 242.

The sacrificial gate dielectric layer 236 may be deposited conformally over the semiconductor fins 212, 214, 216, 218 and the high-k dielectric features 232. In some embodiments, the sacrificial gate dielectric layer 236 may be deposited by a CVD process, a sub-atmospheric CVD (SACVD) process, a FCVD process, an ALD process, a PVD process, or other suitable process. The sacrificial gate dielectric layer 236 may include one or more layers of dielectric material, such as $SiO_2$, SiN, a high-k dielectric material, and/or other suitable dielectric material. In some embodiments, the sacrificial gate dielectric layer 236 includes a material different than that of the high-k dielectric features 232.

The sacrificial gate electrode layer 238 may be blanket deposited over the sacrificial gate dielectric layer 236. The sacrificial gate electrode layer 238 includes silicon such as polycrystalline silicon or amorphous silicon. The thickness of the sacrificial gate electrode layer is in a range between about 70 nm and about 200 nm. In some embodiments, the sacrificial gate electrode layer 238 is subjected to a planarization operation. The sacrificial gate electrode layer 238 may be deposited using CVD, including LPCVD and PECVD, PVD, ALD, or other suitable process.

The pad layer 240 and the mask layer 242 are subsequently formed over the sacrificial gate electrode layer 238 and used to transfer a gate pattern to the sacrificial gate dielectric layer 236 and the gate electrode layer 238.

The pad layer 240 may be a thin film comprising silicon oxide formed, for example, using a thermal oxidation process. The pad layer 240 may act as an adhesion layer between the sacrificial gate electrode layer 238 and the mask layer 242. The pad layer 240 may also act as an etch stop layer for etching the mask layer 242. In some embodiments, the mask layer 242 is formed of silicon nitride, for example, using low-pressure chemical vapor deposition (LPCVD) or plasma enhanced chemical vapor deposition (PECVD). The mask layer 242 is used as a hard mask during subsequent patterning processes.

Figure 8B:
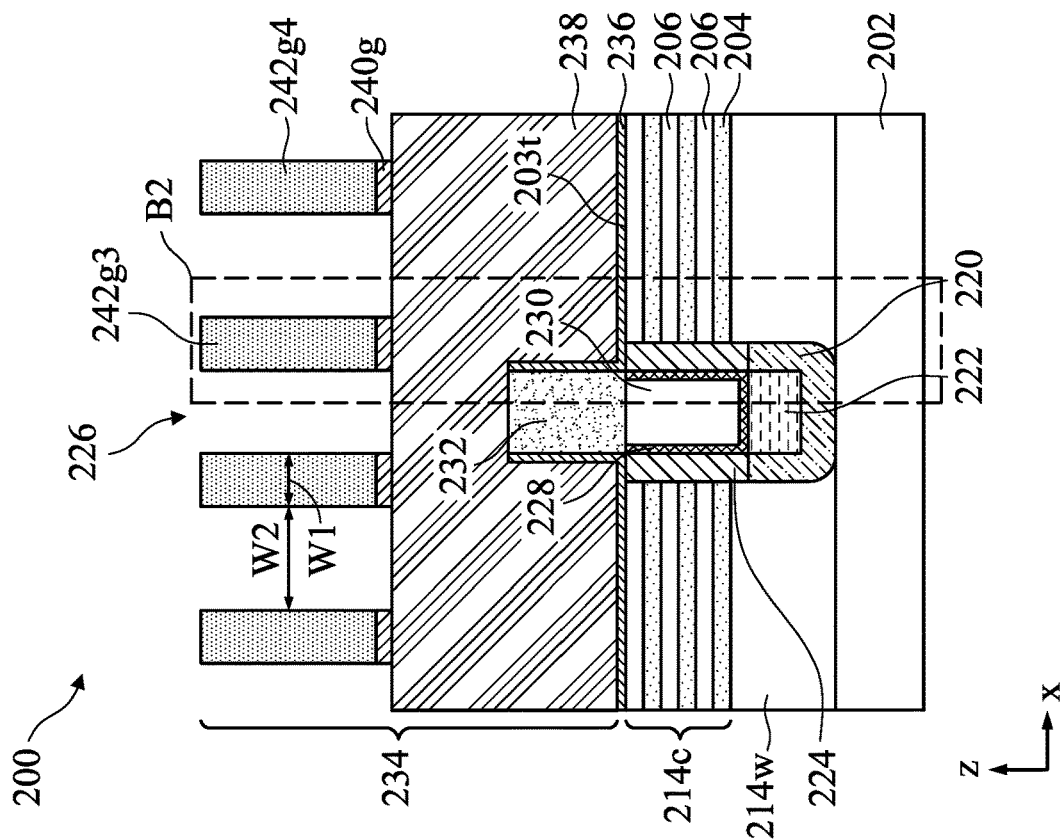
Figure 8A:
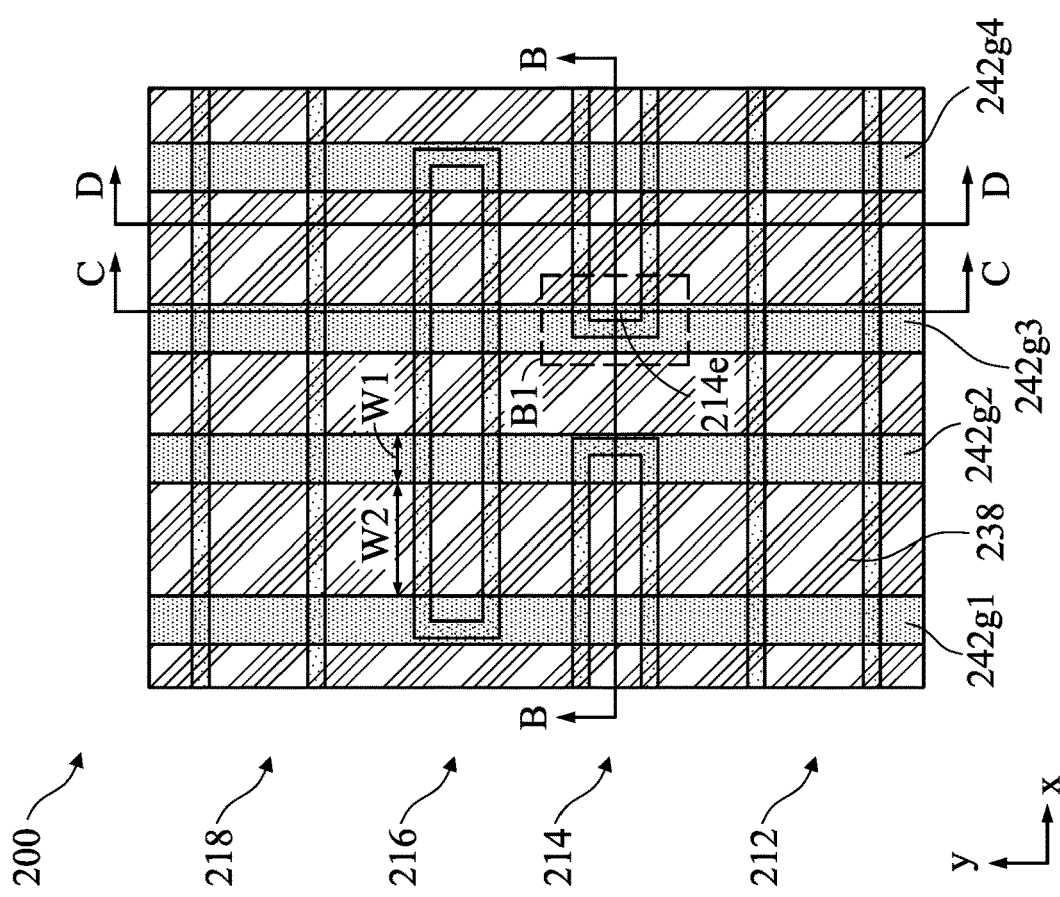
Figure 8C:
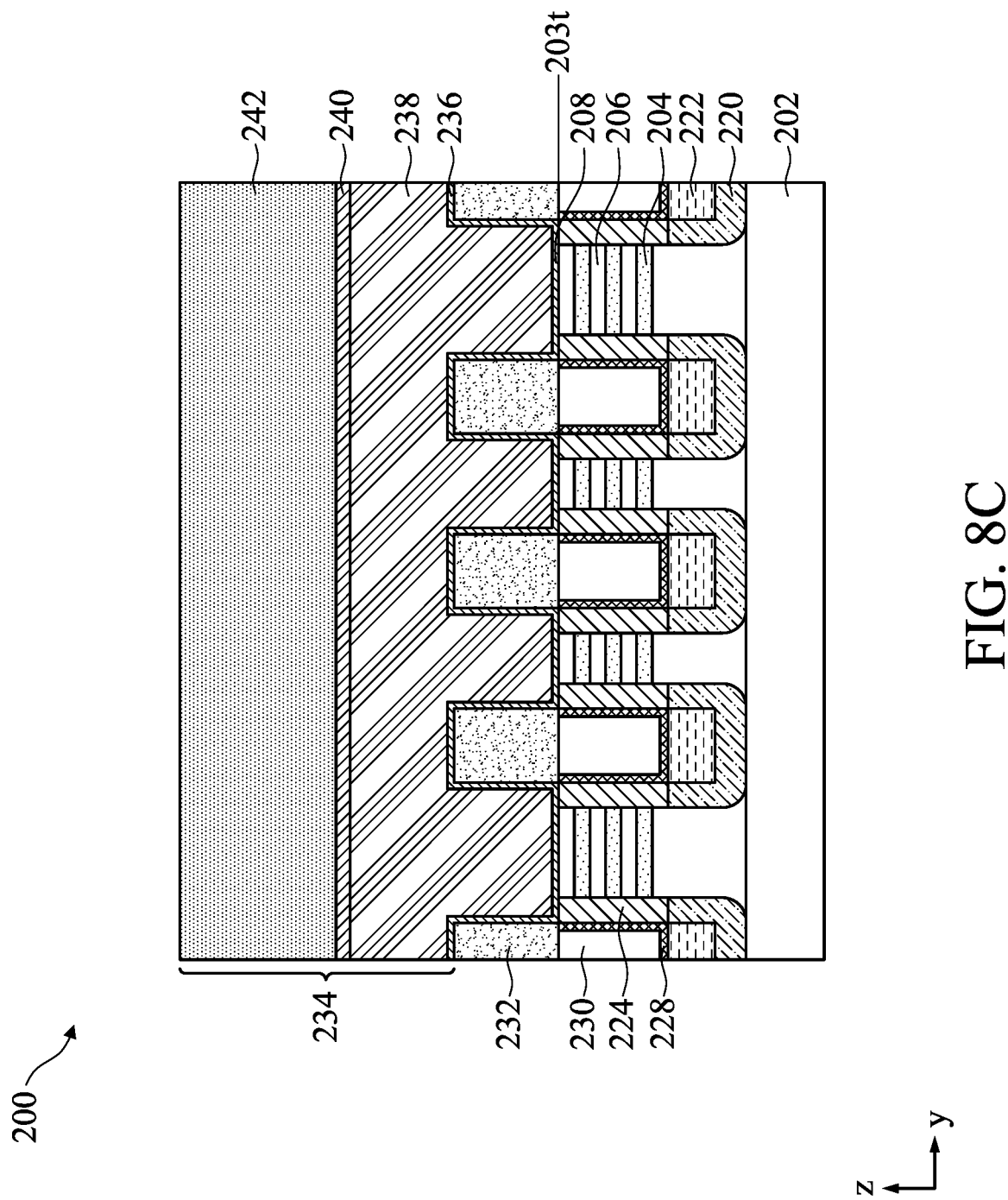

In operation 114, a gate pattern is formed over the sacrificial gate electrode layer 238 in the sacrificial gate stack 234, as shown in FIGS. 8A-8C. FIG. 8A is a schematic top view of the semiconductor device 200. FIG. 8B is a schematic sectional view of the semiconductor device 200 along the line B-B on FIG. 8A. FIG. 8C is a schematic sectional view of the semiconductor device 200 along the line C-C on FIG. 8A. Particularly, a gate pattern is formed in the mask layer 242 and the pad layer 240, by one or more suitable lithographic process. As shown in FIGS. 8A-8B, gate mandrels 242g1, 242g2, 242g3, 242g4 (collectively 242g) are formed over the sacrificial gate electrode layer 238. The gate mandrels 242g extend along the y-direction, substantially perpendicular to the semiconductor fins 212, 214, 216, 218. In some embodiments, the gate mandrels 242g have a width W1 along the x-direction. Spacings between the gate electrodes 242g may have a width W2 along the x-direction. In some embodiments, the width W1 is substantially the same for the gate mandrels 242g1, 242g2, 242g3, 242g4. In some embodiments, the width W1 in a range between about 5 nm and 20 nm, for example between about 10 nm and 12 nm. In some embodiments, the width W2 in a range between about 15 nm and 40 nm, for example between about 25 nm and 35 nm.

The gate mandrel 242g may overlap with an end portion of the semiconductor fin 214, 216 and adjacent the perpendicular dielectric fin 226v. The gate mandrel 242g overlapping the end portion of a semiconductor fin may be designed to form a gate structure for controlling channels in the end portions of the semiconductor fins. For example, as shown box B1 in FIG. 8A and box B2 in FIG. 8B, the gate mandrels 242g3 is positioned at an end portion 214e of the section 214b of the semiconductor fin 214. The gate mandrel 242g3 may be positioned to flash against or slightly overlap with the perpendicular dielectric fin 226v between the sections 214a, 214b of the semiconductor fin 214.

Figure 8E:
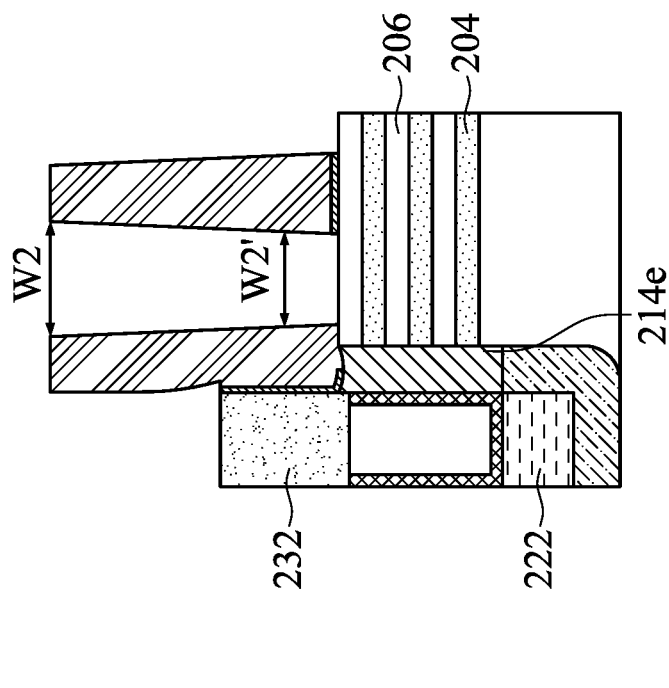
Figure 8D:
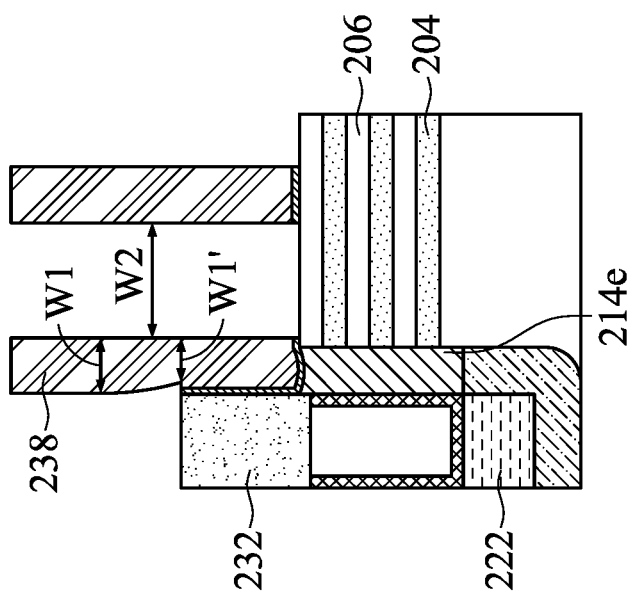

When performing an etch process to transfer the gate pattern from the gate mandrel 242g to the sacrificial gate electrode layer 238, etch charge effect over the high-k features 232 induces lateral over etching of the sacrificial gate electrode layer 238 under the gate mandrel 242g, resulting in reduced width of the sacrificial gate structure. FIG. 8D is a schematic cross-sectional view of a semiconductor device with over etched sacrificial gate electrode. Width of the sacrificial gate electrode near the high-k feature 232 reduces to W1'. In some situations, the ratio of width W1' over width W1 may be as low as 0.5. To avoid defects caused by the over etch, conventional technology either widening the width W1 of the gate mandrel over the end portion of a semiconductor fin is widened to provide allowance for over etching or under etching during pattern transferring reducing dimension of the source/drain regions between the gates. FIG. 8E is a schematic cross-sectional view of a semiconductor device with an under etched sacrificial gate electrode. Even though under etch avoided reduction of the width W1 of the sacrificial gate electrode, the width W2 of the spacings between the sacrificial gate electrodes reduces to a width W2'. The reduced width W2' results in reduced volume of source/drain regions to be formed there, thus, negatively affect device performance.

Embodiments of the present disclosure provides a method for forming sacrificial gate structures to prevent lateral over etching near the dielectric fins and improve yield. The method is described in operations 116, 118, 120, 122 below. Particularly, the gate pattern may be transferred from the mask layer 242 to the sacrificial gate electrode layer 238 using a bulk etching operation described in operation 116 and a cyclic fine etching described in operations 118, 120, and 122. It should be noted that operations 116, 118, 120, 122 may be performed continuously in the same processing tool even though the method is described in separated operations 116, 118, 120, 122 for clarity.

Figure 9B:
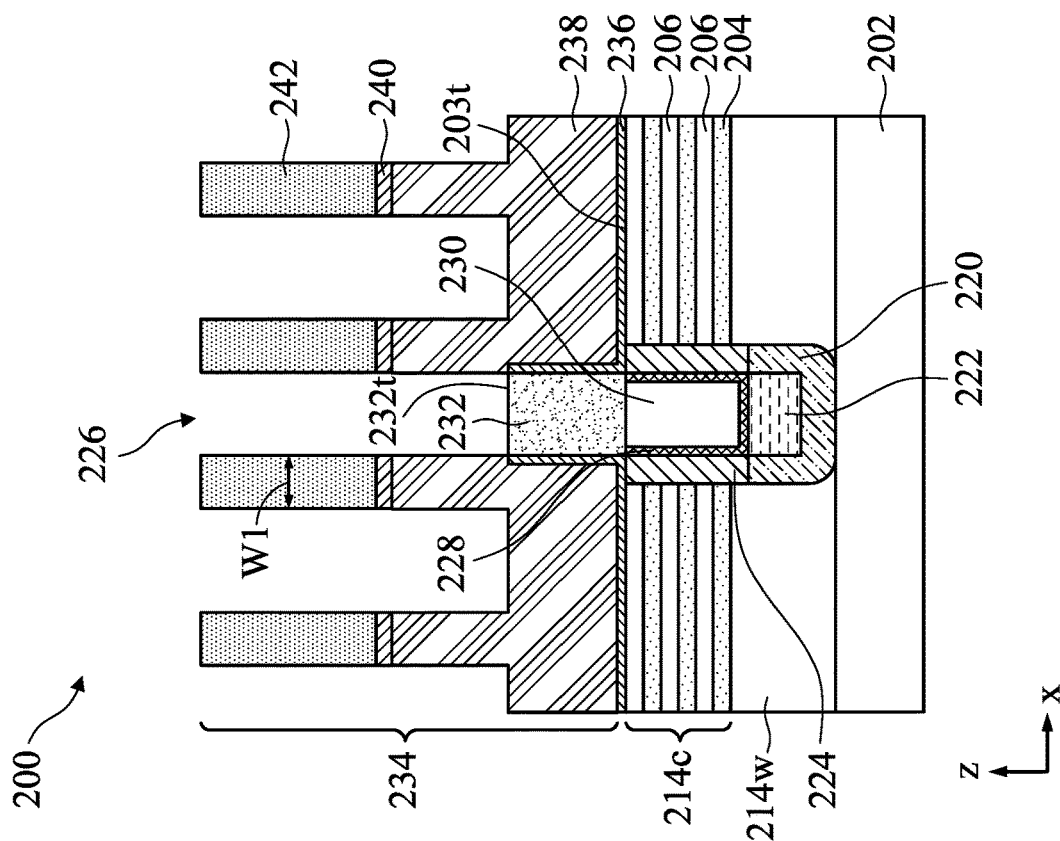
Figure 9A:
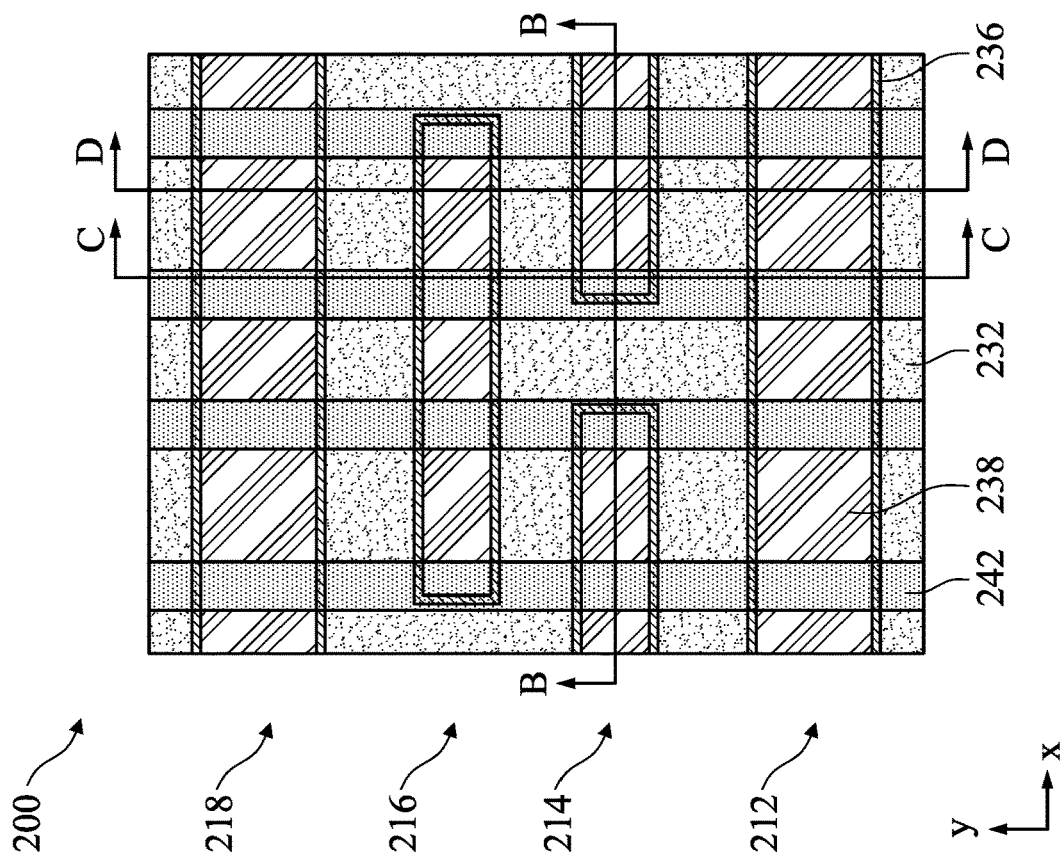
Figure 9C:
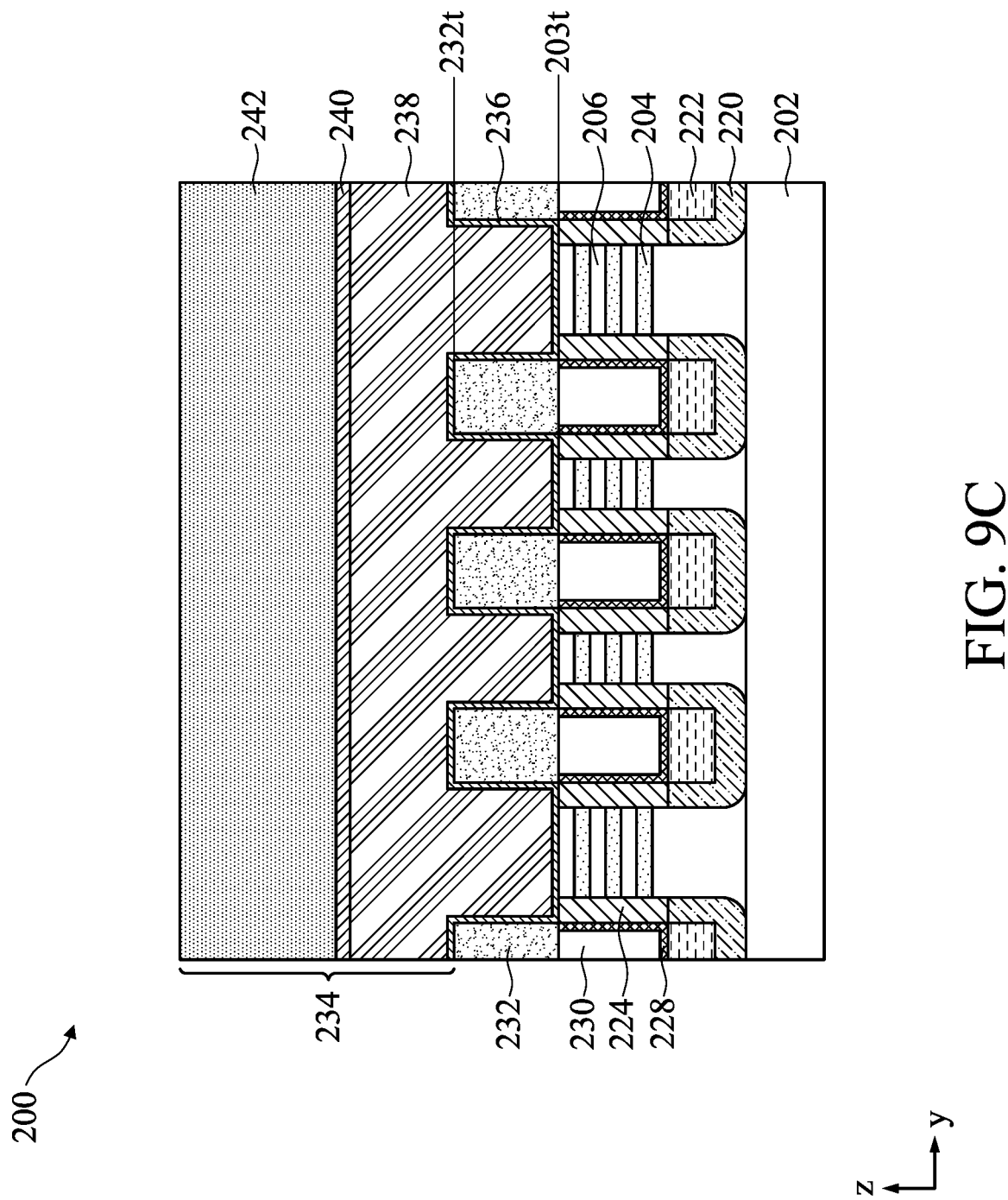
Figure 9D:
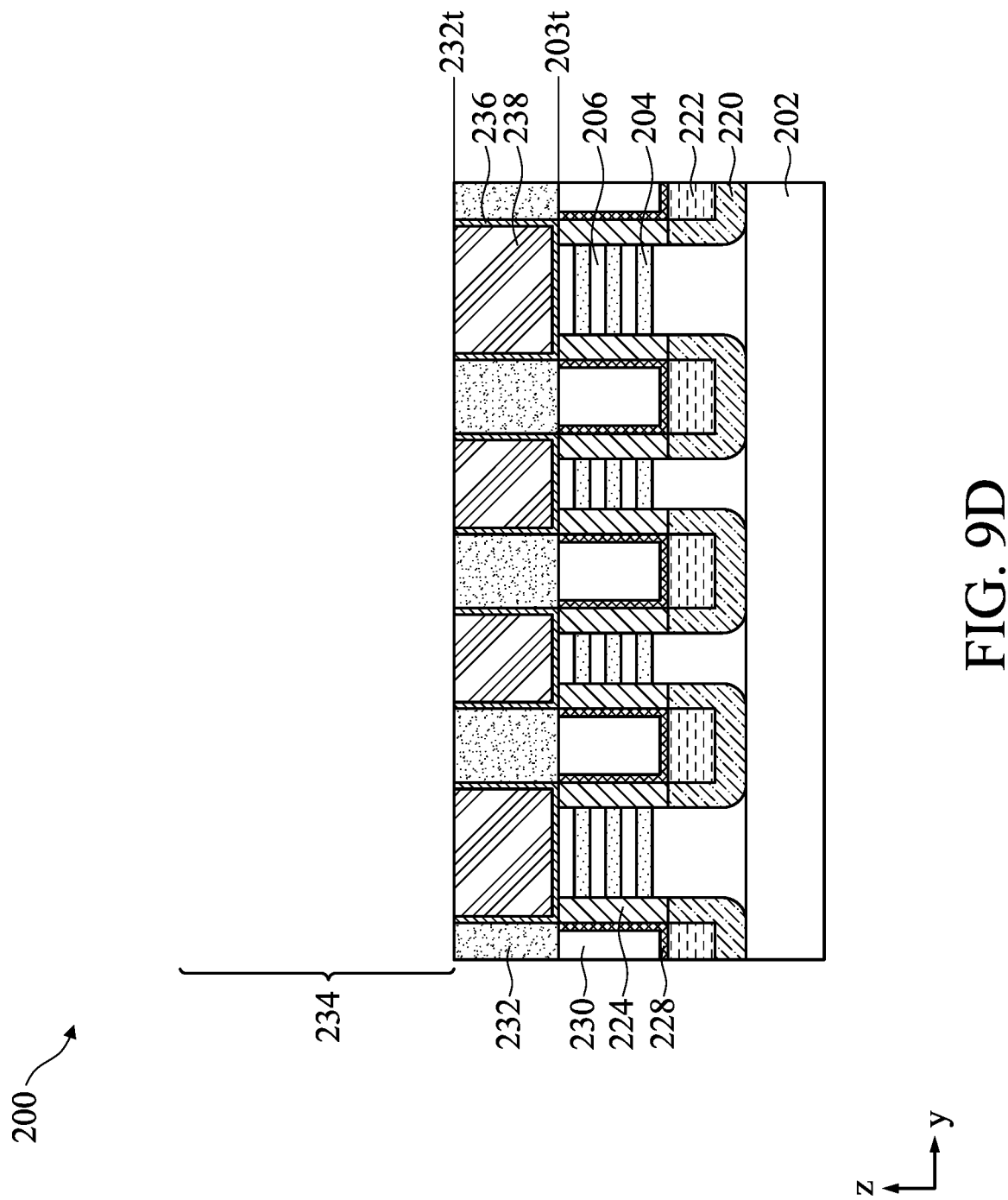

In operation 116, a bulk etch process is performed to etch the sacrificial gate electrode layer 238 using the gate mandrel 242g as a mask, as shown in FIGS. 9A-9D. FIG. 9A is a schematic top view of the semiconductor device 200. FIG. 9B is a schematic sectional view of the semiconductor device 200 along the line B-B on FIG. 9A. FIG. 9C is a schematic sectional view of the semiconductor device 200 along the line C-C on FIG. 9A. FIG. 9D is a schematic sectional view of the semiconductor device 200 along the line D-D on FIG. 9A. In some embodiments, the bulk etch process is performed to expose a top surface 232t of the high-k features 232 or to remove the sacrificial gate electrode layer 238 above the top surface 232t of the high-k dielectric features 232.

In some embodiments, the bulk etch process may be performed by a plasma etching process using an etching gas. In some embodiments, the etching gas may include $Cl_2$, HBr, $CH_2F_2$, $CHF_3$, $CF_4$, $CHClF_2$, or a combination thereof. In some embodiments, a carrier gas or dilute gas may be used with the etching gas. In some embodiments, the carrier gas or dilute gas may include helium, argon, nitrogen, or a combination thereof. In some embodiments, the flow of the etching gas and carrier gas may be in a range between about 20 sccm and about 3000 sccm. In some embodiments, the bulk etch process may be performed at a pressure in a range between about 1 mtorr to about 800 mtorr. The plasma power may be in a range between about 10 W and about 4000 W. In some embodiments, the bulk etch may be performed at an etch rate in a range between 200 angstroms per minute and 2000 angstroms per minute.

Figure 10B:
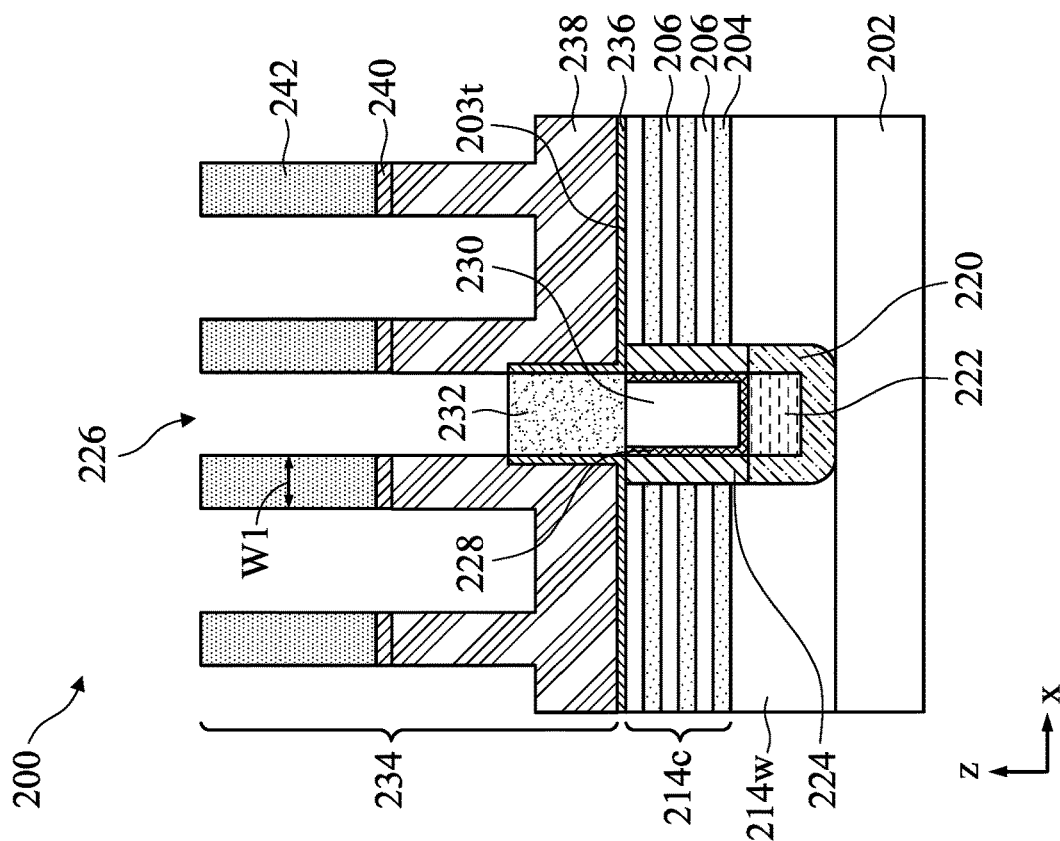
Figure 10A:
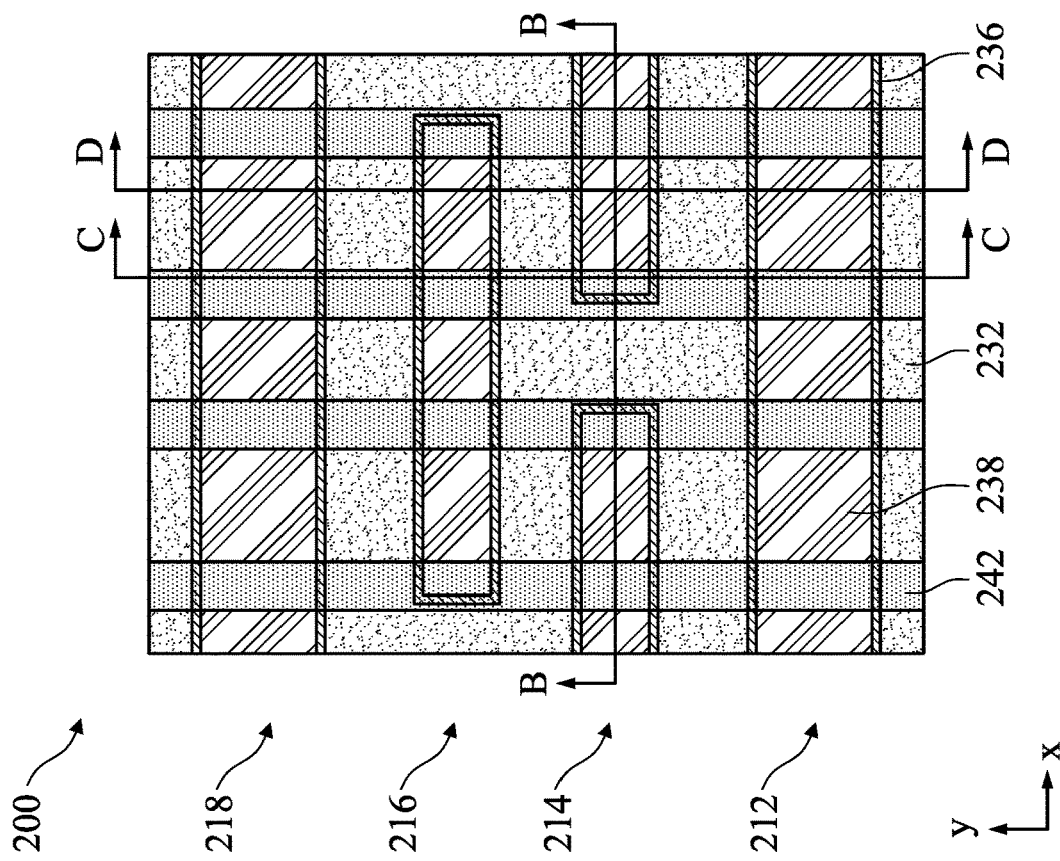
Figure 10C:
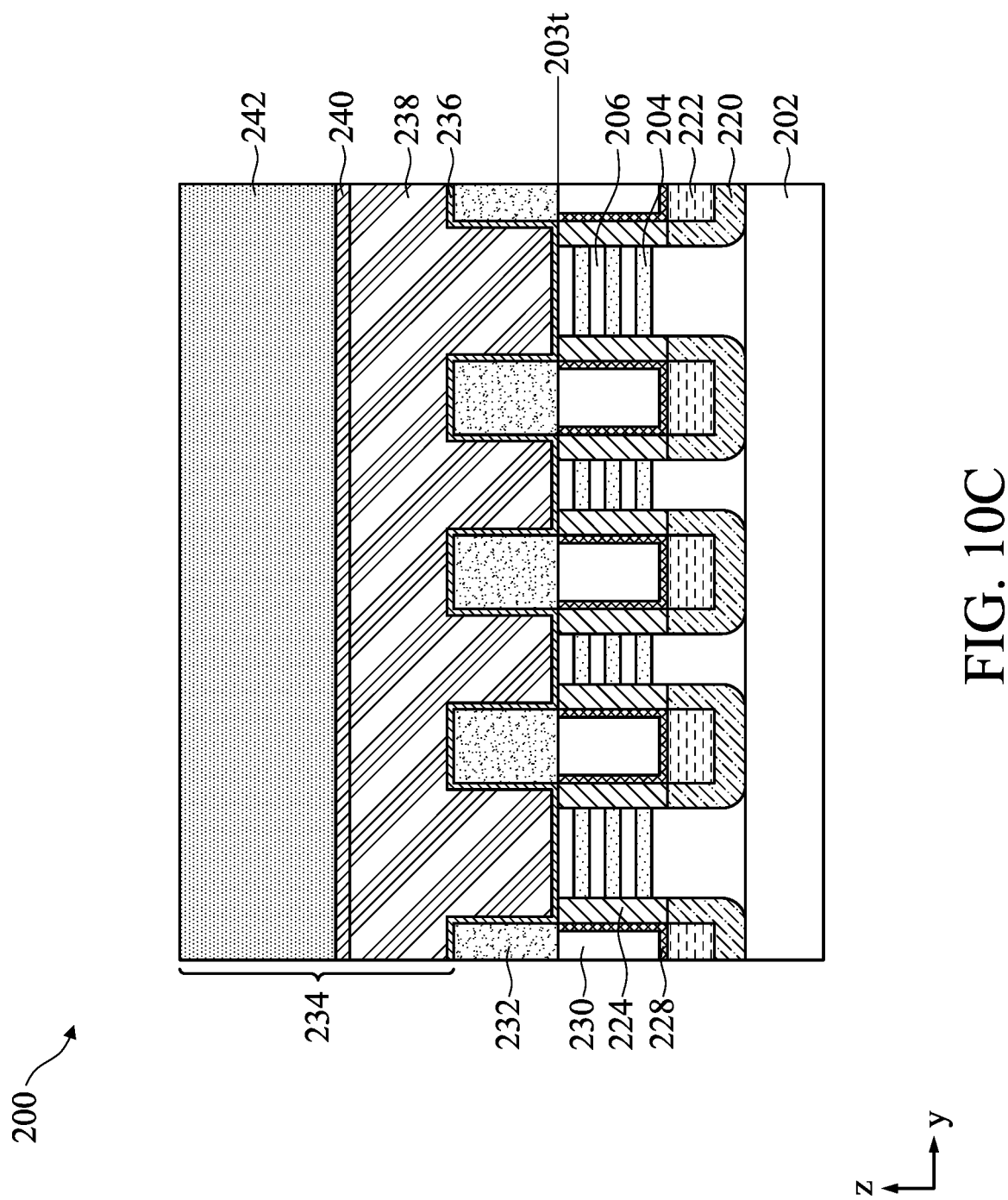
Figure 10D:
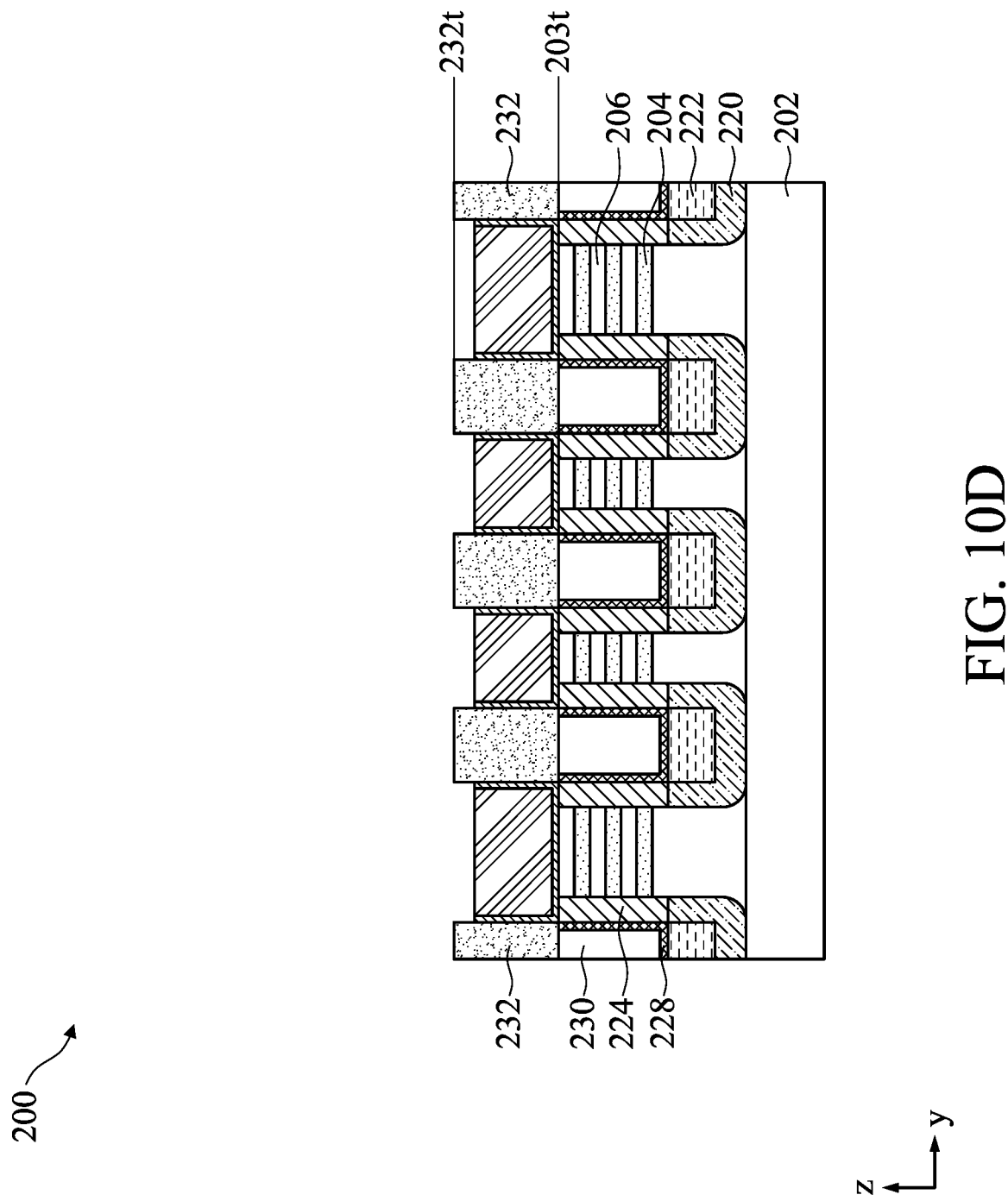
Figure 10E:
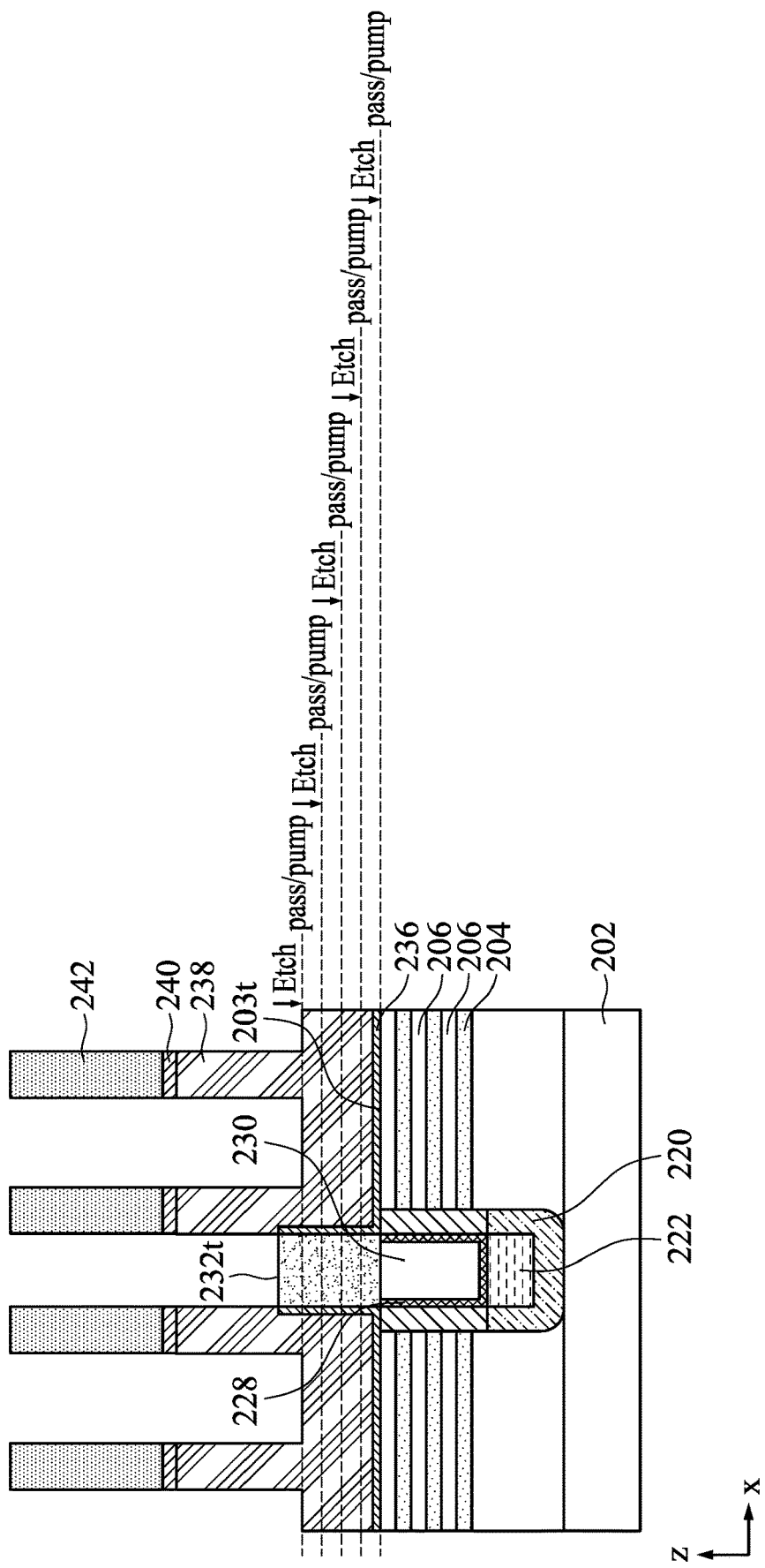
Figure 10F:
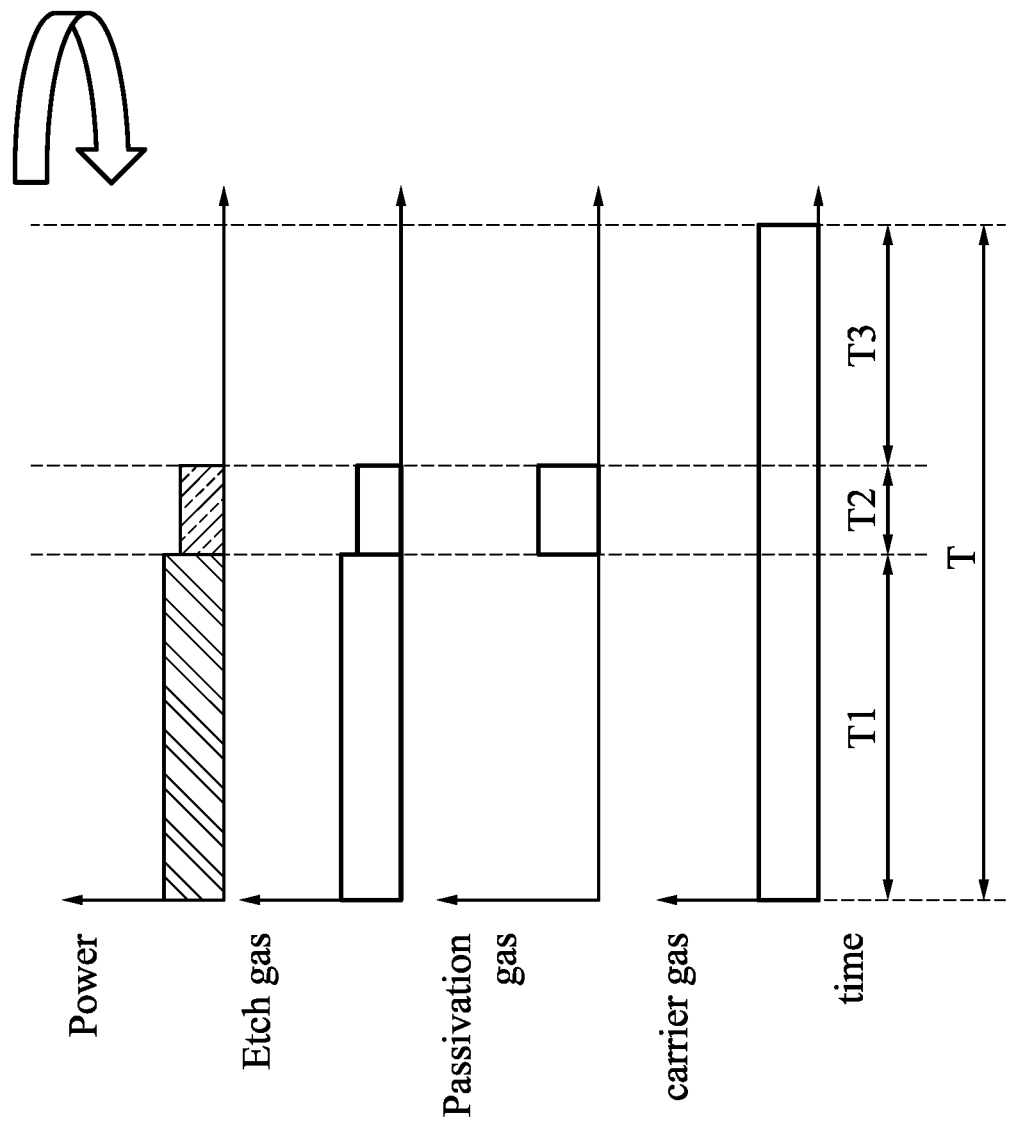

After the bulk etch in operation 116, a cyclic fine etch process as described in operations 118, 120, 122 is then performed to remove sacrificial gate electrode layer 238 between the top surface 232t of the high-k dielectric features 232 and the top surface 203t of the semiconductor stack 203. FIGS. 10A-10D schematically illustrate the semiconductor device 200 in an interim stage of the cyclic fine etch process. FIG. 10A is a schematic top view of the semiconductor device 200. Figure is a schematic sectional view of the semiconductor device 200 along the line B-B on FIG. 10A. FIG. 10C is a schematic sectional view of the semiconductor device 200 along the line C-C on FIG. 10A. FIG. 10D is a schematic sectional view of the semiconductor device 200 along the line D-D on FIG. 10A. FIG. 10E is a schematic sectional view of the semiconductor device 200 along the line B-B on FIG. 10A showing stepped progression of the cyclic fine etch process. FIG. 10F schematically illustrates gas and power duty cycle during one period of the cyclic fine etch process.

In some embodiments, each cycle in the cyclic fine etch includes three process steps, an etching process to be described in operation 118, a passivation process to be described in operation 120, and a pumping out process to be described in operation 122. Each cycle may be performed in a time period T in a range between about 30 seconds to about 60 seconds.

In operation 118, an etching process is performed to remove a layer of material from exposed surface. The etching process may be performed for a time period T1. In some embodiments, the time period T1 may be in a range between 20 seconds and 40 seconds. In some embodiments, the time period T1 may be in a range between about 40% and 60% of the cycle period T. In some embodiments, the etching process may be a plasma etch using a processing chemistry similar to the bulk etch in operation 116. For example, the etching process is performed using etching gas comprising $Cl_2$, HBr, $CH_2F_2$, $CHF_3$, $CF_4$, $CHClF_2$, or a combination thereof. A carrier gas or dilute gas may be used with the etching gas. In some embodiments, the carrier gas or dilute gas may include helium, argon, nitrogen, or a combination thereof. In some embodiments, the flow of the etching gas and carrier gas may be in a range between about 20 sccm and about 3000 sccm. In some embodiments, the etching process may be performed at a pressure in a range between about 1 mtorr to about 800 mtorr. The plasma power may be in a range between about 10 W and about 4000 W. In some embodiments, the etching process may be performed at an etch rate in a range 50 angstroms per minute and 200 angstroms per minute. In some embodiments, the plasma power level in this etching process is between about 40% and about 60% of the plasma power level in operation 116. In some embodiments, the flow rate of etch agent in this etching process is between about 40% and about 60% of the flow rate of etch agent in operation 116. In some embodiments, the pressure in this etching process is between about 60% and about 80% of the pressure in operation 116.

In operation 120, a passivation process is performed for a time period T2. In some embodiments, the time period T2 may be in a range between 2 seconds and 6 seconds. In some embodiments, the time period T2 may be in a range between about 2% and 10% of the cycle period T. During passivation, a passivation film may form on exposed material, such as polycrystalline silicon in the sacrificial gate electrode layer 238. The passivation film protects the material underneath from etching chemistry in the etching process of the subsequent cycle, therefore, preventing over etch of the sacrificial gate electrode layer 238 near the high-k dielectric features 232. In some embodiments, the passivation process may be a plasma process using a passivation gas comprising $N_2$, $O_2$, $CO_2$, $CH_4$, $SO_2$, or a combination thereof. A carrier gas or dilute gas may be used with the etching gas. In some embodiments, the carrier gas or dilute gas may include helium, argon, nitrogen, or a combination thereof. In some embodiments, the flow of the passivation gas and carrier gas may be in a range between about 20 sccm and about 3000 sccm. In some embodiments, the passivation process may be performed at a pressure in a range between about 1 mtorr to about 800 mtorr. The plasma power may be in a range between about 10 W and about 4000 W. In some embodiments, the power level during the passivation process is different from the power level during the etch step in operation 118. For example, a ratio of the power level over the power level during the etch step in operation 118 is in a range between 0.8 and 1.2.

In operation 122, a pumping out process is performed to remove reactant gas and byproducts. The pumping out process may be performed for a time period T3. In some embodiments, the time period T3 may be in a range between 24 seconds and 36 seconds. In some embodiments, the time period T3 may be in a range between about 40% and 60% of the cycle period T. In some embodiments, the time period T2 is in a range between about 5% and about 20% of a summation of the time period T2 and the time period T3. During pumping out process, the power is turned off. In some embodiments, a carrier gas is continuously flowing with the passivation gas and the etching gas turned off. In some embodiments, the carrier gas or dilute gas may include helium, argon, nitrogen, or a combination thereof. In some embodiments, the flow of the carrier gas may be in a range between about 20 sccm and about 3000 sccm. In some embodiments, the passivation process may be performed at a pressure in a range between about 1 mtorr to about 800 mtorr.

FIG. 1 OF includes an example duty cycle of the cyclic fine etch according to the present disclosure. FIG. 10E schematically illustrates the cyclic fine etch with five etch, passivation and pumping cycles. More or less cycles may be used according to etch thickness and aspect ratio.

Figure 11B:
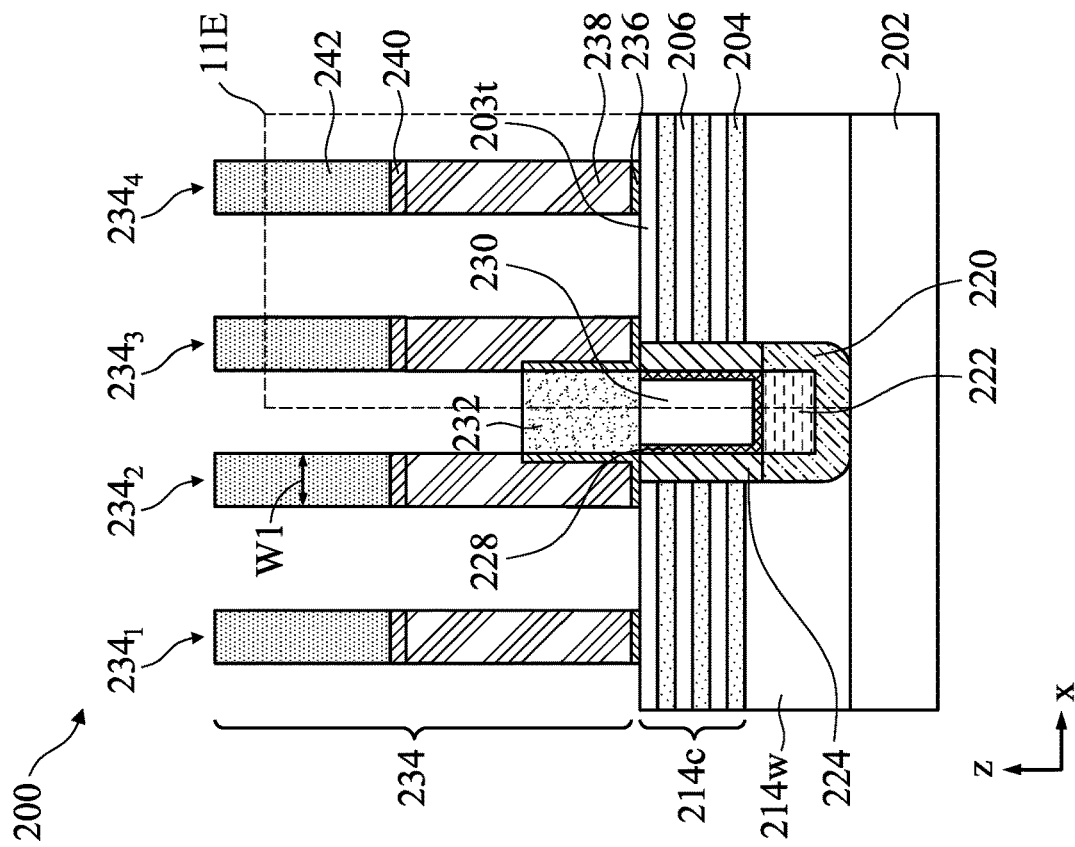
Figure 11A:
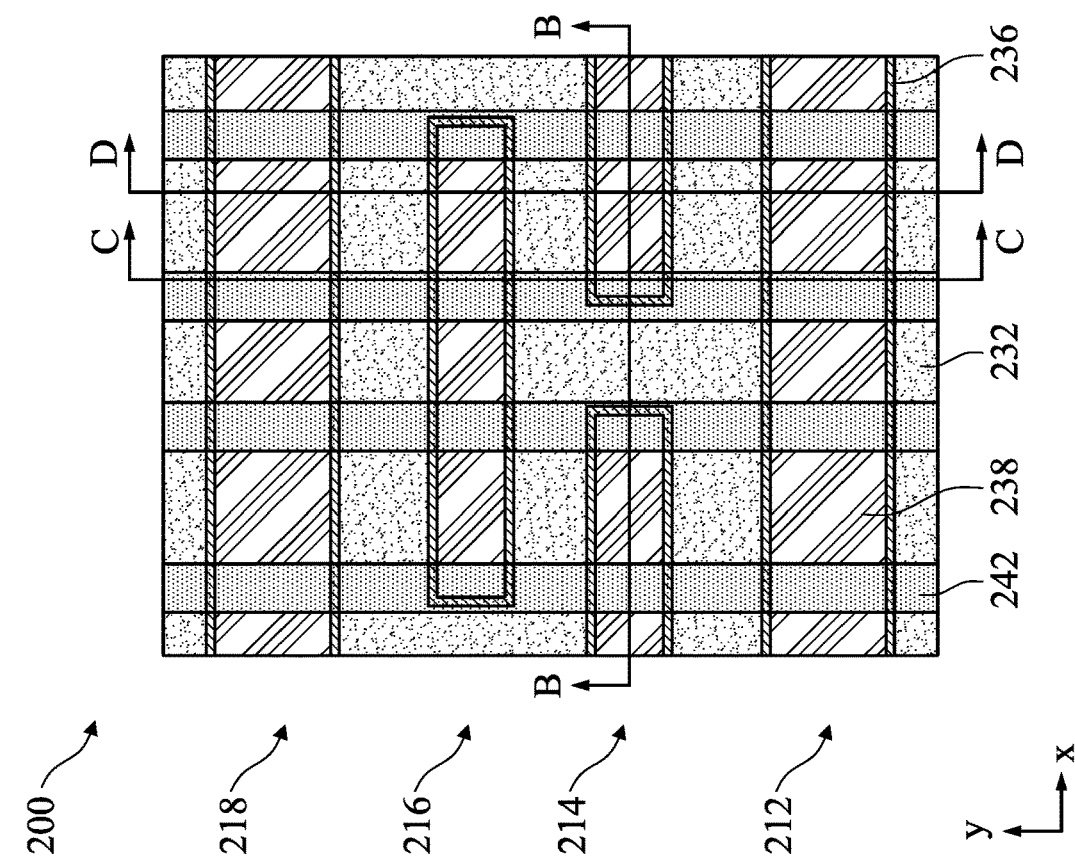
Figure 11C:
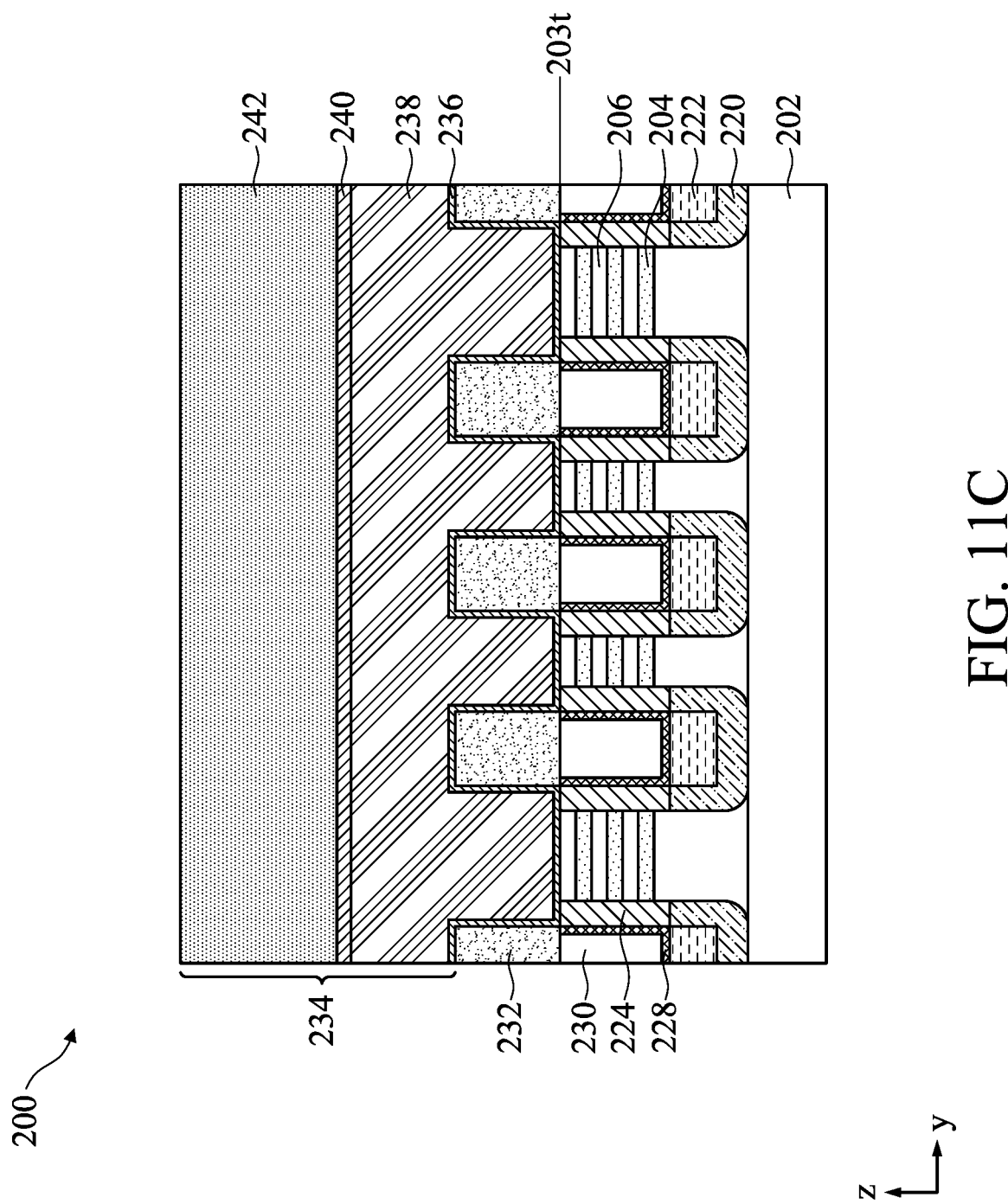
Figure 11D:
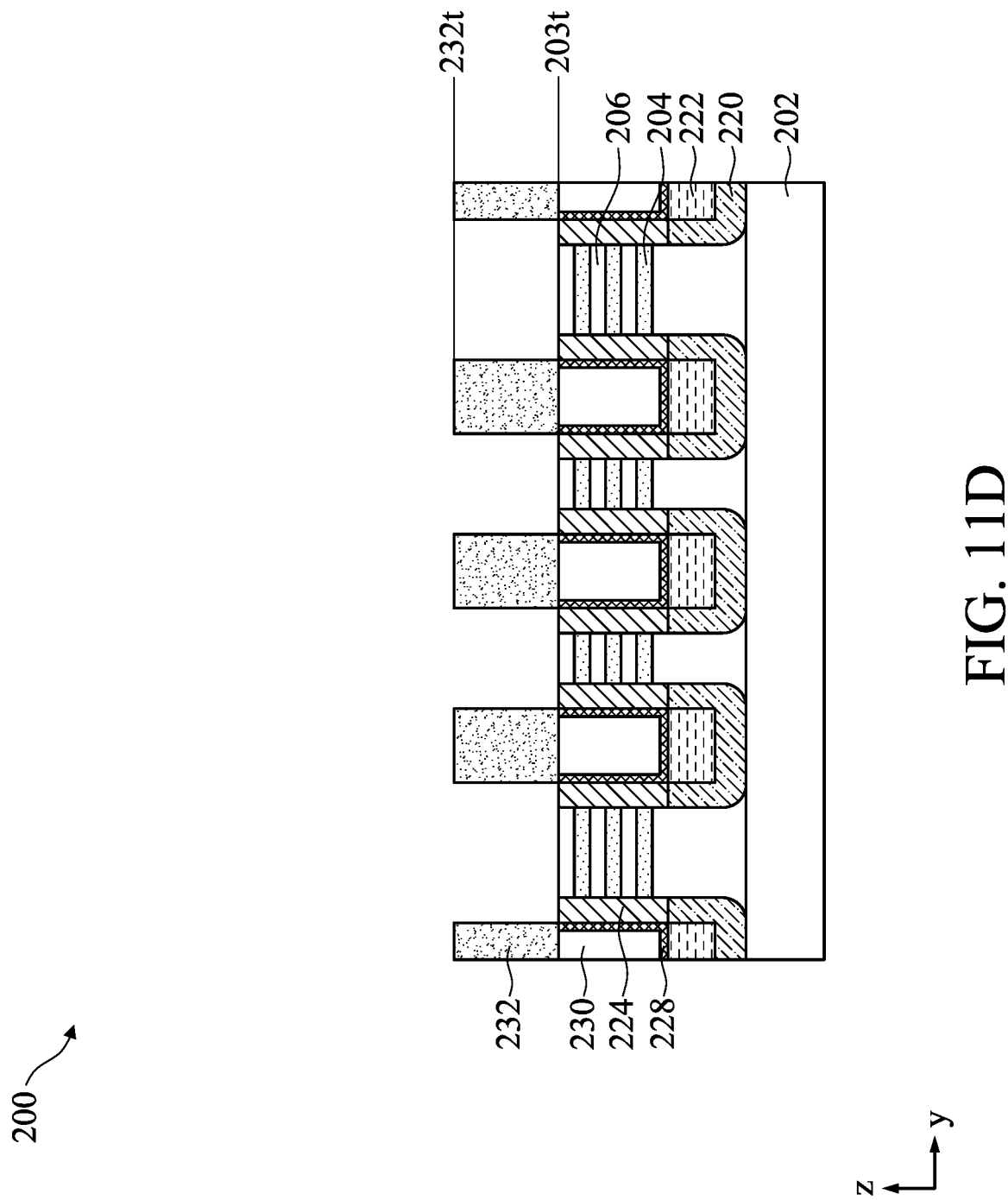
Figure 11E:
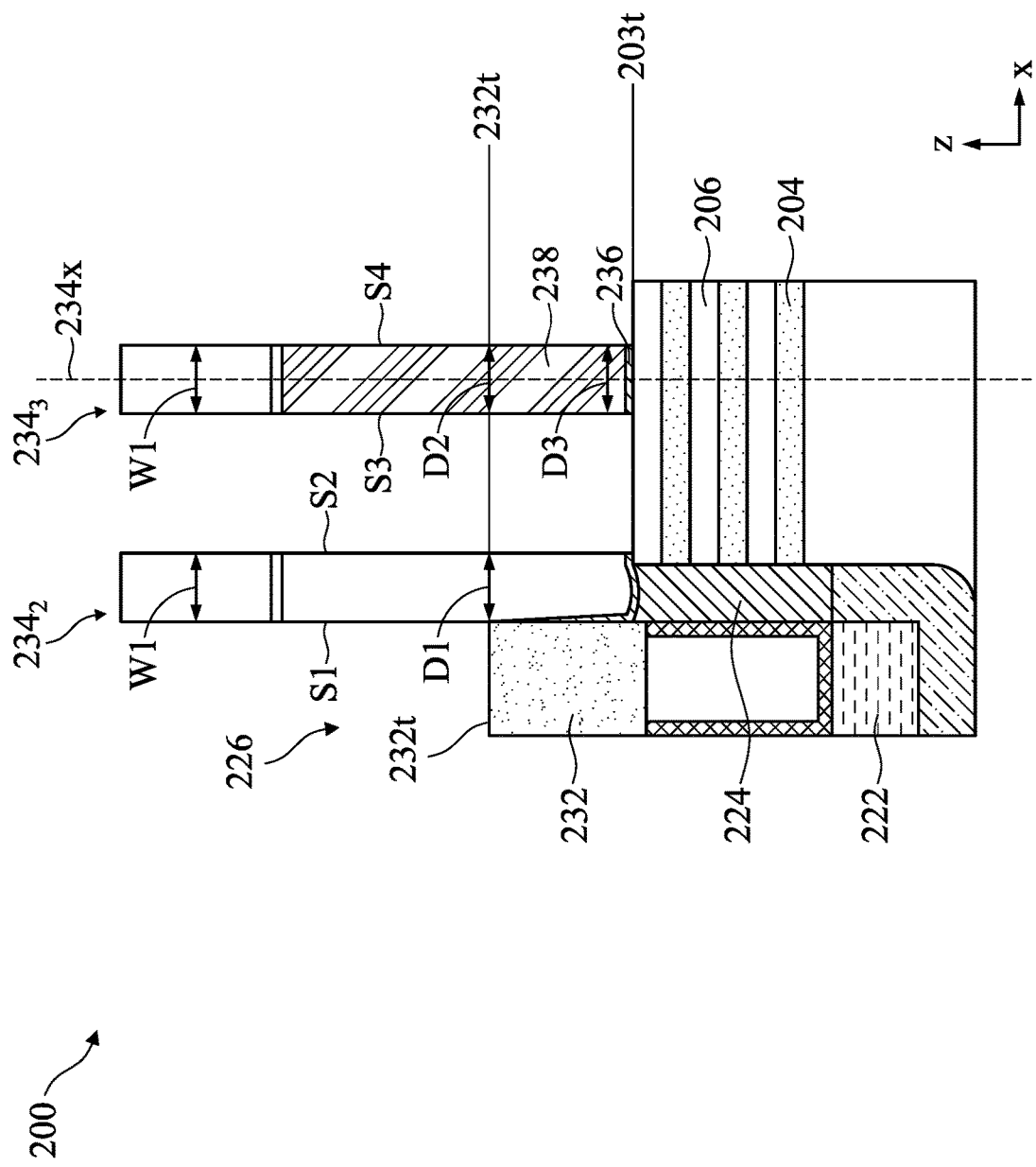

The cyclic fine etch is performed in cycles until complete the formation of sacrificial gate structures $234_1$, $234_2$, $234_3$, $234_4$ as shown FIGS. 11A-11E. FIG. 11A is a schematic top view of the semiconductor device 200. FIG. 11B is a schematic sectional view of the semiconductor device 200 along the line B-B on FIG. 11A. FIG. 11C is a schematic sectional view of the semiconductor device 200 along the line C-C on FIG. 11A. FIG. 11D is a schematic sectional view of the semiconductor device 200 along the line D-D on FIG. 11A. FIG. 11E is a schematic enlarged partial view of FIG. 11B showing dimension of the sacrificial gate structures $234_2$, $234_3$. In the area shown in FIG. 11E, the sacrificial gate structure $234_2$ has one side S1 flushed against the dielectric fin 226 and another side S2 facing a side S4 of the sacrificial gate structures $234_3$ while both sides S3 and S4 of the sacrificial gate structures $234_3$ are not flushed against any dielectric fins 226. As noted in FIG. 11E, the sacrificial gate structures $234_2$ has a width D1 and the sacrificial gate structures $234_3$ has a width D2 at the level of the top surface 232t of the high-k dielectric feature 232. Because the cyclic fine etching described above has prevented over etching on the side S1 of the sacrificial gate structures $234_2$ near the top surface 232t, the width D1 is substantially equal to the width D2. In some embodiments, the difference between width D1 and width D2 is less than about 5% of the width D2. In some embodiments, a ratio of the width D1 over the width D2 is in a range between 0.9 and 1.1. The sacrificial gate structures $234_3$ has a width D3 at a level between the top surface 232t and the top surface 203t. Because the cyclic fine etching described above has prevented under etching of the sacrificial gate structures $234_3$, the width D3 is substantially equal to the width D2. In some embodiments, the difference between width D3 and width D2 is less than about 5% of the width D2. In some embodiments, a ratio of the width D3 over the width D2 is in a range between 0.9 and 1.0. In some embodiments, the widths D1, D2, D3 are in a range between 14 nm and 16 nm. Because there is no under etch of the sacrificial gate structures $234_3$, the sides S3 and S4 of the sacrificial gate structures $234_3$ are substantially parallel to each other.

Figure 12B:
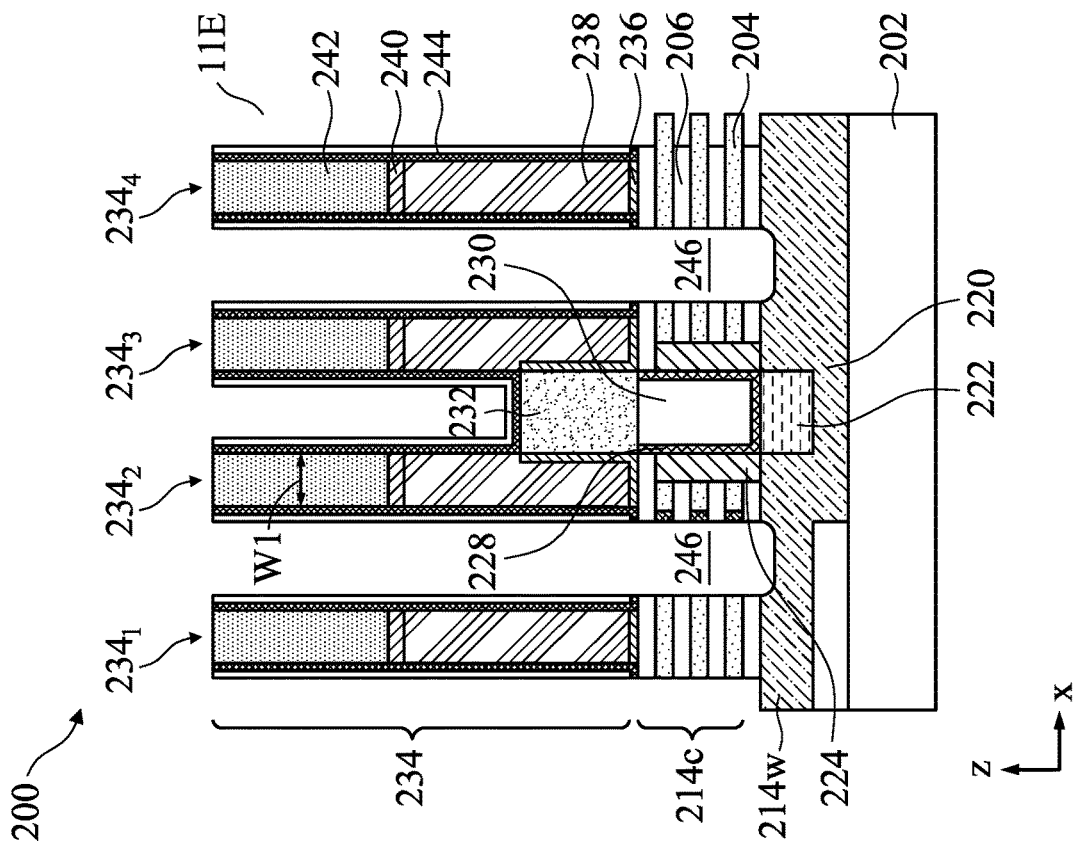
Figure 12A:
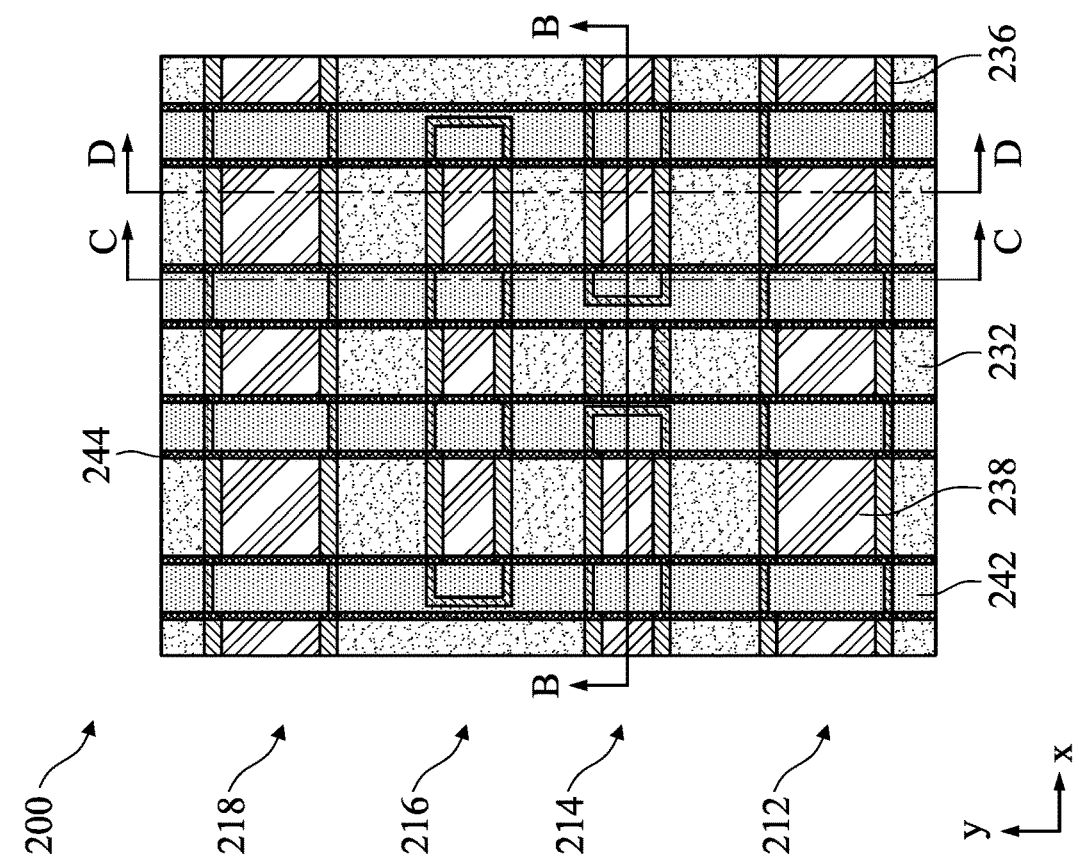
Figure 12C:
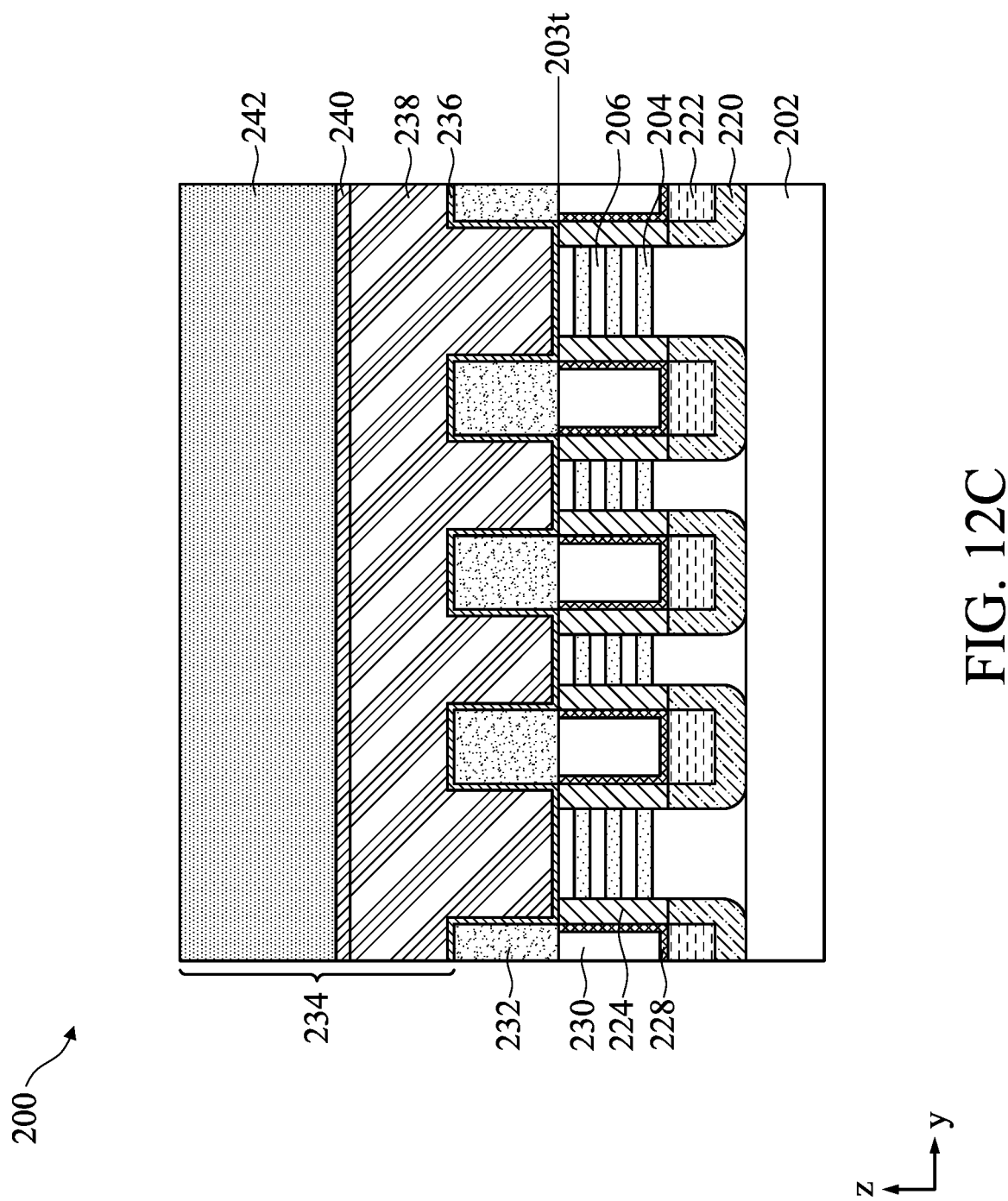
Figure 12D:
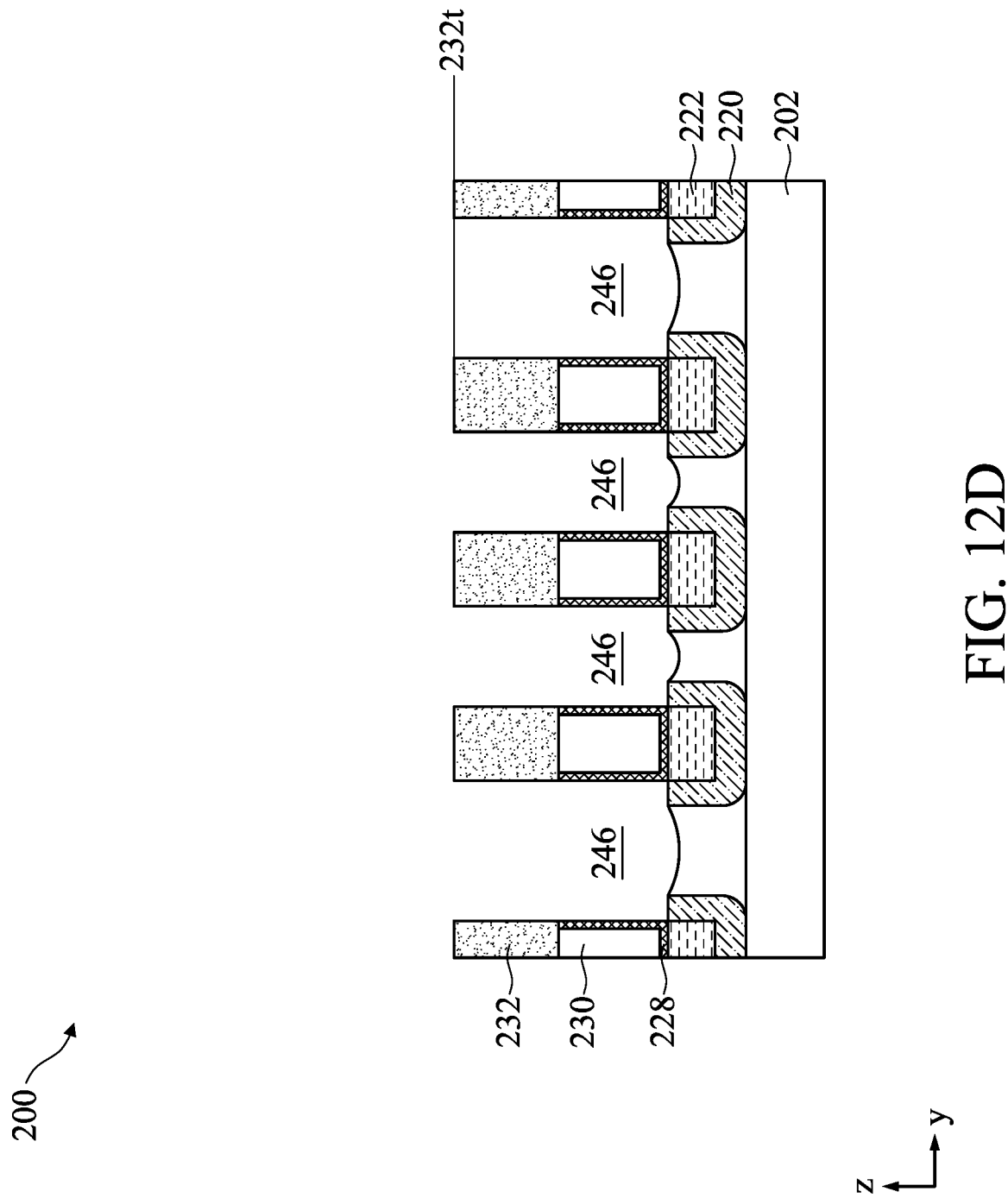

In operation 124, sidewall spacers 244 are formed on sidewalls of each sacrificial gate structure 234, as shown in FIGS. 12A-12D. FIG. 12A is a schematic top view of the semiconductor device 200. FIG. 12B is a schematic sectional view of the semiconductor device 200 along the line B-B on FIG. 12A. FIG. 12C is a schematic sectional view of the semiconductor device 200 along the line C-C on FIG. 12A. FIG. 12D is a schematic sectional view of the semiconductor device 200 along the line D-D on FIG. 12A. After the sacrificial gate structure 234 is formed, the sidewall spacers 244 are formed by a blanket deposition of an insulating material followed by anisotropic etch to remove insulating material from horizontal surfaces. The sidewall spacers 244 may include one or more layers of dielectric materials. In some embodiments, the sidewall spacers 244 may have a thickness in a range between about 4 nm and about 7 nm. In some embodiments, the insulating material of the sidewall spacers 244 is a silicon nitride-based material, such as SiN, SiON, SiOCN or SiCN and combinations thereof.

In operation 126, source/drain recesses 246 are formed, as shown in FIG. 12A-12D. The semiconductor fins 212, 214, 216, 218 and the cladding layer 224 not covered by the sacrificial gate stack 234 are etched forming source/drain recesses 246 between the neighboring dielectric fins 226 on either side of the sacrificial gate structure 234. The source/drain recesses 246 extend into the well portions 212w, 214w, 216w, 218w of the semiconductor fins 212, 214, 216, 218.

In operation 128, inner spacers 248 are formed as shown in FIGS. 13A-13D. FIG. 13A is a schematic top view of the semiconductor device 200. FIG. 13B is a schematic sectional view of the semiconductor device 200 along the line B-B on FIG. 13A.

The first semiconductor layers 204 and the cladding layers 224 exposed to the source/drain recesses 246 are first etched to form spacer cavities for the inner spacers 248. The first semiconductor layers 204 and cladding layer 224 are etched horizontally along the X direction to form cavities. In some embodiments, the first semiconductor layers 204 can be selectively etched by using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. In some embodiments, an etching thickness of the first semiconductor layer 204 and the cladding layer 224 is in a range between about 2 nm and about 10 nm along the X direction. The inner spacers 248 are formed in the spacer cavities by conformally deposit and then partially remove an insulating layer. The insulating layer can be formed by ALD or any other suitable method. The subsequent etch process removes most of the insulating layer except inside the cavities, resulting in the inner spacers 248. In some embodiments, the inner spacers 248 may include one of silicon nitride (SiN) and silicon oxide ($SiO_2$), SiONC, or a combination thereof. The inner spacers 248 have a thickness along the x-direction in a range from about 4 nm to about 7 nm.

Figures 14A, 14B:
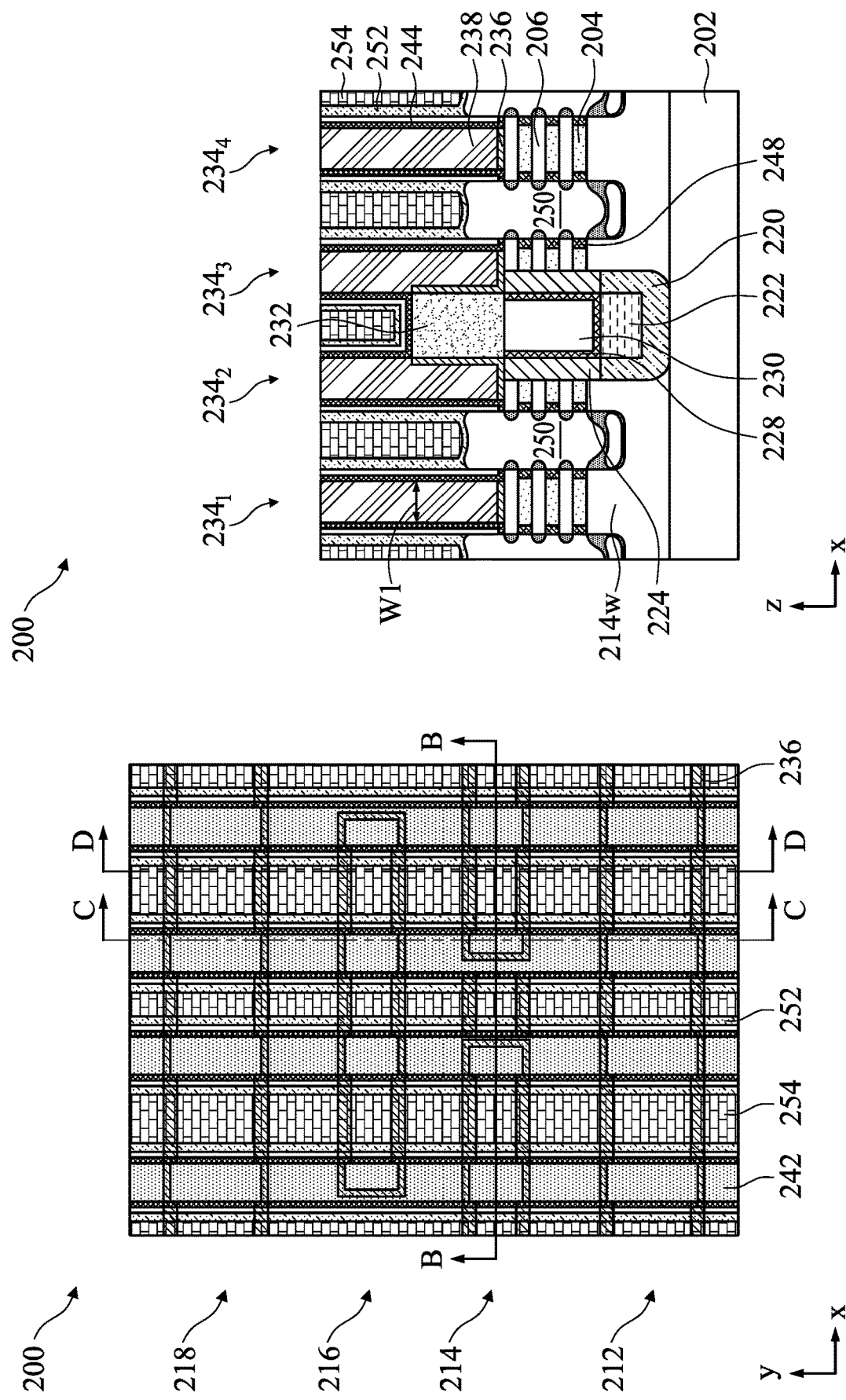
Figure 14C:
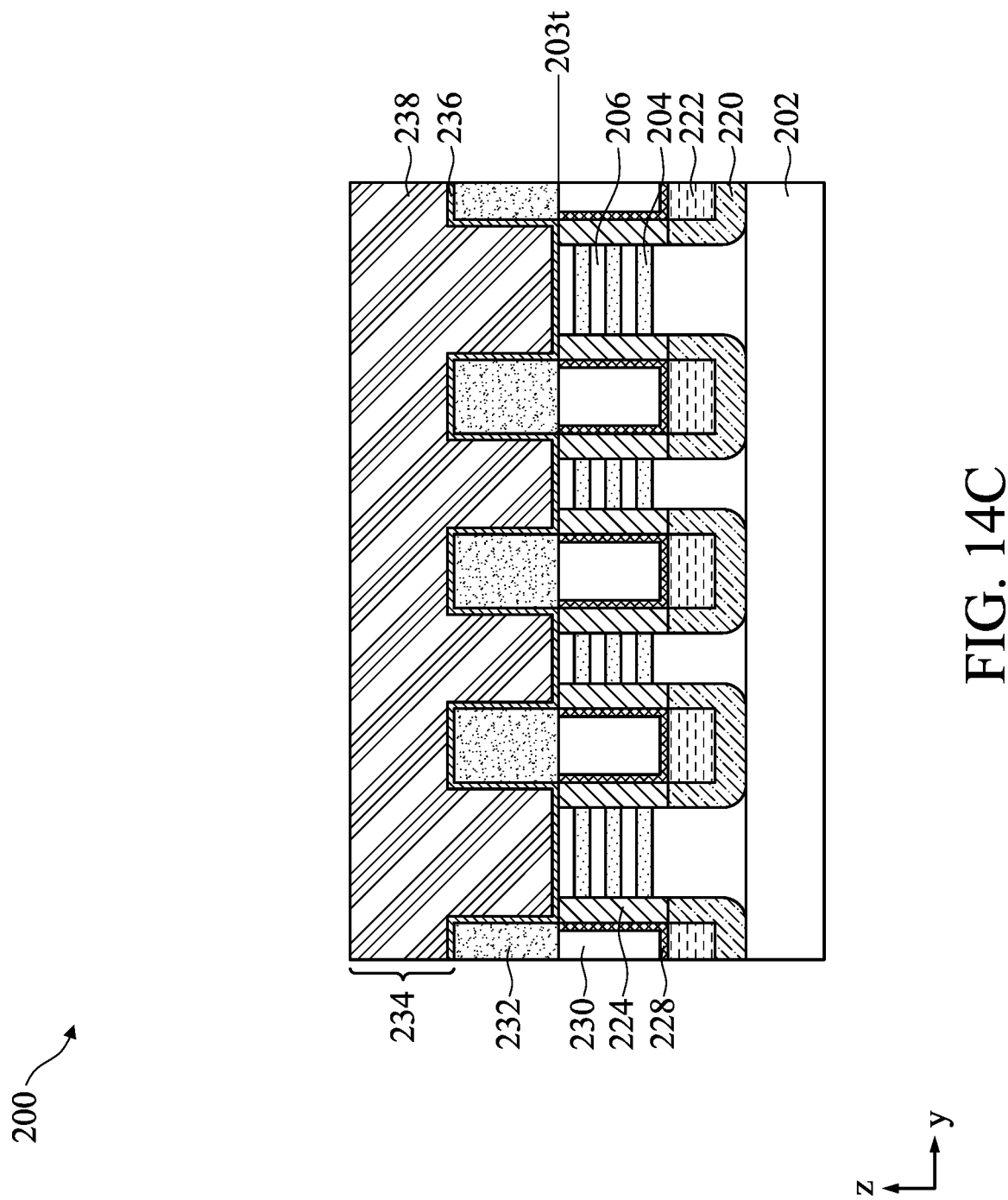
Figure 14D:
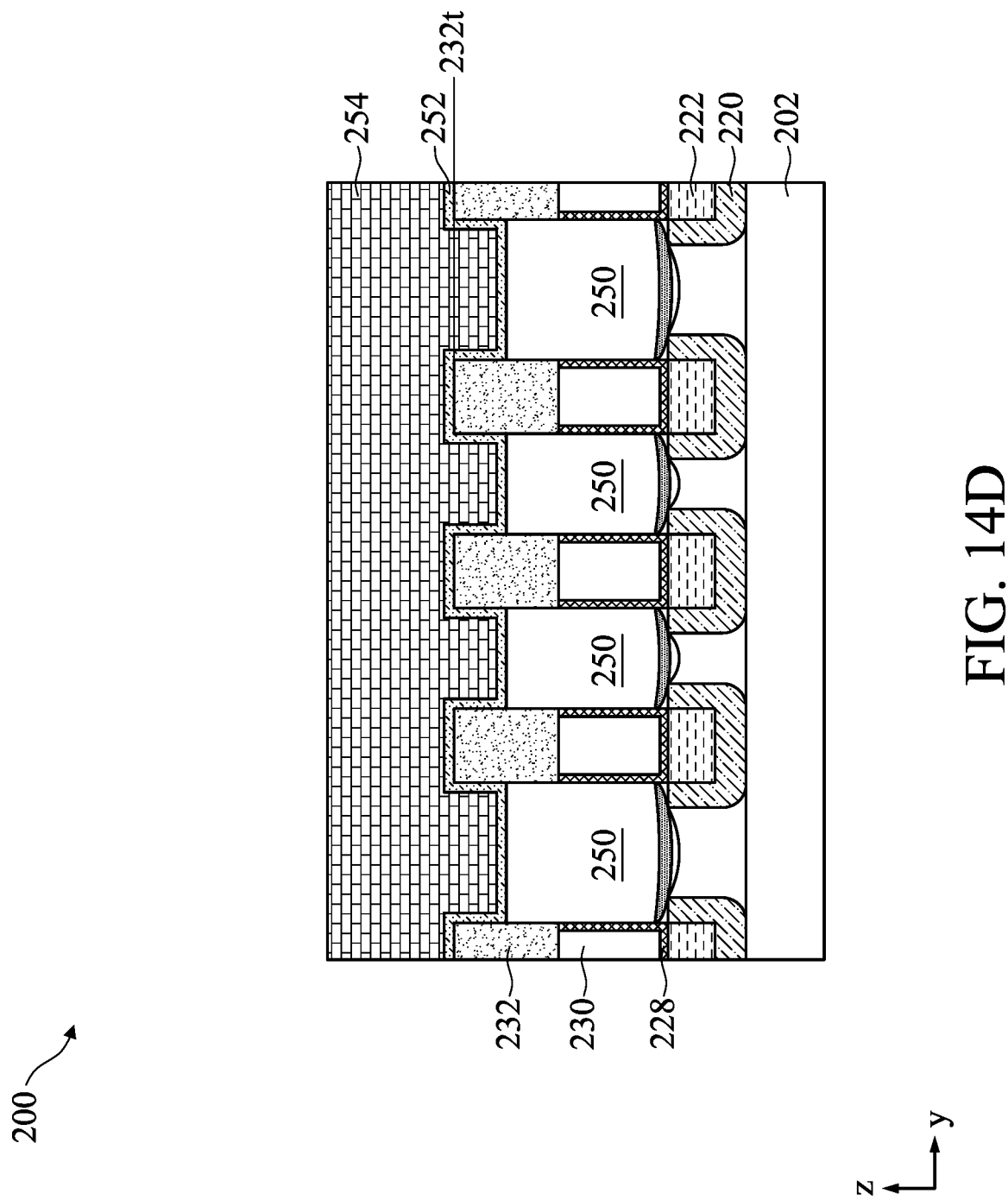

In operation 130, epitaxial source/drain regions 250 are formed in the source/drain recesses 246, as shown in FIGS. 14A-14D. FIG. 14A is a schematic top view of the semiconductor device 200. FIG. 14B is a schematic sectional view of the semiconductor device 200 along the line B-B on FIG. 14A. FIG. 14C is a schematic sectional view of the semiconductor device 200 along the line C-C on FIG. 14A. FIG. 14D is a schematic sectional view of the semiconductor device 200 along the line D-D on FIG. 14A.

For n-type devices, the epitaxial source/drain regions 250 may include one or more layers of Si, SiP, SiC and SiCP. The epitaxial source/drain regions 250 also include n-type dopants, such as phosphorus (P), arsenic (As), etc. In some embodiments, the epitaxial source/drain regions 250 may be a Si layer includes phosphorus dopants. For p-type devices, the epitaxial source/drain regions 250 may include one or more layers of Si, SiGe, Ge with p-type dopants, such as boron (B). In some embodiments, the epitaxial source/drain regions 250 may be SiGeB material, wherein boron is a dopant.

It should be noted that operations 126, 128, and 130 may be performed separately for n-type devices and p-type devices, using suitable masks.

In operation 132, a contact etch stop layer (CESL) 252 and an interlayer dielectric (ILD) layer 254 are formed over the exposed surfaces as shown in FIGS. 14A-14D. The CESL 252 is formed on the epitaxial source/drain regions 250, the sidewall spacers 244, and the high-k dielectric features 232. In some embodiments, the CESL 252 has a thickness in a range between about 4 nm and about 7 nm. The CESL 252 may include $Si_3N_4$, SiON, SiCN or any other suitable material, and may be formed by CVD, PVD, or ALD.

The interlayer dielectric (ILD) layer 254 is formed over the CESL 252. The materials for the ILD layer 254 include compounds comprising Si, O, C, and/or H, such as silicon oxide, SiCOH and SiOC. Organic materials, such as polymers, may be used for the ILD layer 254. The ILD layer 254 protects the epitaxial source/drain regions 250 during the removal of the sacrificial gate stack 234. A planarization operation, such as CMP, is performed to expose the sacrificial gate electrode layer 238 for subsequent removal of the sacrificial gate stack 234. The planarization process removes portions of the ILD layer 254 and the CESL 252, the hard mask layer 242 and the pad layer 240 to expose to the sacrificial gate electrode layer 238.

Figure 15A:
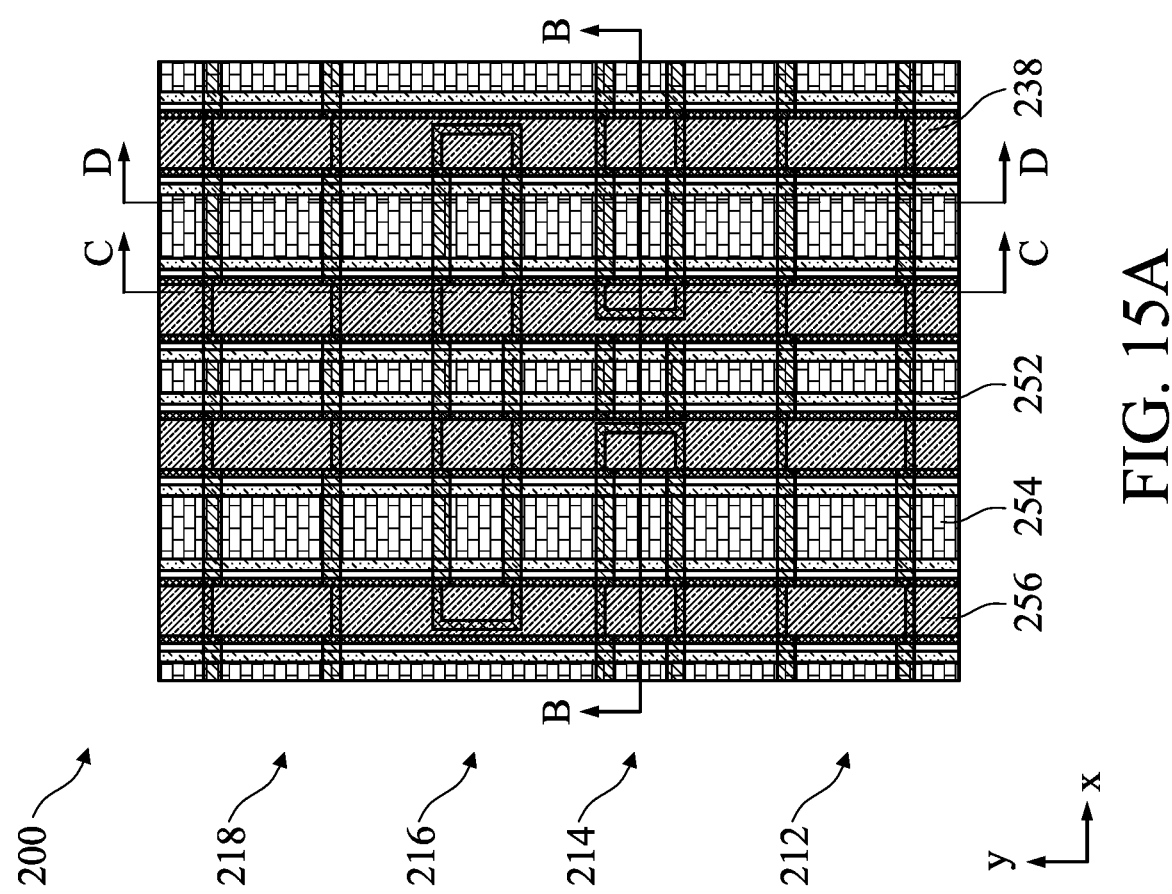
Figure 15B:
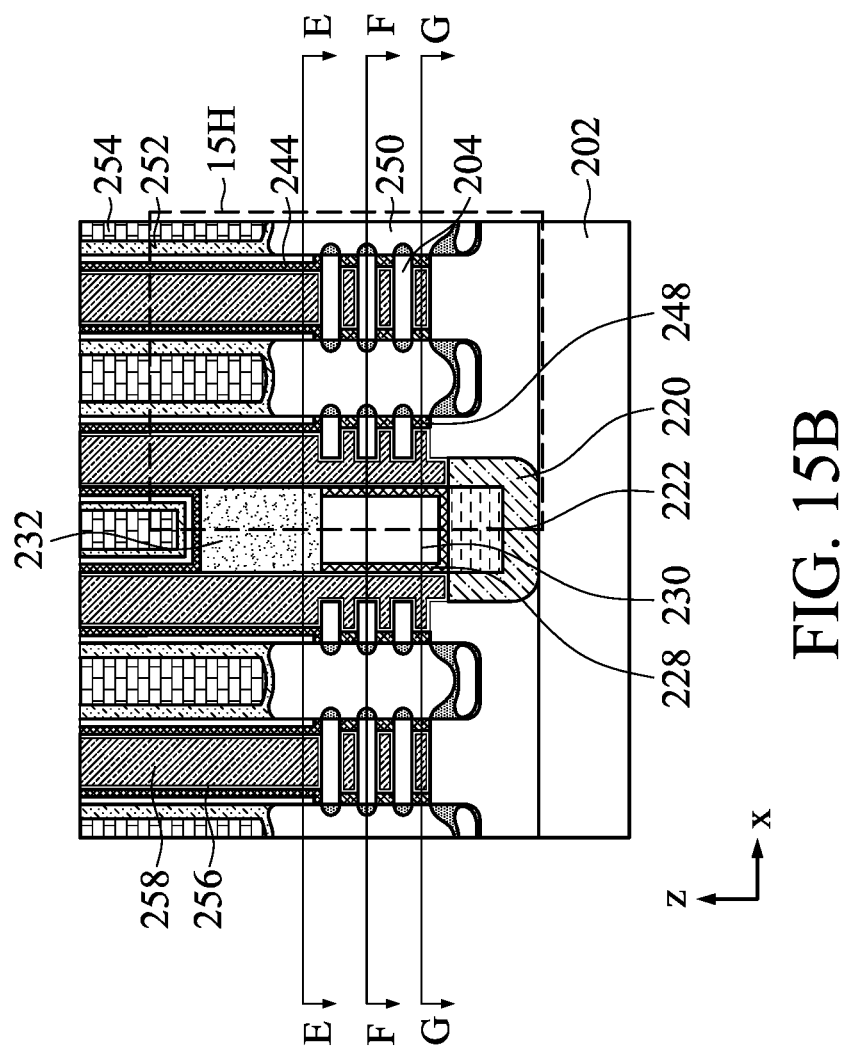
Figure 15C:
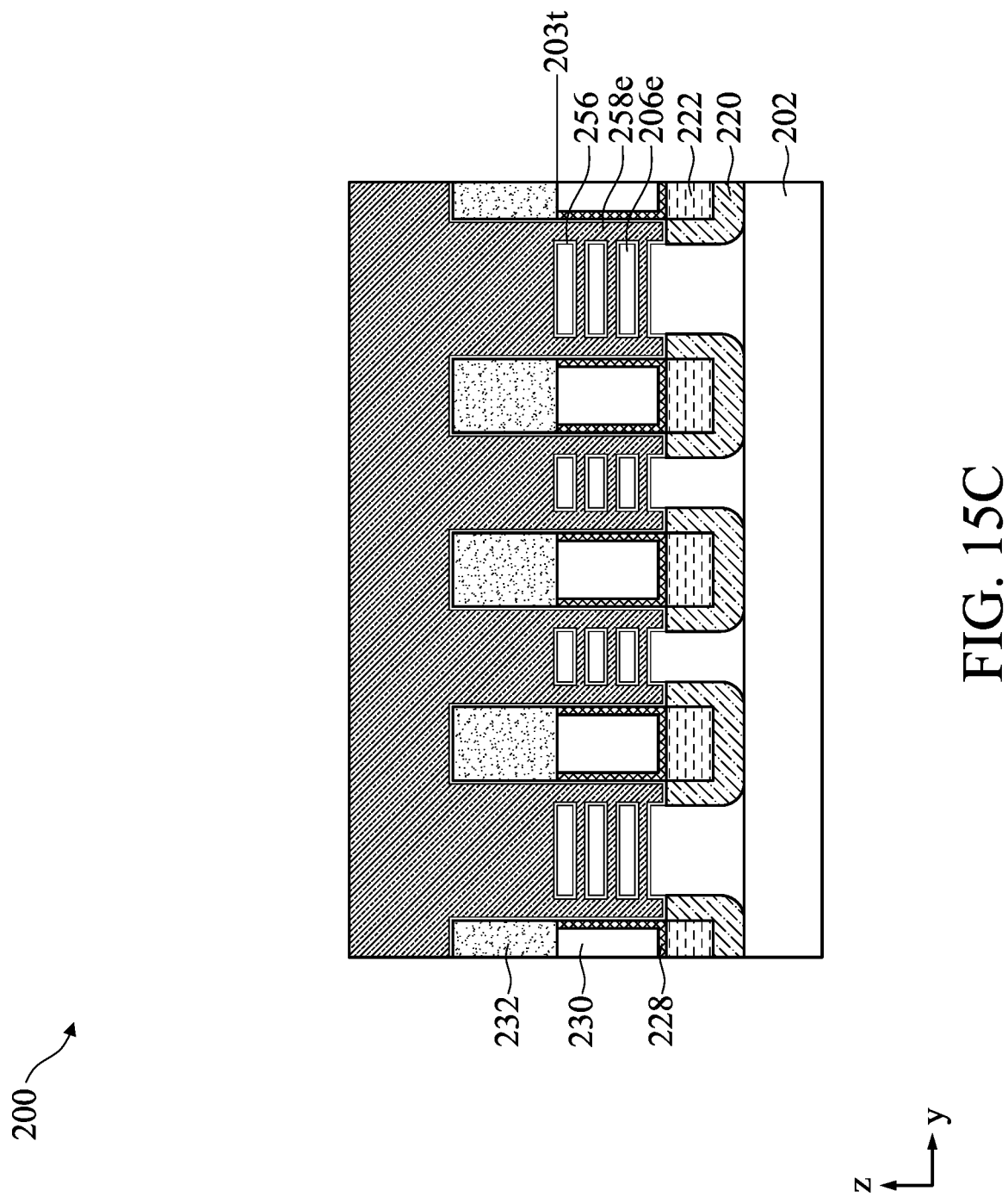
Figure 15D:
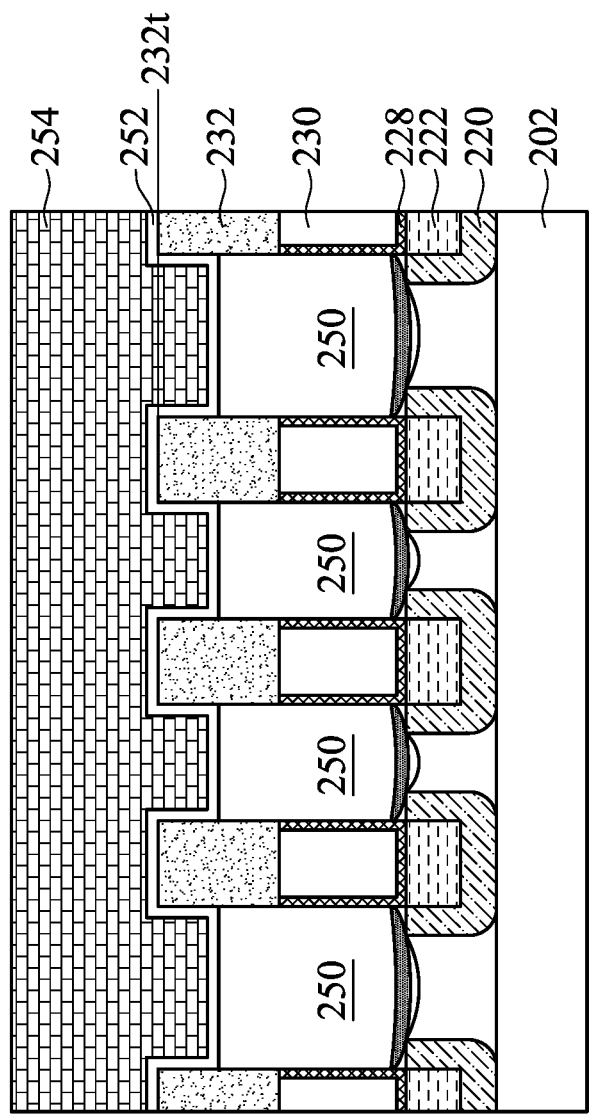
Figure 15E:
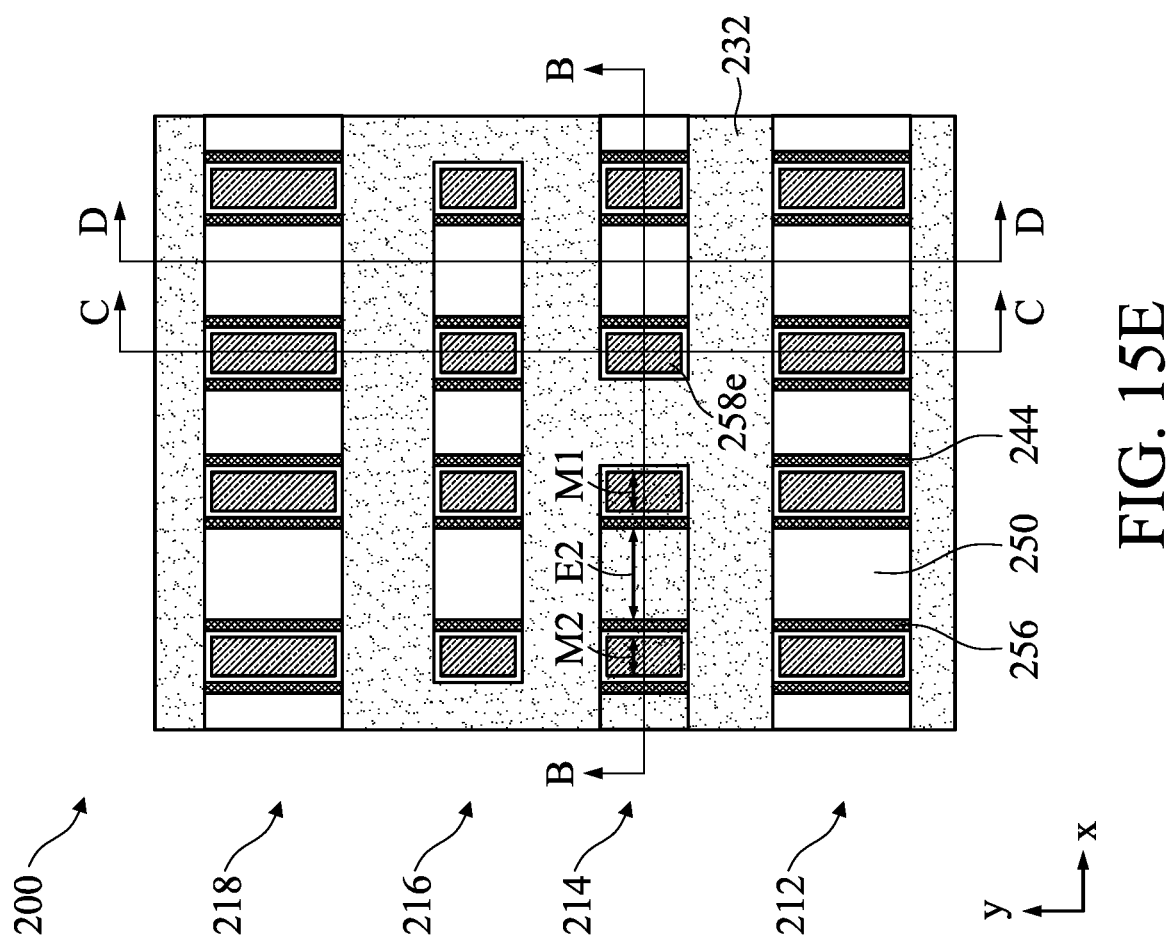

In operation 134, the sacrificial gate dielectric layer 236 and the sacrificial gate electrode layer 238 are removed and replacement gate structures are formed therein, as shown in FIGS. 15A-15G. FIG. 15A is a schematic top view of the semiconductor device 200. FIGS. 15B-G are schematic sectional view of the semiconductor device 200 along the lines B-B, C-C, D-D, E-E, F-F, and G-G on various views. FIG. 15H is a partial enlarged view of FIG. 15B.

The sacrificial gate electrode layer 238 can be removed using plasma dry etching and/or wet etching. When the sacrificial gate electrode layer 238 is polysilicon, a wet etchant such as a Tetramethylammonium hydroxide (TMAH) solution can be used to selectively remove the sacrificial gate electrode layer 238 without removing the dielectric materials in the ILD layer 254 and the CESL 252.

After removal of the sacrificial gate electrode layer 238, the sacrificial gate dielectric layer 236 is exposed. An etch process may be performed to selectively remove the sacrificial gate dielectric layer 236 exposing the high-k dielectric features 232, and the top layer of the second semiconductor layers 206. A suitable etch process is then performed to selective remove the cladding layers 224. The cladding layer 224 can be removed using plasma dry etching and/or wet etching. After removal of the cladding layers 224, the first semiconductor layers 204 are exposed and subsequently removed resulting in gate cavities having nanosheets of the second semiconductor layers 206. In some embodiments, the first semiconductor layers 204 can be removed during the same etch process for removal of the cladding layers 224. In other embodiments, the first semiconductor layers 204 can be selectively removed using a wet etchant such as, but not limited to, ammonium hydroxide ($NH_4OH$), tetramethylammonium hydroxide (TMAH), ethylenediamine pyrocatechol (EDP), or potassium hydroxide (KOH) solution.

A gate dielectric layers 256 and gate electrode layer 258 are formed in the gate cavities. The gate dielectric layer 256 and the gate electrode layer 258 may be referred to as a replacement gate structure. The gate dielectric layers 256 for n-type devices and p-type devices may have different composition and dimensions and are formed separately using patterned mask layers and different deposition recipes.

The gate dielectric layer 256 may include one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The gate dielectric layer 256 is formed on exposed surfaces of each nanosheet of the second semiconductor layer 206, exposed surfaces of the inner spacer 248, exposed surfaces of the sidewall spacer 244, and exposed surfaces of the epitaxial features 250. The gate dielectric layers 256 may be formed by CVD, ALD or any suitable method. In one embodiment, the gate layers 256 are formed using a highly conformal deposition process such as ALD in order to ensure the formation of the gate dielectric layers 256 having a uniform thickness around each of the semiconductor layers 206. In some embodiments, the thickness of the gate dielectric layers 256 is in a range between about 1 nm and about 6 nm. In some embodiments, an interfacial layer (not shown) is formed between the semiconductor layers 206 and the gate dielectric layers 256.

The gate electrode layer 258 is then formed on the gate dielectric layers 256 to fill the gate cavities. The gate electrode layer 258 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. In some embodiments, the gate electrode layer 258 may be formed by CVD, ALD, electro-plating, or other suitable method. After the formation of the gate electrode layer 258, a planarization process, such as a CMP process, is performed to remove excess deposition of the gate electrode material and expose the top surface of the ILD layer 254. Subsequently, conductive contact features may selective be formed in the ILD layer 254 to connect the source/drain regions 250. An interconnect structure may be then formed over on a second ILD layer to with conductive routes for signal lines and power lines.

Figure 15F:
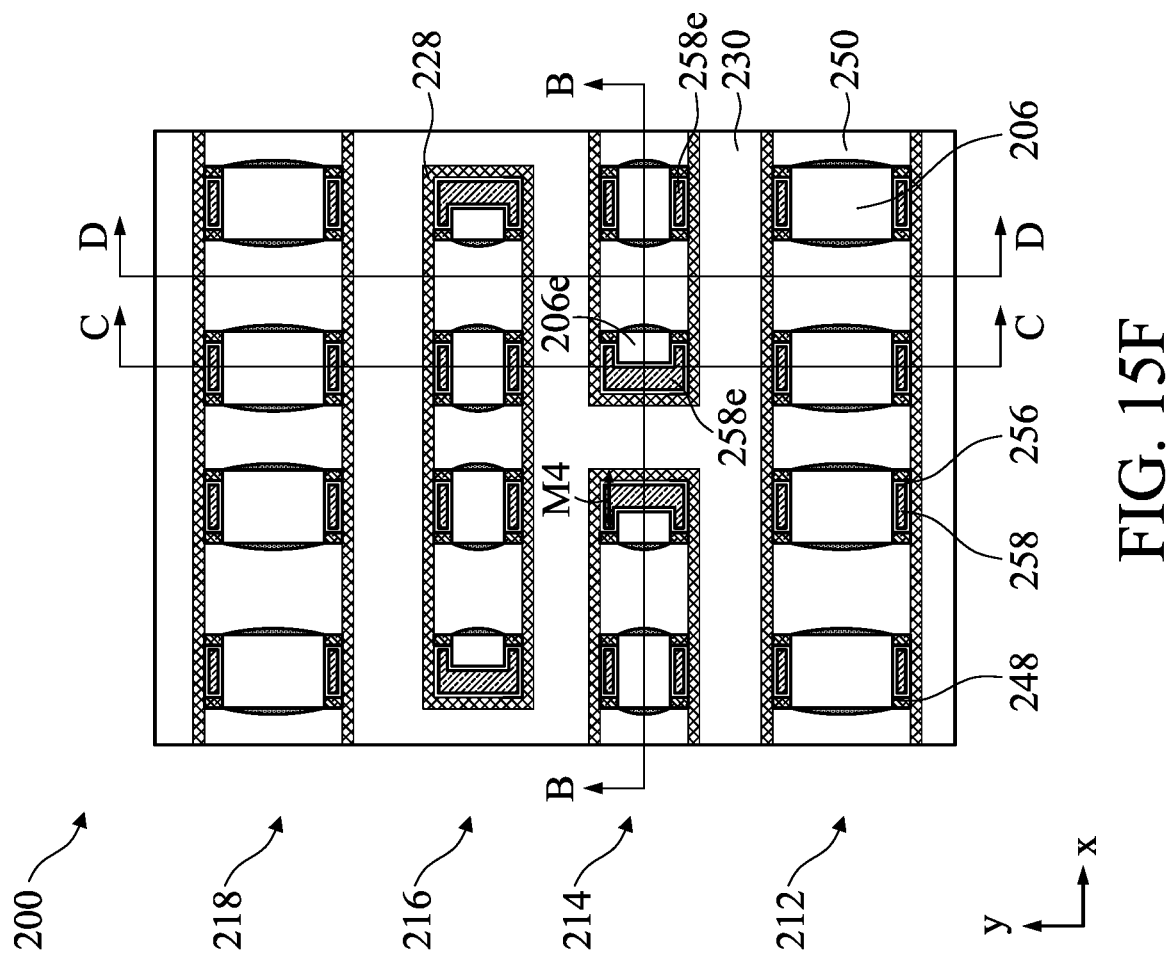
Figure 15G:
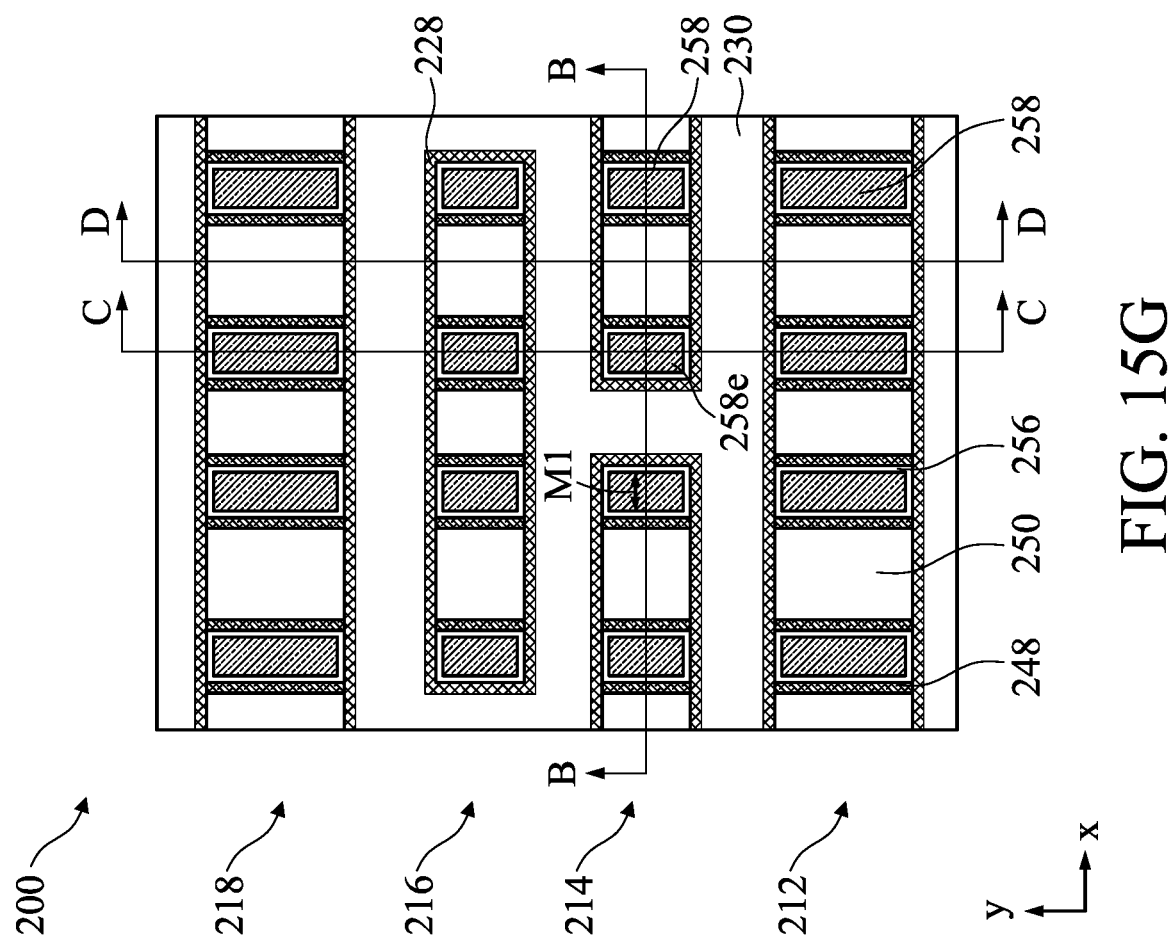
Figure 15H:
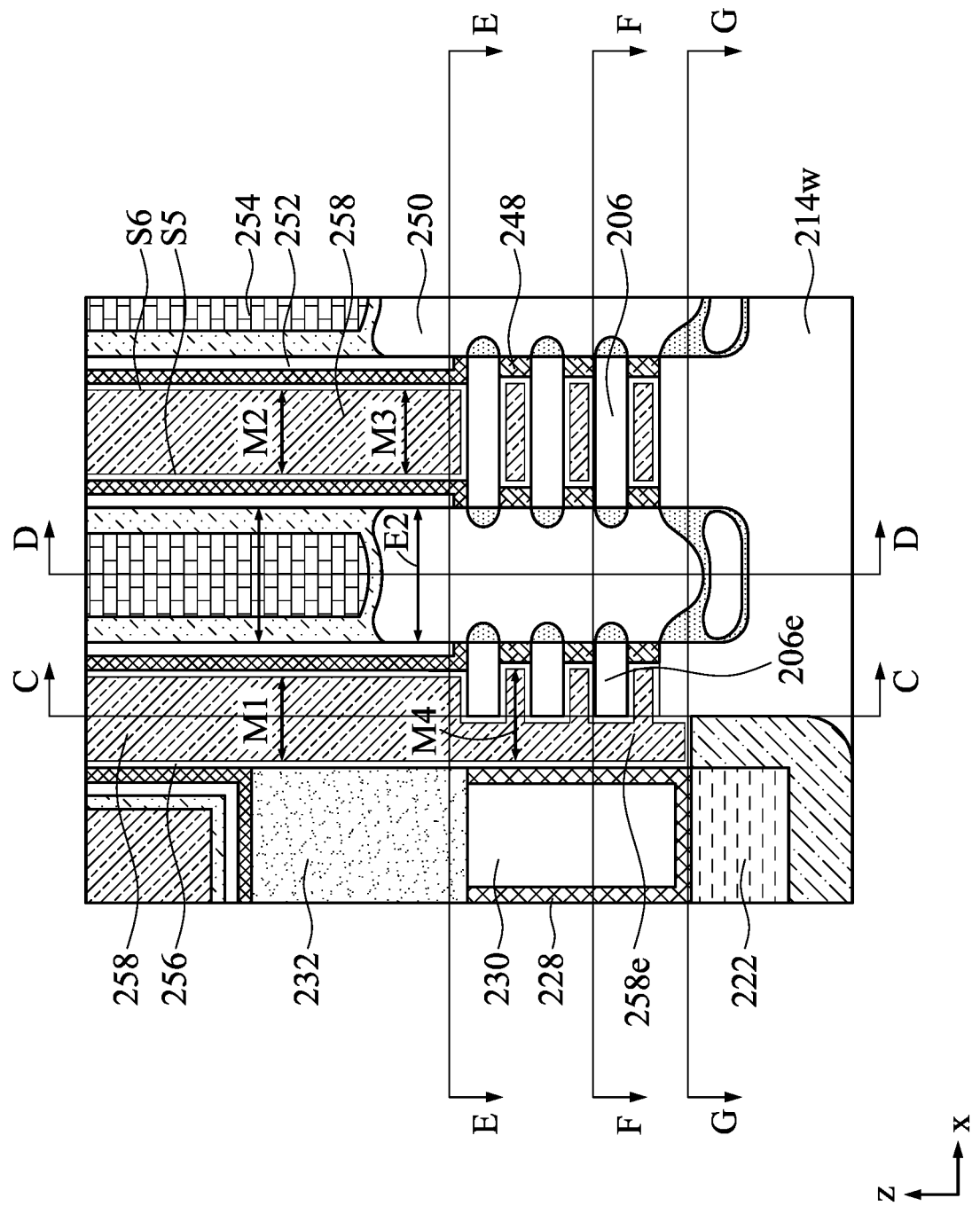

As shown in FIGS. 15B, 15C, 15F, and 15H, an end gate electrode layer 258e is formed adjacent to the perpendicular dielectric fin 226v and wraps around end portions 206e of the semiconductor layers 206. As shown in FIG. 15F, the end gate electrode layer 258e has a U-shape cross section along a plane of a channel layer, or a x-y plane, such as the semiconductor layer 206. The U-shape portion of the end gate electrode layer 258e wraps the end portion 206e from three sides. Structures similar to the end gate electrode layer 258e may be used in various devices, such as the butt connection in SRAM cell. The end gate electrode layer 258e is prune to have voids or undesireable seams therein because a high-k dielectric feature, such as the high-k dielectric feature 232, causes over etching of the sacrificial gate structure, which subsequently results in a cavity with a choked entrance for filling the end gate electrode layer 258e. By using the process described in operations 116, 118, 120, 122, embodiments of the present disclosure, the sacrificial gate electrode layer 238 is not over etched near the high-k dielectric feature 232. When the sacrificial gate electrode layer 238 is removed in operation 134, the gate cavity is not choked near the high-k dielectric features 232, and the end gate electrode layer 258e is formed without any voids or seams. As shown in FIG. 15H, the end gate electrode layer 258e has a width M1 and a normal gate electrode layer 258 has a width M2 at the level near the high-k dielectric feature 232. In some embodiments, the width M1 is substantially equal to the width M2. In some embodiments, the difference between width M1 and width M2 is less than about 5% of the width M2. In some embodiments, a ratio of the width M1 over the width M2 is in a range between 0.9 and 1.1. Additionally, the gate electrode layer 258 also has substantially vertical sidewalls S5, S6 along the y-z plane. As a result, a width M3 at the level of source/drain regions 250 is substantially equal to the width M2. In some embodiments, the difference between width M3 and width M2 is less than about 5% of the width M2. In some embodiments, a ratio of the width M3 over the width M2 is in a range between 0.9 and 1.0. n some embodiments, the widths M1, M2, M3 are in a range between 10 nm and 12 nm. As shown in FIG. 15F, the U-shape of the end gate electrode layer 258e also has a width M4. In some embodiments, the difference between width M4 and width M2 is less than about 5% of the width M2. In some embodiments, a ratio of the width M4 over the width M2 is in a range between 0.9 and 1.1.

The substantially vertical sidewalls S5, S6 of the gate electrode layer 258 also avoid narrowing of the epitaxial source/drain regions 250. As shown in Figure the opening of source/drain regions has a width E1 at the level near the high-k dielectric feature 232 and a width E2 at the level of the semiconductor layers 206 along the x-direction. In some embodiments, the width E1 is substantially equal to the width E2. In some embodiments, the difference between width E1 and width E2 is less than about 5% of the width E2. In some embodiments, a ratio of the width E1 over the width E2 is in a range between 1.0 and 1.1.

Even though a GAA device with multiple channels is described above, embodiments of the present disclosure may be used in single channel devices, such as FinFET device.

Various embodiments or examples described herein offer multiple advantages over the state-of-art technology. Embodiments of the present disclosure solve the problems of failed gate electrode layer at an end of channel region, thus increasing yield. The cyclic etching, passivation and pumping out process prevents over etching of the sacrificial gate electrode, particularly when near a high-k dielectric feature, thus, enlarging filling windows for replacement gate structures, thus improving channel control. Compared to state-of-art solutions, embodiments of the present disclosure also enlarge volume of source/drain region, thus improving device performance.

It will be understood that not all advantages have been necessarily discussed herein, no particular advantage is required for all embodiments or examples, and other embodiments or examples may offer different advantages.

Some embodiments of the present provide a method. The method comprises forming a semiconductor fin having a longitudinal axis along a first direction; wherein the semiconductor fin has a first end, forming a dielectric fin against the first end of the semiconductor fin, wherein the dielectric fin includes a high-k dielectric feature; depositing a sacrificial gate stack over the semiconductor fin and the dielectric fin; forming a gate pattern over the sacrificial gate stack, wherein the gate pattern includes a first mandrel and a second mandrel along a second direction substantially perpendicular to the first direction; etching the sacrificial gate stack using the gate pattern until a top surface of the high-k dielectric feature is exposed; performing a cyclic process to expose a top surface of the semiconductor fin, wherein the cyclic process comprises two or more cycles of: performing an etching process; and performing a passivation process; and forming sidewall spacers; etching the semiconductor fin to form source/drain recesses; forming source/drain regions in the source/drain recesses; and replacing the sacrificial gate stack with a gate dielectric layer and a gate electrode.

Some embodiments of the present disclosure provide a method. The method comprises depositing a semiconductor stack over a substrate, wherein the semiconductor stack comprises alternatively arranged first semiconductor layers and second semiconductor layers; etching the semiconductor stack and the substrate to form a first semiconductor fin and a second semiconductor fin, wherein the first and second semiconductor fins share a longitudinal axis along a first direction and are separated by a recess; forming a cladding layer on sidewalls of the first and second sections of the semiconductor fin; forming a dielectric fin in the recess between the first and second semiconductor fins, wherein the dielectric structure include a high-k dielectric feature; depositing a sacrificial gate stack over the first and second semiconductor fins and the dielectric fin; performing a cyclic process to etch the sacrificial gate stack and form a first sacrificial gate structure and a second sacrificial gate structure, wherein the first sacrificial gate structure overlaps an end portion of the first semiconductor fin and the dielectric fin, the second sacrificial fin structure and dielectric fin are disposed on opposite sides of the first sacrificial gate structure, and the cyclic process comprises two or more cycles of: an etching process; a passivation process; and a pumping out process; forming sidewall spacers on sidewalls of the first and second sacrificial gate structures; and replacing the first sacrificial gate structure and second sacrificial gate structure with a first gate structure and a second gate structure.

Some embodiments of the present disclosure provide a semiconductor device, comprising a first source/drain region; a second source/drain region; a dielectric fin comprising a high-k dielectric feature, wherein the dielectric fin, the first source/drain region and the second source/drain region are positioned along an axis along a first direction; a first semiconductor channel disposed between and in contact with the first and second source/drain regions; a semiconductor channel extending from the first source/drain region towards the dielectric fin; a first gate structure extending along a second direction substantially perpendicular to the first direction, wherein the first gate structure is disposed between the first and second source/drain regions and surrounds the first semiconductor channel; and a second gate structure extending along the second direction, wherein the second gate structure is disposed between the first source/drain region and the dielectric structure and surrounds the second semiconductor channel, wherein the second gate structure has a first width along the first direction at a level of a top surface the high-k dielectric feature, the first gate structure has a second width along the first direction at the level of the top surface of the high-k feature and a third width along the first direction at a level of the first source/drain region, a ratio of the first width over the second width is in a range between 0.9 and 1.1, and a ratio of the third width over the second width is in a range between 0.9 and 1.0.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device, comprising:
   forming a semiconductor fin having a longitudinal axis along a first direction, wherein the semiconductor fin has a first end;
   forming a dielectric fin against the first end of the semiconductor fin, wherein the dielectric fin includes a high-k dielectric feature;
   depositing a sacrificial gate stack over the semiconductor fin and the dielectric fin;
   forming a gate pattern over the sacrificial gate stack, wherein the gate pattern includes a first mandrel and a second mandrel along a second direction substantially perpendicular to the first direction;
   etching the sacrificial gate stack using the gate pattern until a top surface of the high-k dielectric feature is exposed;
   performing a cyclic process to expose a top surface of the semiconductor fin, wherein the cyclic process comprises two or more cycles of:
      performing an etching process; and
      performing a passivation process; and
   forming sidewall spacers;
   etching the semiconductor fin to form source/drain recesses;
   forming source/drain regions in the source/drain recesses; and
   replacing the sacrificial gate stack with a gate dielectric layer and a gate electrode.

2. The method of claim 1, wherein performing an etching process comprises flowing an etching gas and applying a plasma power for a first time period.

3. The method of claim 2, wherein performing a passivation process comprises:
   flowing a passivation gas and applying a plasma power for a second time period;
   turning off the plasma power for a third time period.

4. The method of claim 3, further comprising turning of the passivation gas during the third time period.

5. The method of claim 3, wherein the third time period is in a range between about 5% and about 20% of a summation of the second time period and the third time period.

6. The method of claim 2, wherein etching the sacrificial gate stack using the gate pattern until a top surface of the high-k dielectric feature is performed at a first etching rate, performing the etching process in the cyclic process is at a second etching rate, and the second etching rate is in a range between 40% and 60% of the first etching rate.

7. The method of claim 1, wherein forming the semiconductor fin comprising:
   forming a semiconductor stack comprising alternatively stacked semiconductor layers;
   etching the semiconductor stack to the semiconductor fin; and
   forming a cladding layer around the semiconductor fin.

8. A method, comprising:
- depositing a semiconductor stack over a substrate, wherein the semiconductor stack comprises alternatively arranged first semiconductor layers and second semiconductor layers;
- etching the semiconductor stack and the substrate to form a first semiconductor fin and a second semiconductor fin, wherein the first and second semiconductor fins share a longitudinal axis along a first direction and are separated by a recess;
- forming a cladding layer on sidewalls of the first and second sections of the semiconductor fin;
- forming a dielectric fin in the recess between the first and second semiconductor fins, wherein the dielectric structure include a high-k dielectric feature;
- depositing a sacrificial gate stack over the first and second semiconductor fins and the dielectric fin;
- performing a cyclic process to etch the sacrificial gate stack and form a first sacrificial gate structure and a second sacrificial gate structure, wherein the first sacrificial gate structure overlaps an end portion of the first semiconductor fin and the dielectric fin, the second sacrificial gate structure and dielectric fin are disposed on opposite sides of the first sacrificial gate structure, and the cyclic process comprises two or more cycles of:
  - an etching process;
  - a passivation process; and
  - a pumping out process;
- forming sidewall spacers on sidewalls of the first and second sacrificial gate structures; and
- replacing the first sacrificial gate structure and second sacrificial gate structure with a first gate structure and a second gate structure.

9. The method of claim 8, wherein the etching process is performed for between 40% and 60% of a cycle time, the passivation process is performed in a range between 2% and 10% of the cycle time.

10. The method of claim 9, wherein the cycle time is in a range between about 30 seconds and about 60 second.

11. The method of claim 8, wherein a plasma power is applied during the etching process and the passivation process, and the plasma power is turned off during pumping out process.

12. The method of claim 8, further comprising, prior to performing the cyclic process, bulk etching the sacrificial gate stack to expose a top surface of the high-k dielectric feature.

13. The method of claim 12, wherein bulk etching and cyclic processing are performed using the same processing tool.

14. The method of claim 8, wherein the first sacrificial gate structure has a first width along the first direction, the second sacrificial gate structure has a second width along the second direction, and a difference between the first width and second width is less than 5% of the second width.

15. The method of claim 14, wherein the first gate structure is positioned against the dielectric fin and surrounds the first semiconductor layers at the end portion of the first semiconductor fin.

16. A method, comprising:
- forming a semiconductor fin, wherein the semiconductor fin includes a first section and a second section a longitudinal axis along a first direction and separated by a recess;
- forming a cladding layer on sidewalls of the first and second sections of the semiconductor fin;
- forming a dielectric structure in the recess between the first and second semiconductor fins, wherein the dielectric structure include a high-k dielectric feature;
- depositing a sacrificial gate stack over the first and second sections of the semiconductor fin and the dielectric fin;
- forming a first sacrificial gate structure and a second sacrificial gate structure by etching the sacrificial gate stack, wherein the first sacrificial gate structure overlaps an end portion of the first section of the semiconductor fin and the dielectric fin, the second sacrificial gate structure and dielectric fin are disposed on opposite sides of the first sacrificial gate structure, and etching the sacrificial gate stack comprises two or more cycles of:
  - an etching process;
  - a passivation process; and
  - a pumping out process;
- forming sidewall spacers on sidewalls of the first and second sacrificial gate structures; and
- replacing the first sacrificial gate structure and second sacrificial gate structure with a first gate structure and a second gate structure, wherein the second gate structure has a first width along the first direction at a level of a top surface the high-k dielectric feature, the first gate structure has a second width along the first direction at the level of the top surface of the high-k feature and a third width along the first direction at a level of the first source/drain region, a ratio of the first width over the second width is in a range between 0.9 and 1.1, and a ratio of the third width over the second width is in a range between 0.9 and 1.0.

17. The method of claim 16, wherein the first width is in a range between 10 nm and 12 nm.

18. The method of claim 16, wherein the first channel and the second channel each comprises two or more stacked vertically stacked semiconductor layers.

19. The method of claim 18, wherein the first gate structure has a U-shape cross section along a plane defined by the first direction and second direction and wraps an end portion of the first channel from three sides.

20. The method of claim 19, wherein the first gate structure has a fourth width, and a ratio of the fourth width over the second width is in a range between 0.9 and 1.1.

* * * * *